(12) United States Patent
Zhang et al.

(10) Patent No.: US 10,761,419 B2
(45) Date of Patent: Sep. 1, 2020

(54) SYSTEMS AND METHODS FOR PERFORMING OPTICAL IMAGING USING A TRI-SPOT POINT SPREAD FUNCTION (PSF)

(71) Applicants: Oumeng Zhang, St. Louis, MO (US); Matthew D. Lew, St. Louis, MO (US)

(72) Inventors: Oumeng Zhang, St. Louis, MO (US); Matthew D. Lew, St. Louis, MO (US)

(73) Assignee: Washington University, St. Louis, MO (US)

( * ) Notice: Subject to any disclaimer, the term of this patent is extended or adjusted under 35 U.S.C. 154(b) by 149 days.

(21) Appl. No.: 15/955,559

(22) Filed: Apr. 17, 2018

(65) Prior Publication Data

US 2018/0307132 A1 Oct. 25, 2018

Related U.S. Application Data

(60) Provisional application No. 62/585,802, filed on Nov. 14, 2017, provisional application No. 62/486,116, filed on Apr. 17, 2017.

(51) Int. Cl.
*G03F 1/26* (2012.01)
*G03F 1/44* (2012.01)
(Continued)

(52) U.S. Cl.
CPC ........... *G03F 1/26* (2013.01); *G01N 21/6428* (2013.01); *G01N 21/6458* (2013.01);
(Continued)

(58) Field of Classification Search
CPC ...... G03F 1/26; G03F 9/7026; G03F 7/70191; G03F 1/44; G02B 21/0032; G02B 21/361;
(Continued)

(56) References Cited

U.S. PATENT DOCUMENTS 6,361,170 B1 * 3/2002 Bille .................... A61B 3/1015
351/221
7,648,802 B2 1/2010 Neureuther et al.
(Continued)

OTHER PUBLICATIONS

Backer et al., "A Bisected Pupil for Studying Single-Molecule Orientational Dynamics and Its Application to Three-Dimensional Super-Resolution Microscopy," Applied Physics Letters, 104: 193701-1 to-5 (2014).
(Continued)

*Primary Examiner* — David P Porta
*Assistant Examiner* — Gisselle M Gutierrez
(74) *Attorney, Agent, or Firm* — Armstrong Teasdale LLP

(57) ABSTRACT

Systems and methods for use in tri-spot point spread function imaging are provided that include a phase mask. The phase mask includes three partitions that each include a subset of the total area that is asymmetrical to other partitions. Each partition includes a phase delay ramp aligned along a phase delay axis, and includes a gradient of phase delays. Each phase delay axis is oriented in a different direction with respect to each other. Included is a source that outputs an excitation beam into a sample containing at least one light emitter that emits a radiation pattern when illuminated. Included is at least one sensor arranged to capture at least one image of the radiation pattern and a phase mask positioned between the at least one emitter and the at least one sensor. The phase mask is configured to produce a tri-spot point spread function.

15 Claims, 47 Drawing Sheets
(41 of 47 Drawing Sheet(s) Filed in Color)

(51) Int. Cl.
*G03F 7/20* (2006.01)
*G03F 9/00* (2006.01)
*G01N 21/64* (2006.01)
*G02B 21/00* (2006.01)
*G02B 21/36* (2006.01)

(52) U.S. Cl.
CPC ..... *G02B 21/0032* (2013.01); *G02B 21/0064* (2013.01); *G02B 21/0076* (2013.01); *G02B 21/361* (2013.01); *G03F 1/44* (2013.01); *G03F 7/70191* (2013.01); *G03F 9/7026* (2013.01)

(58) Field of Classification Search
CPC ............. G02B 21/0064; G02B 21/0076; G02B 21/16; G01N 21/6428; G01N 21/6458
USPC ..................................................... 250/461.2
See application file for complete search history.

(56) References Cited

U.S. PATENT DOCUMENTS

| | | | |
|---|---|---|---|
| 7,926,940 B2 | 4/2011 | Blum et al. | |
| 8,571,300 B2 | 10/2013 | Arnison et al. | |
| 8,605,285 B2 | 12/2013 | Mercer | |
| 8,693,742 B2 | 4/2014 | Piestun et al. | |
| 9,075,227 B2 | 7/2015 | Rachet et al. | |
| 9,360,426 B2 | 7/2016 | Acosta et al. | |
| 9,395,293 B1 | 7/2016 | Acosta et al. | |
| 9,581,797 B2 | 2/2017 | Acosta et al. | |
| 2004/0245439 A1 | 12/2004 | Shaver | |
| 2009/0073563 A1* | 3/2009 | Betzig | G01N 21/6445 359/578 |
| 2009/0135432 A1* | 5/2009 | Betzig | G01N 21/6445 356/521 |
| 2014/0192166 A1 | 7/2014 | Cogswell et al. | |
| 2015/0192510 A1* | 7/2015 | Piestun | G01B 11/002 702/151 |
| 2015/0277092 A1* | 10/2015 | Backer | G02B 21/16 250/237 R |
| 2016/0063718 A1 | 3/2016 | Foelling | |
| 2016/0301915 A1 | 10/2016 | Shechtman et al. | |
| 2017/0038574 A1* | 2/2017 | Zhuang | G02B 21/0068 |
| 2019/0318459 A1* | 10/2019 | Chen | G02B 21/008 |

OTHER PUBLICATIONS

Backer et al., "Single-Molecule Orientation Measurements with a Quadrated Pupil," Optics Letters, 38(9): 1521-1523 (2013).

* cited by examiner

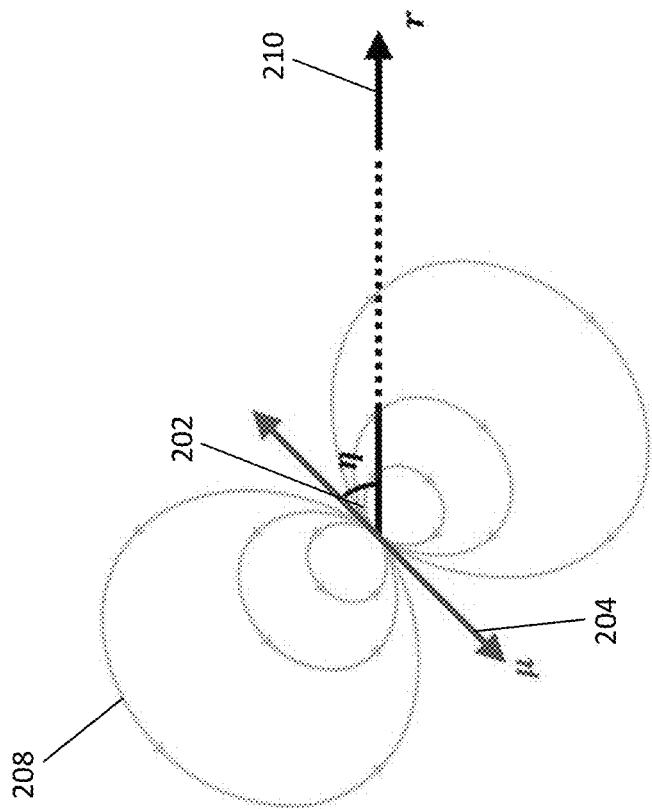
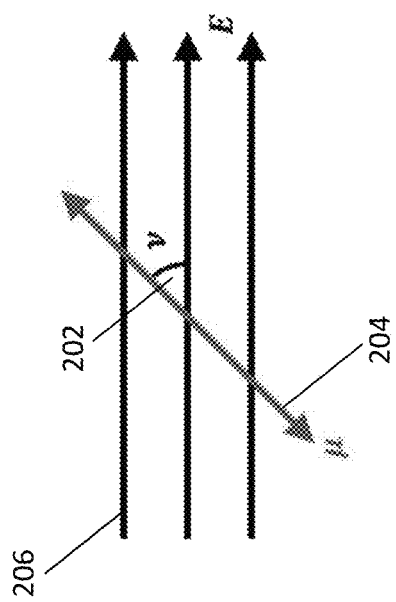
FIG. 2B
FIG. 2A

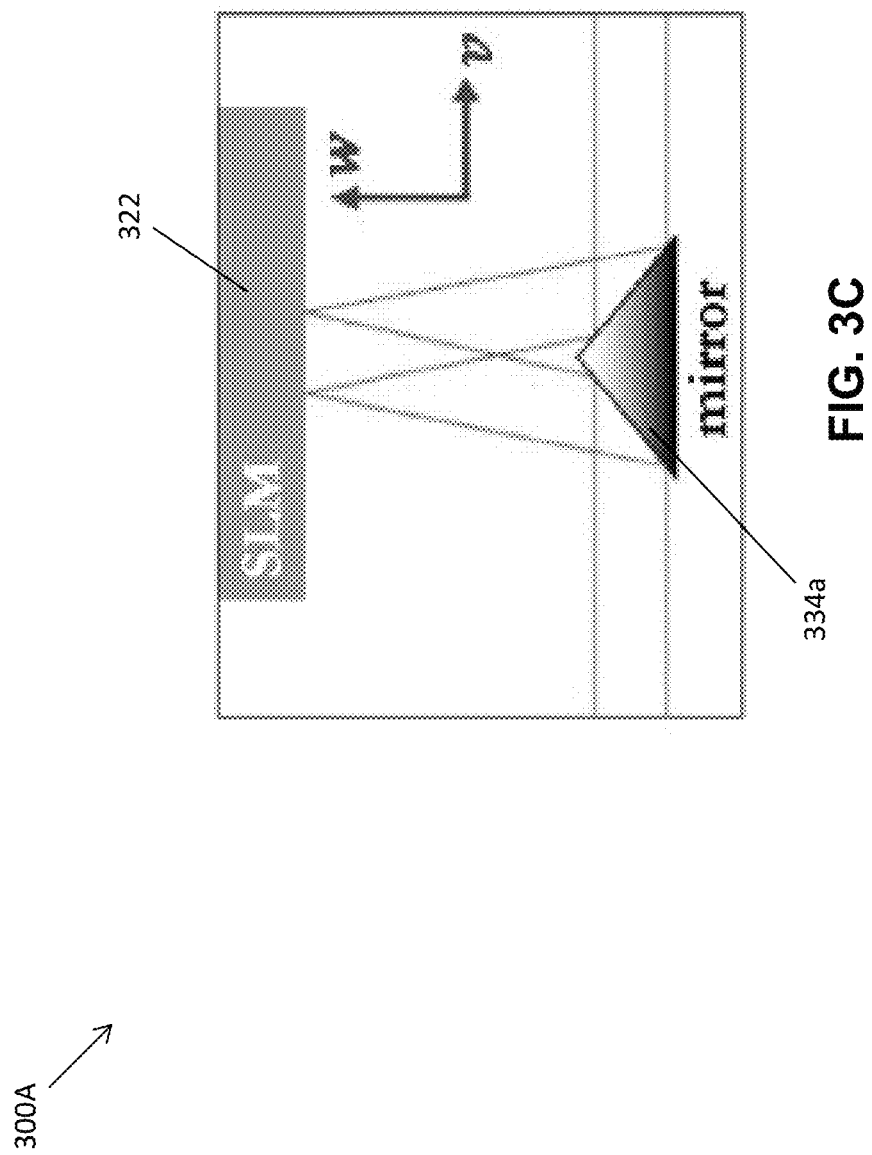

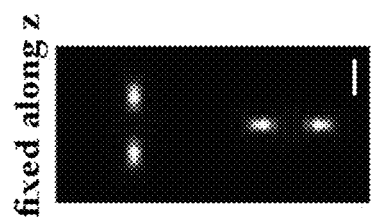
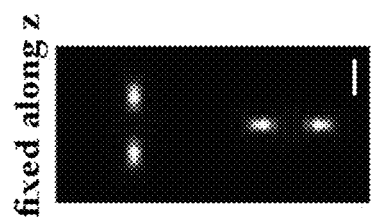
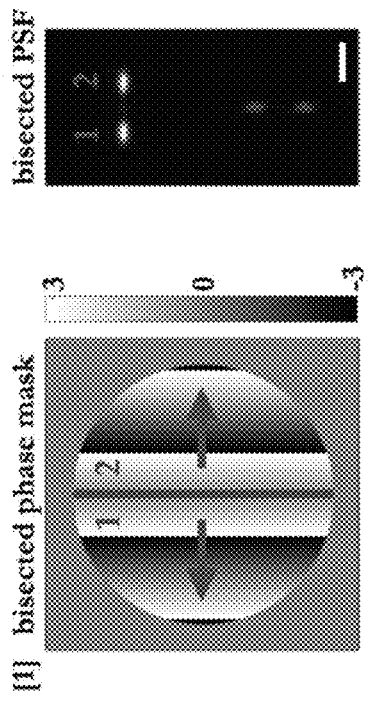
FIG. 5D  FIG. 5C  FIG. 5B  FIG. 5A
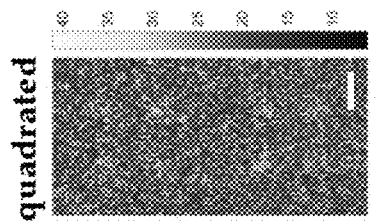
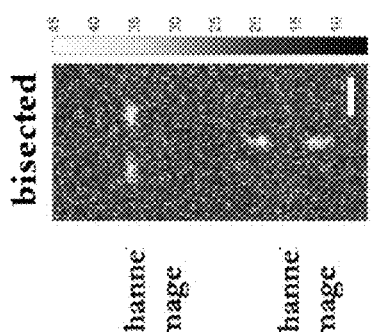
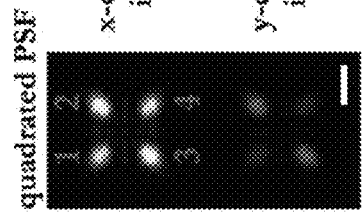
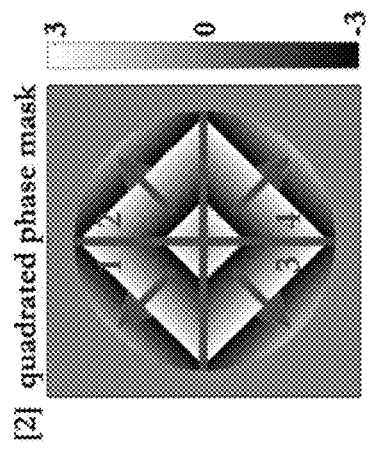
FIG. 5H  FIG. 5G  FIG. 5F  FIG. 5E

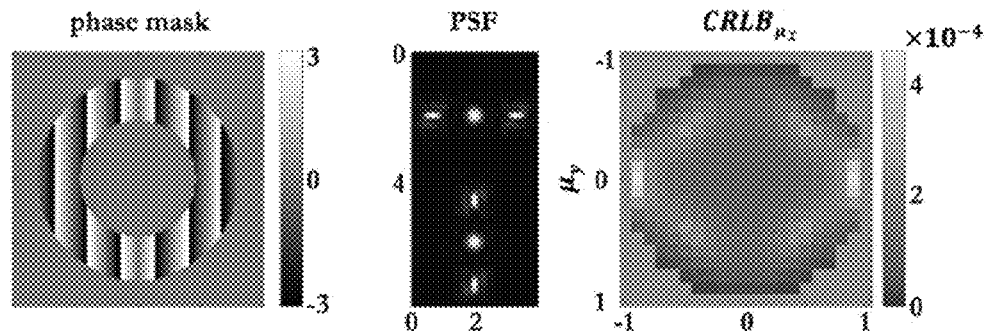
FIG. 6A FIG. 6B FIG. 6C
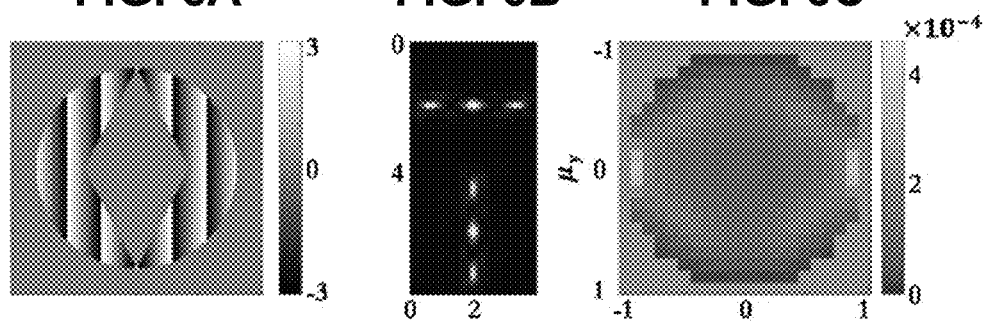
FIG. 6D FIG. 6E FIG. 6F
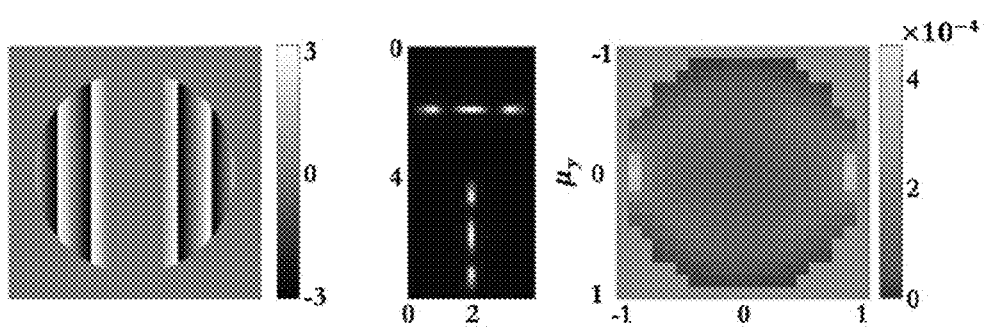
FIG. 6G FIG. 6H FIG. 6I
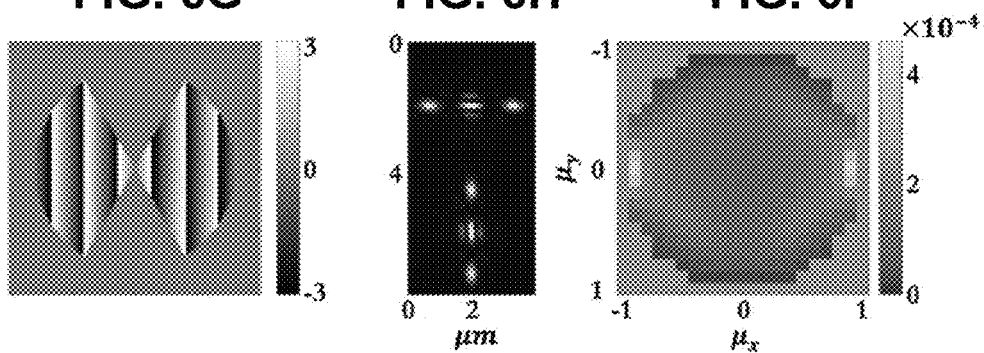
FIG. 6J FIG. 6K FIG. 6L

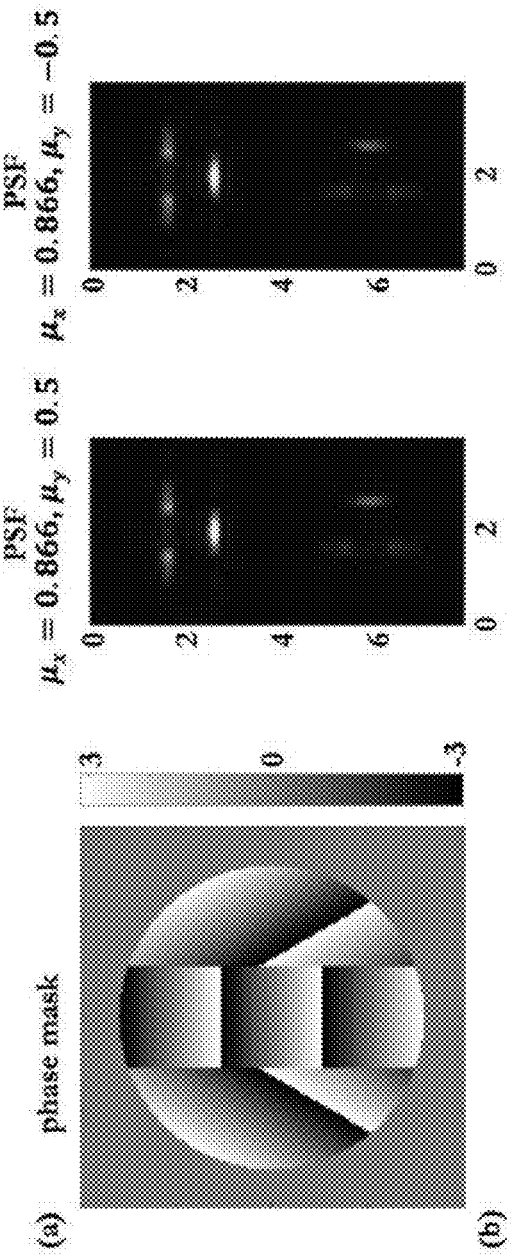
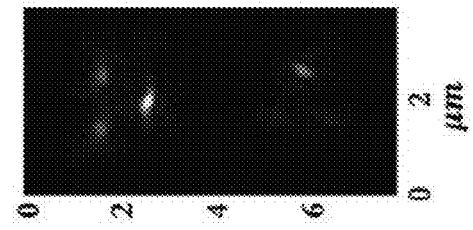
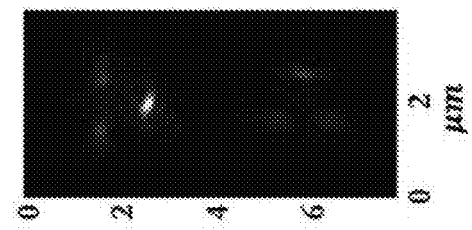
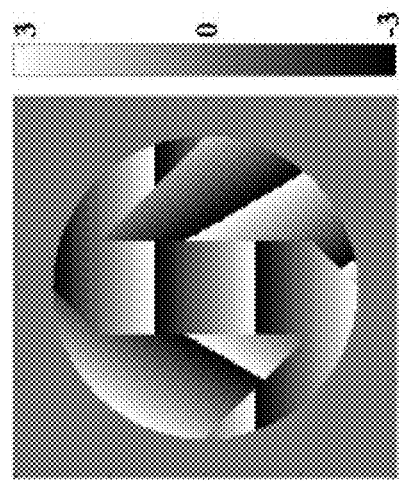
FIG. 8A  FIG. 8B  FIG. 8C  FIG. 8D  FIG. 8E  FIG. 8F

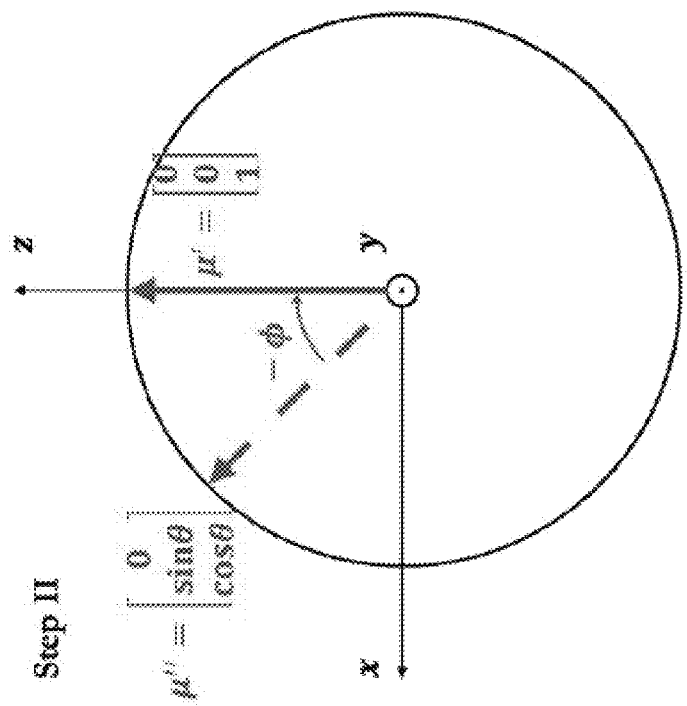
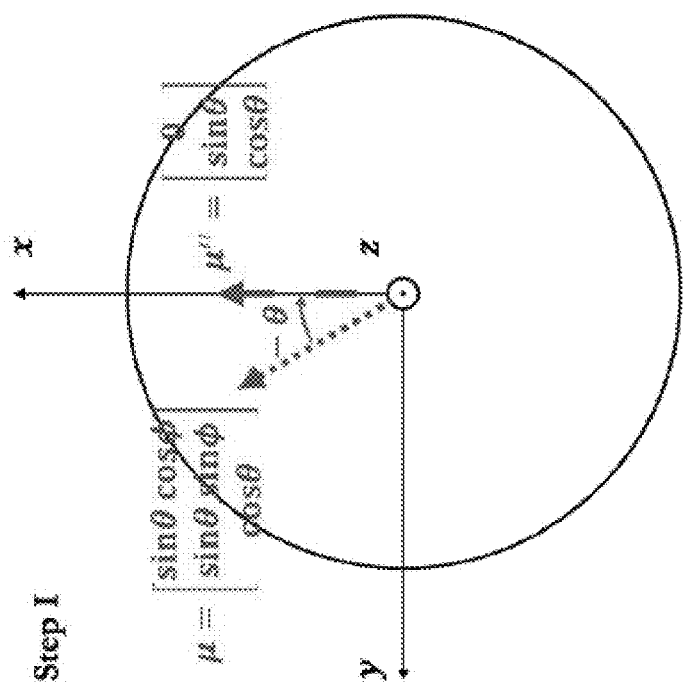
FIG. 12A
FIG. 12B

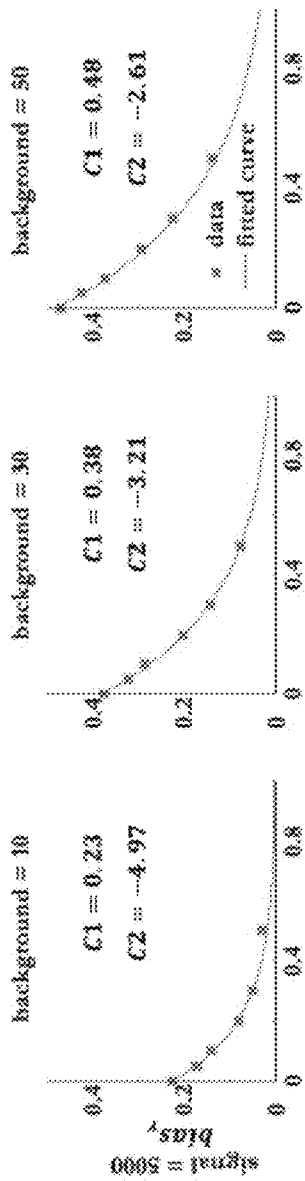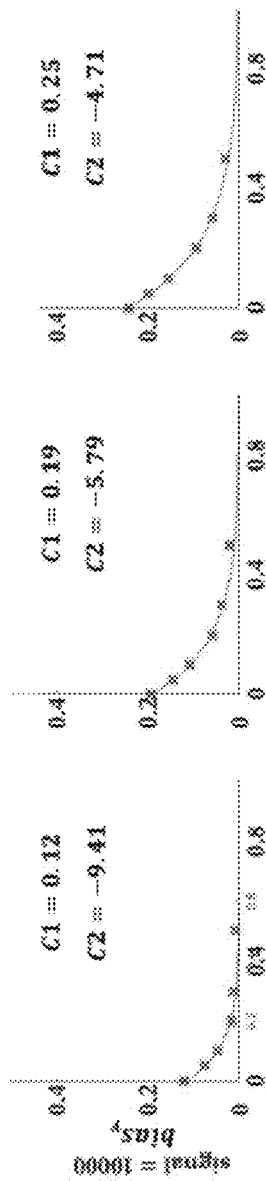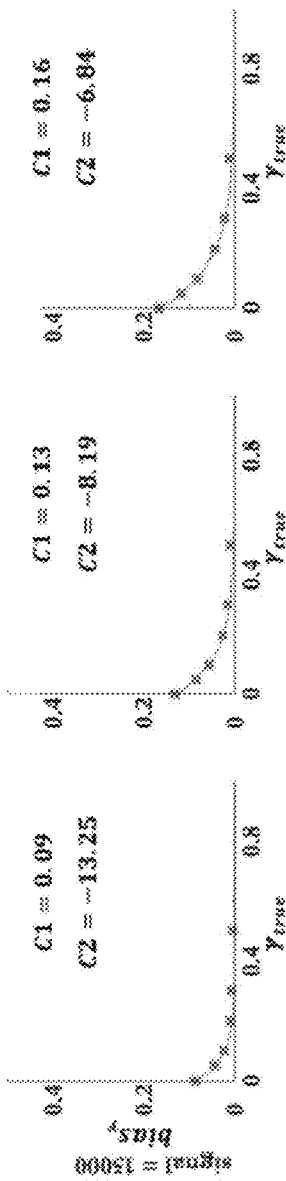
FIG. 17A FIG. 17B FIG. 17C FIG. 17D FIG. 17E FIG. 17F FIG. 17G FIG. 17H FIG. 17I

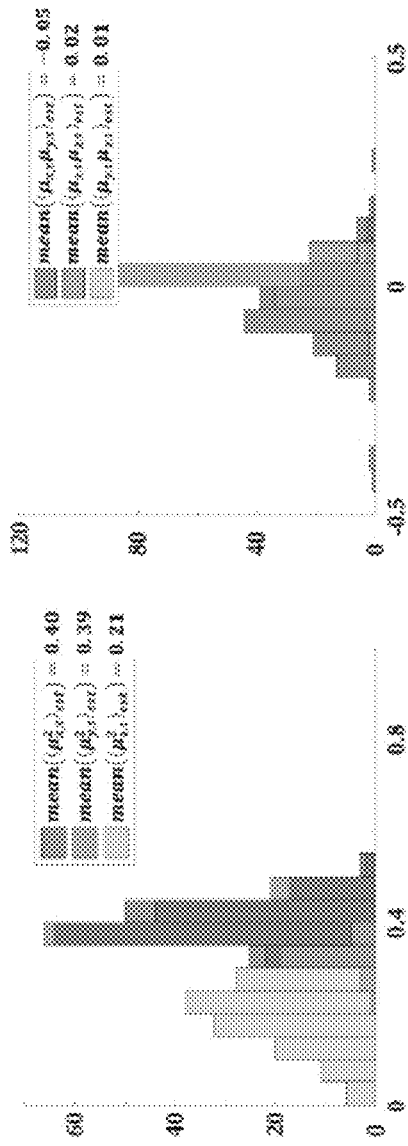
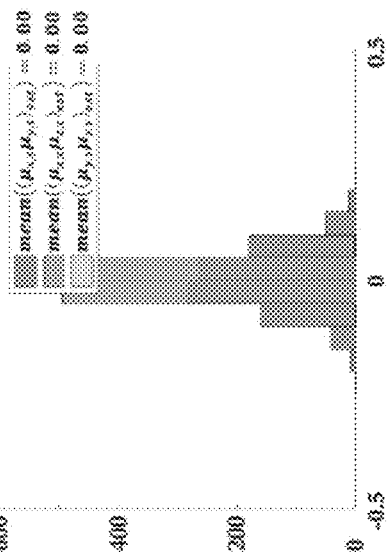
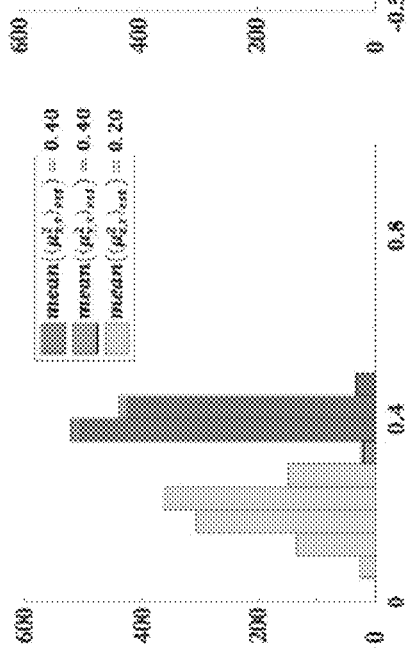
FIG. 23A  FIG. 23B  FIG. 23C  FIG. 23D

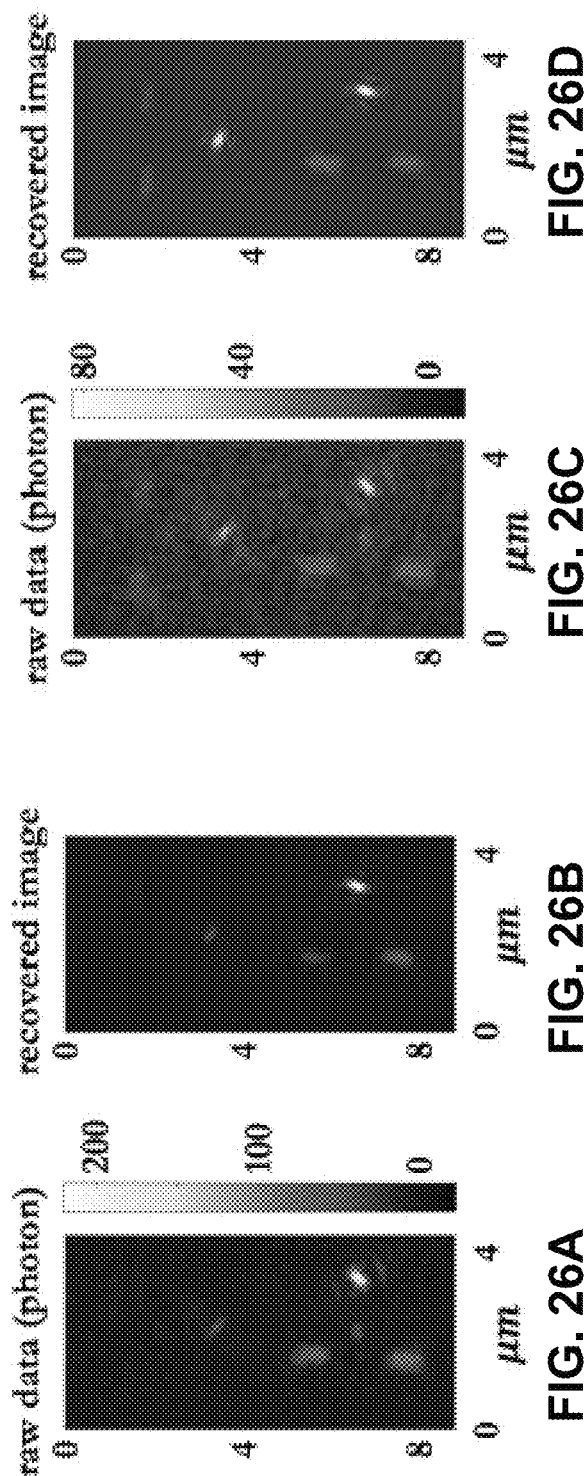

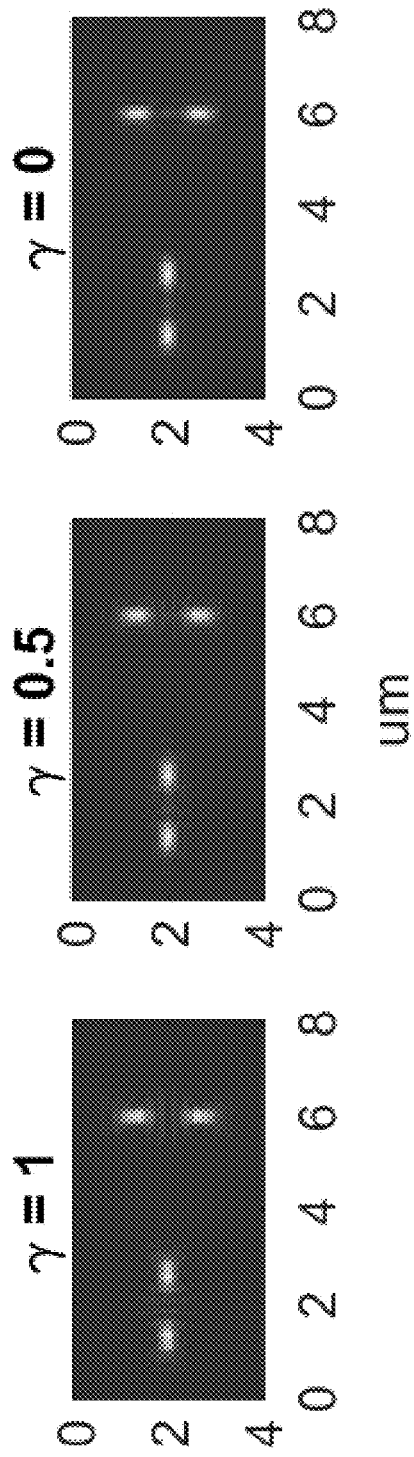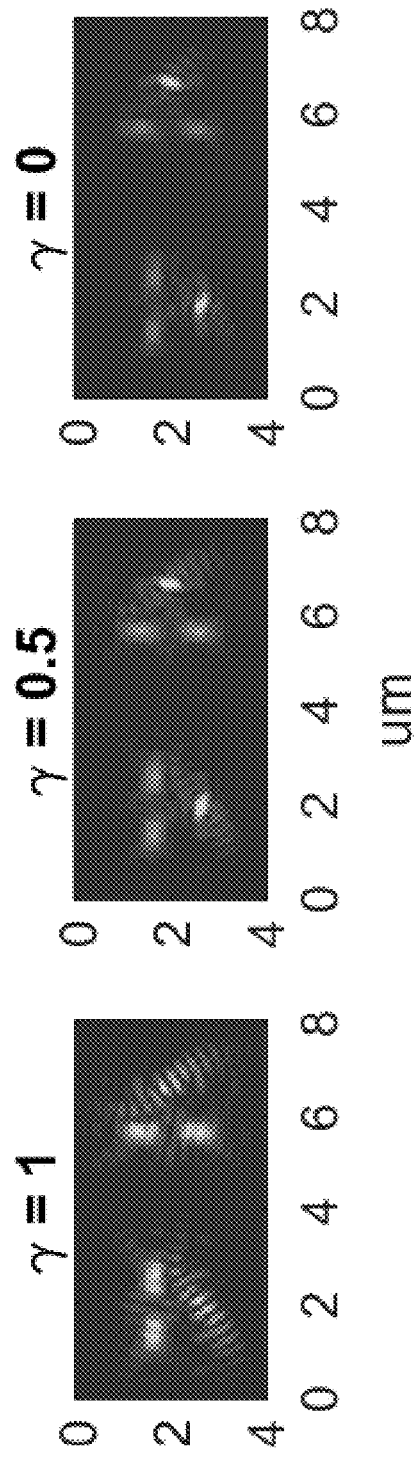
FIG. 30A  FIG. 30B  FIG. 30C  FIG. 30D  FIG. 30E  FIG. 30F

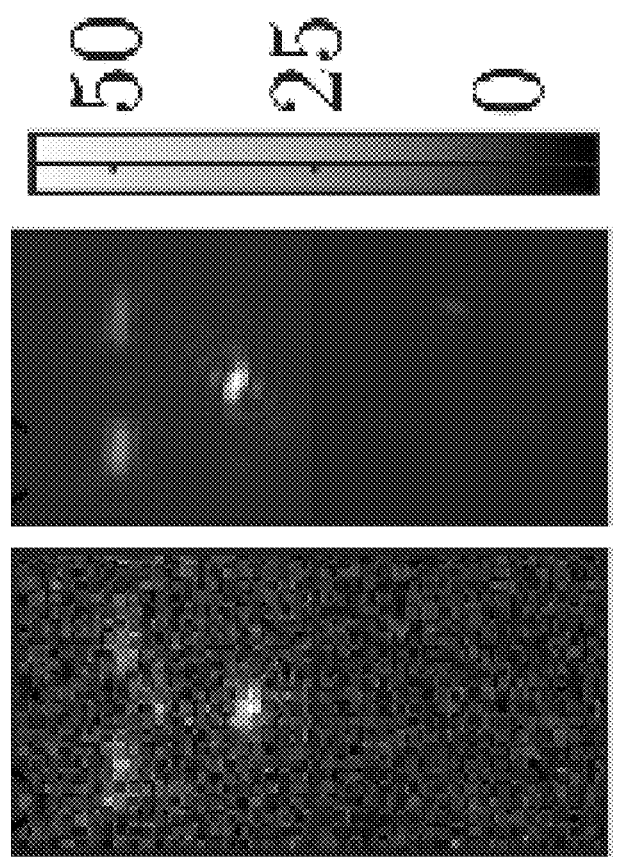

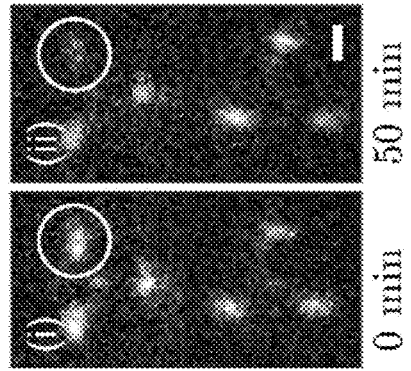
FIG. 42B
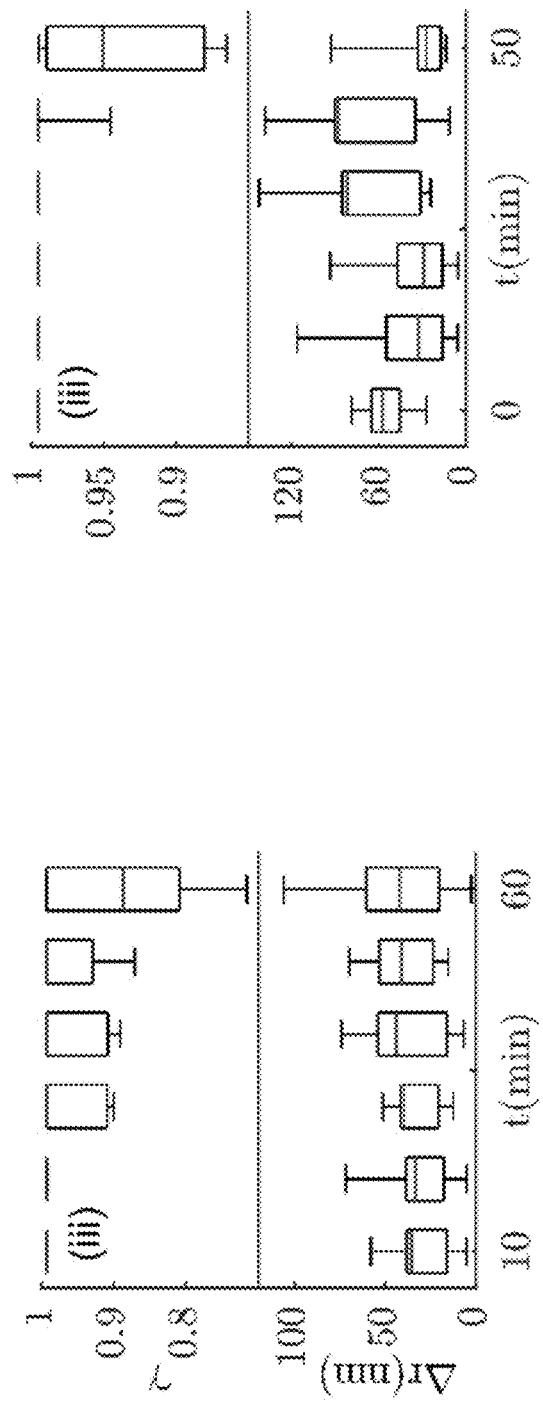
FIG. 43B
FIG. 43A
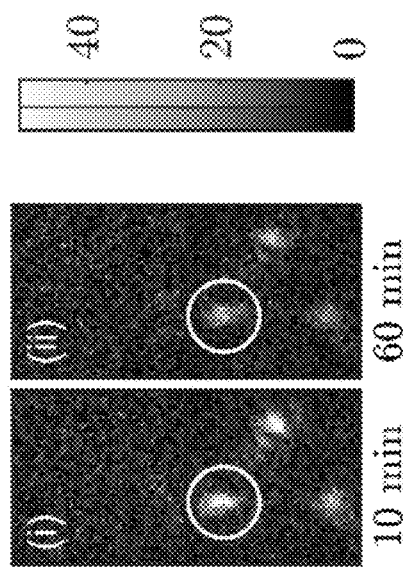
FIG. 42A

SYSTEMS AND METHODS FOR PERFORMING OPTICAL IMAGING USING A TRI-SPOT POINT SPREAD FUNCTION (PSF)

CROSS-REFERENCE TO RELATED APPLICATIONS

This application claims benefit of both U.S. Provisional Application No. 62/486,116 filed on Apr. 17, 2017 and U.S. Provisional Application No. 62/585,802 filed on Nov. 14, 2017, the contents of which are both incorporated herein by reference in their entirety.

STATEMENT REGARDING FEDERALLY SPONSORED RESEARCH & DEVELOPMENT

This invention was made with government support under grant ECCS1653777, awarded by the National Science Foundation, and by grant R35GM124858, awarded by the National Institutes of Health. The government has certain rights in this invention.

FIELD OF THE DISCLOSURE

The present disclosure generally relates to systems and methods for performing optical imaging beyond the diffraction limit.

BACKGROUND

Single-molecule imaging has become a powerful tool for gaining insight into the biochemical activities in living cells, such as DNA bending and tangling within cell nuclei, or transbilayer lipid motion within cell membranes. In some existing methods, optical imaging with resolution beyond the diffraction limit is achieved by localizing single-molecule light emitters, such as fluorescent molecules that may produce a dipole-like radiation pattern and are typically attached to biological structures or other objects of interest.

The fluorescence photons emitted by single molecules contain rich information regarding their rotational motions, but adapting existing methods, such as single-molecule localization microscopy (SMLM), to measure the orientations and rotational mobilities of single-molecule emitters with high precision remains a challenge. Some existing methods have attempted to measure the orientation of these single-molecule emitters to improve the localization accuracy by estimating the localization bias due to orientation effects. Other existing single-molecule imaging methods measure molecular orientation and rotational mobility of single-molecule emitters by modeling the emission patterns of single-molecule emitters or by tuning the excitation polarization. However, these existing methods may require complicated optical instruments and typically lack sufficient sensitivity to measure both 3D molecular orientation and rotational mobility of single molecules simultaneously.

BRIEF DESCRIPTION

In one aspect, a phase mask for a tri-spot point spread function imaging system includes a first, second, and third partition. Each partition includes a phase delay ramp aligned along a phase delay axis. Each phase delay ramp includes a gradient of phase delays. Each partition includes a subset of a total area of the phase mask that includes a shape that is asymmetrical with respect to each remaining partition. Each phase delay axis associated with each partition is oriented in a different direction with respect to each remaining phase delay axis of each remaining partition.

In another aspect, a tri-spot point spread function imaging system includes a source arranged and configured to output an excitation beam that is directed to a sample containing at least one light emitter that emits a dipole or dipole-like radiation pattern when illuminated by the excitation beam. The tri-spot point spread function imaging system also includes at least one sensor arranged and configured to capture at least one image of at least a portion of a radiation pattern emitted by the at least one emitter in response to impingement by the excitation beam; and a phase mask positioned between the at least one emitter and the at least one sensor, the phase mask configured to produce a tri-spot point spread function in response to photons received from the at least one emitter. The tri-spot point spread function is received by the at least one sensor.

In another additional aspect, a method for estimating an orientation and a rotational mobility of a single-molecule emitter includes receiving a plurality of photons emitted by the dipole-like emitter to produce a back focal plane intensity distribution; modifying the back focal plane intensity distribution using a phase mask to produce an image plane intensity distribution; and estimating the orientation and rotational mobility of the dipole-like emitter based on a relative brightness of the three light spots of the tri-spot point spread function. The image plane intensity distribution includes a tri-spot point spread function, and the tri-spot point spread function includes three light spots arranged in a triangular pattern.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2A is a schematic illustration showing an orientation of a dipole moment of a single-molecule emitter within an excitation electric field;

FIG. 2B is a schematic illustration showing a spatial distribution of an electrical field associated with the dipole moment of the single-molecule emitter shown in FIG. 2A;

FIG. 3C is a schematic illustration showing an arrangement of a mirror and SLM used in the polarization sensitive 4f system shown in FIG. 3B;

FIG. 5A is an image showing a phase distribution of a bisected phase mask;

FIG. 5B is an image of a bisected PSF obtained using the bisected phase mask illustrated in FIG. 5A;

FIG. 5C is an image of a bisected PSF obtained from an isotropic single-molecule emitter using the bisected phase mask illustrated in FIG. 5A;

FIG. 5D is an image of a bisected PSF obtained from a single-molecule emitter fixed along the x-axis using the bisected phase mask illustrated in FIG. 5A;

FIG. 5E is an image showing a phase distribution of a quadrated phase mask; is an image of a bisected PSF obtained using the bisected phase mask illustrated in FIG. 5A;

FIG. 5F is an image showing a phase distribution of a quadrated phase mask;

FIG. 5G is an image showing an image plane basis obtained after adding the bisected phase mask illustrated in FIG. 5A;

FIG. 5H is an image showing an image plane basis obtained after adding the quadrated phase mask illustrated in FIG. 5E;

FIG. 6A is an image showing a phase distribution of a trisected phase mask with a donut vertical-stripe pattern;

FIG. 6B is an image of a trisected PSF obtained using the trisected phase mask illustrated in FIG. 6A;

FIG. 6C is an image showing a map of $CRLB_{\mu_x}$ corresponding to the trisected phase mask illustrated in FIG. 6A;

FIG. 6D is an image showing a phase distribution of a trisected phase mask with a second vertical-stripe pattern;

FIG. 6E is an image of a trisected PSF obtained using the trisected phase mask illustrated in FIG. 6D;

FIG. 6F is an image showing a map of $CRLB_{\mu_x}$ corresponding to the trisected phase mask illustrated in FIG. 6D;

FIG. 6G is an image showing a phase distribution of a trisected phase mask with a third vertical-stripe pattern;

FIG. 6H is an image of a trisected PSF obtained using the trisected phase mask illustrated in FIG. 6G;

FIG. 6I is an image showing a map of $CRLB_{\mu_x}$ corresponding to the trisected phase mask illustrated in FIG. 6G;

FIG. 6J is an image showing a phase distribution of a trisected phase mask with a fourth vertical-stripe pattern;

FIG. 6K is an image of a trisected PSF obtained using the trisected phase mask illustrated in FIG. 6J;

FIG. 6L is an image showing a map of $CRLB_{\mu_x}$ corresponding to the trisected phase mask illustrated in FIG. 6J;

FIG. 8A is an image showing a phase distribution of a trisected phase mask with phase ramps aligned in three different directions;

FIG. 8B is an image showing a tri-spot PSF from a dipole emitter obtained using the phase mask illustrated in FIG. 8A in which $\mu_x=0.866$ and $\mu_y=0.5$;

FIG. 8C is an image showing a tri-spot PSF from a dipole emitter obtained using the phase mask illustrated in FIG. 8A in which $\mu_x=0.866$ and $\mu_y=-0.5$;

FIG. 8D is an image showing a phase distribution of a trisected phase mask with asymmetric phase ramps aligned in three different directions;

FIG. 8E is an image showing a tri-spot PSF from a dipole emitter obtained using the phase mask illustrated in FIG. 8D in which $\mu_x=0.866$ and $\mu_y=0.5$;

FIG. 8F is an image showing a tri-spot PSF from a dipole emitter obtained using the phase mask illustrated in FIG. 8D in which $\mu_x=0.866$ and $\mu_y=-0.5$;

FIG. 12A is an image showing a schematic illustration of a first step in an axis rotation used to calculate second moments of molecular orientation for a symmetric distribution mode;

FIG. 12B is an image showing a schematic illustration of a second step in an axis rotation used to calculate second moments of molecular orientation for a symmetric distribution mode;

FIG. 17A is a graph of $\gamma$ estimation bias as a function of $\gamma_{true}$ for a signal to background ratio of 500;

FIG. 17B is a graph of $\gamma$ estimation bias as a function of $\gamma_{true}$ for a signal to background ratio of 167;

FIG. 17C is a graph of $\gamma$ estimation bias as a function of $\gamma_{true}$ for a signal to background ratio of 100;

FIG. 17D is a graph of $\gamma$ estimation bias as a function of $\gamma_{true}$ for a signal to background ratio of 1000;

FIG. 17E is a graph of $\gamma$ estimation bias as a function of $\gamma_{true}$ for a signal to background ratio of 333;

FIG. 17F is a graph of $\gamma$ estimation bias as a function of $\gamma_{true}$ for a signal to background ratio of 200;

FIG. 17G is a graph of $\gamma$ estimation bias as a function of $\gamma_{true}$ for a signal to background ratio of 1500;

FIG. 17H is a graph of $\gamma$ estimation bias as a function of $\gamma_{true}$ for a signal to background ratio of 500;

FIG. 17I is a graph of $\gamma$ estimation bias as a function of $\gamma_{true}$ for a signal to background ratio of 300;

FIG. 23A is a graph summarizing the distribution of dipole moments $\langle \mu_i^2 \rangle$ of fluorescent beads estimated by the basis inversion method;

FIG. 23B is a graph summarizing the distribution of dipole moments $\langle \mu_i \mu_j \rangle$ of fluorescent beads estimated by the basis inversion method;

FIG. 23C is a graph summarizing the distribution of dipole moments $\langle \mu_i^2 \rangle$ of simulated isotropic emitters pumped by a circular-polarized laser in the x-y plane;

FIG. 23D is a graph summarizing the distribution of dipole moments $\langle \mu_i \mu_j \rangle$ of simulated isotropic emitters pumped by a circular-polarized laser in the x-y plane;

FIG. 26A is a raw image of a single molecule emitter with an orientation of $\mu_x=-0.35$, $\mu_y=-0.92$, and $\gamma=1$;

FIG. 26B is a recovered image of a single molecule emitter based on the raw image shown in FIG. 26A;

FIG. 26C is a raw image of a single molecule emitter with an orientation of $\mu_x=0.59$, $\mu_y=-0.81$, and $\gamma=0.86$;

FIG. 26D is a recovered image of a single molecule emitter based on the raw image shown in FIG. 26C;

FIG. 30A is an image of a bisected PSF of a fixed dipole single molecule emitter;

FIG. 30B is an image of a bisected PSF of a single molecule emitter with intermediate rotation;

FIG. 30C is an image of a bisected PSF of a freely rotating dipole single molecule emitter;

FIG. 30D is an image of a tri-spot PSF of a fixed dipole single molecule emitter;

FIG. 30E is an image of a tri-spot PSF of a single molecule emitter with intermediate rotation;

FIG. 30F is an image of a tri-spot PSF of a freely rotating dipole single molecule emitter;

FIG. 31A is an image schematically illustrating a relation between molecular orientation of the single-molecule emitter and the image;

FIG. 31B is an image schematically illustrating a relation between molecular orientation of the single-molecule emitter and the image for a fixed dipole emitter in x-y plane, 45° from x-axis;

FIG. 31C is an image schematically illustrating a relation between molecular orientation of the single-molecule emitter and the image for an isotropic emitter (freely rotating dipole): characterized by $$M = \left[\frac{1}{3}, \frac{1}{3}, \frac{1}{3}, 0, 0, 0\right]^T;$$

FIG. 32 is a flowchart illustrating a general method of tri-spot PSF imaging in accordance with one aspect of the disclosure;

FIG. 33 is an optical system using a transmissive phase mask;

FIG. 34 is an optical system using mask with phase and polarization modulation;

FIG. 35 is an implementation of tri-spot phase mask;

FIG. 36 is a graph summarizing a thickness distribution corresponding to the mask illustrated in FIG. 35;

FIG. 37 is an image of a tri-point PSF obtained in accordance with one aspect of the disclosure;

FIG. 38A is a captured tri-spot PSF image of a single Atto 647N molecule (scale bar: 1 μm; color bar: photons detected);

FIG. 38B is a fitted tri-spot PSF image of the single Atto 647N molecule of FIG. 38A (scale bar: 1 μm; color bar: photons detected);

Figures 39A, 39B:
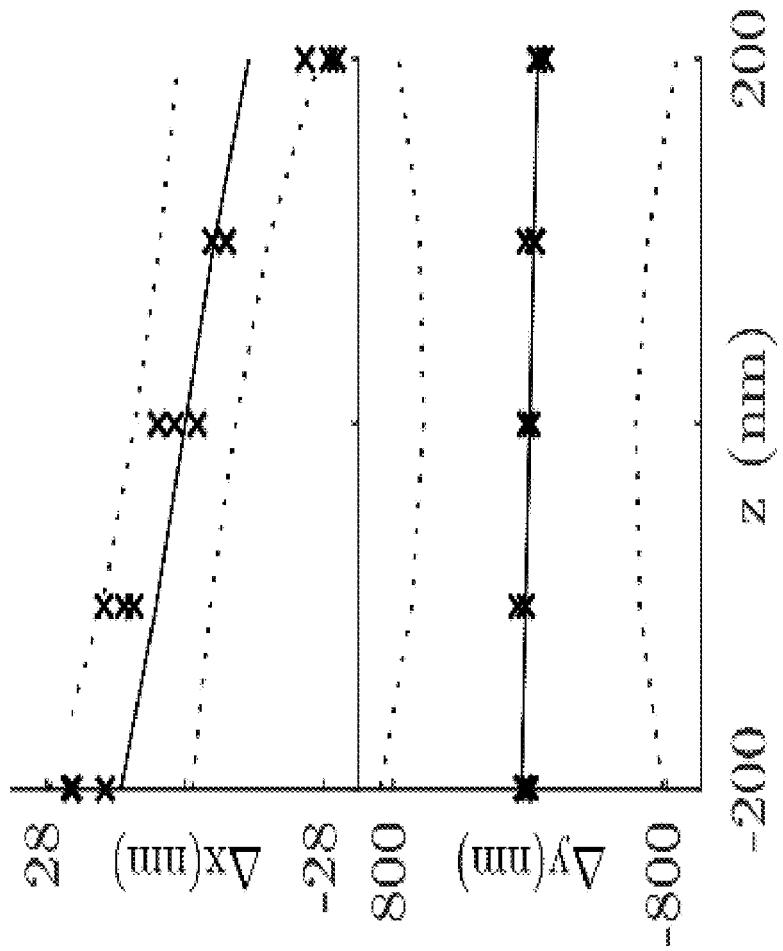
Figure 40A:
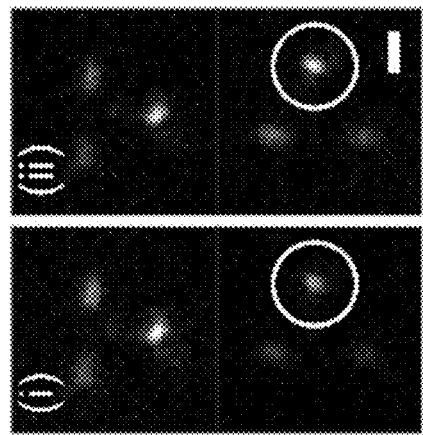
Figure 41A:
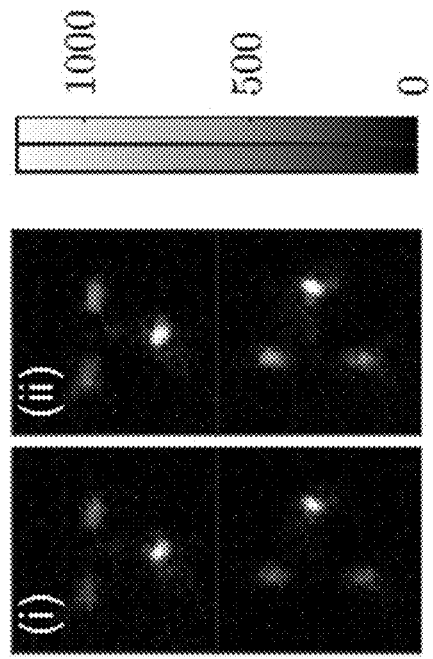
Figure 41B:
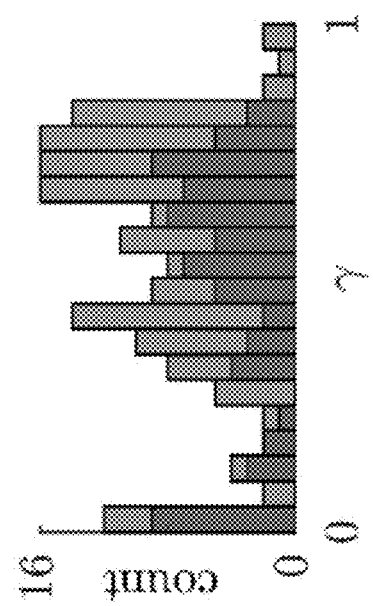
Figure 44B:
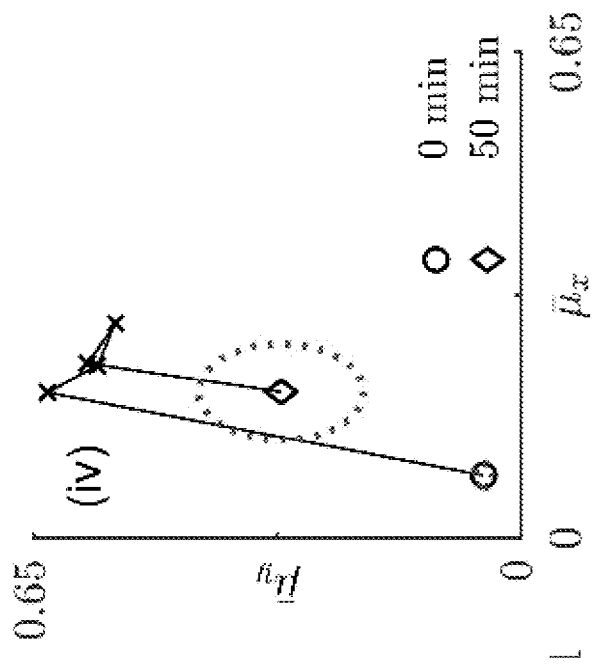
Figure 44A:
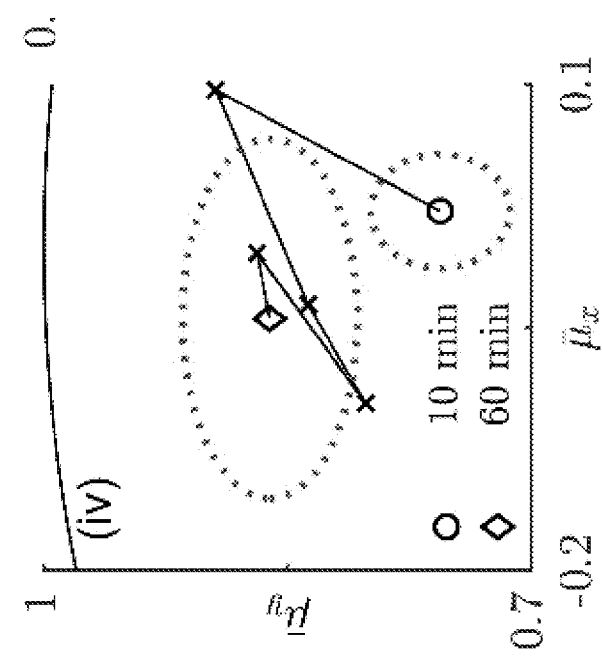
Figure 45A:
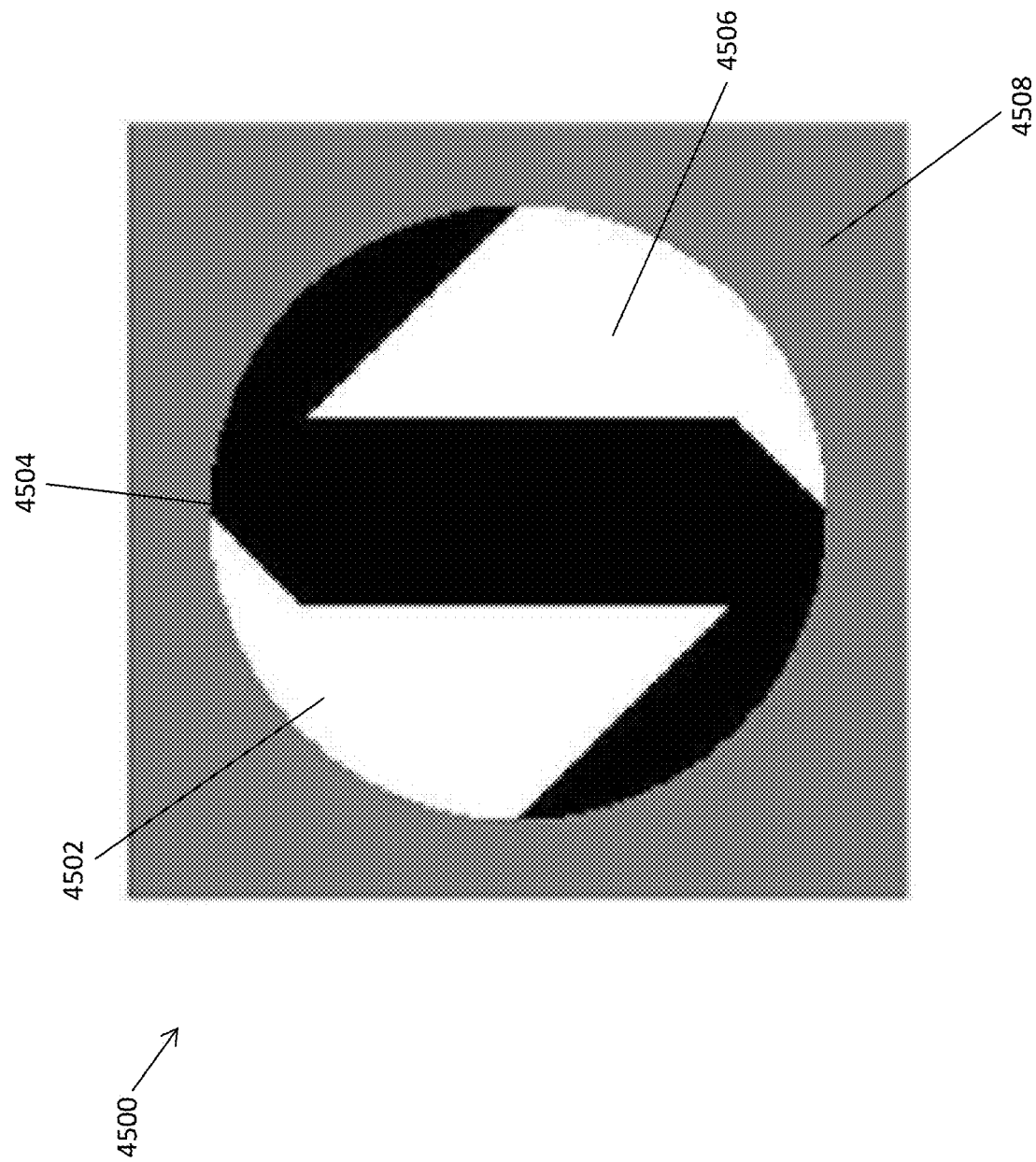
Figure 45B:
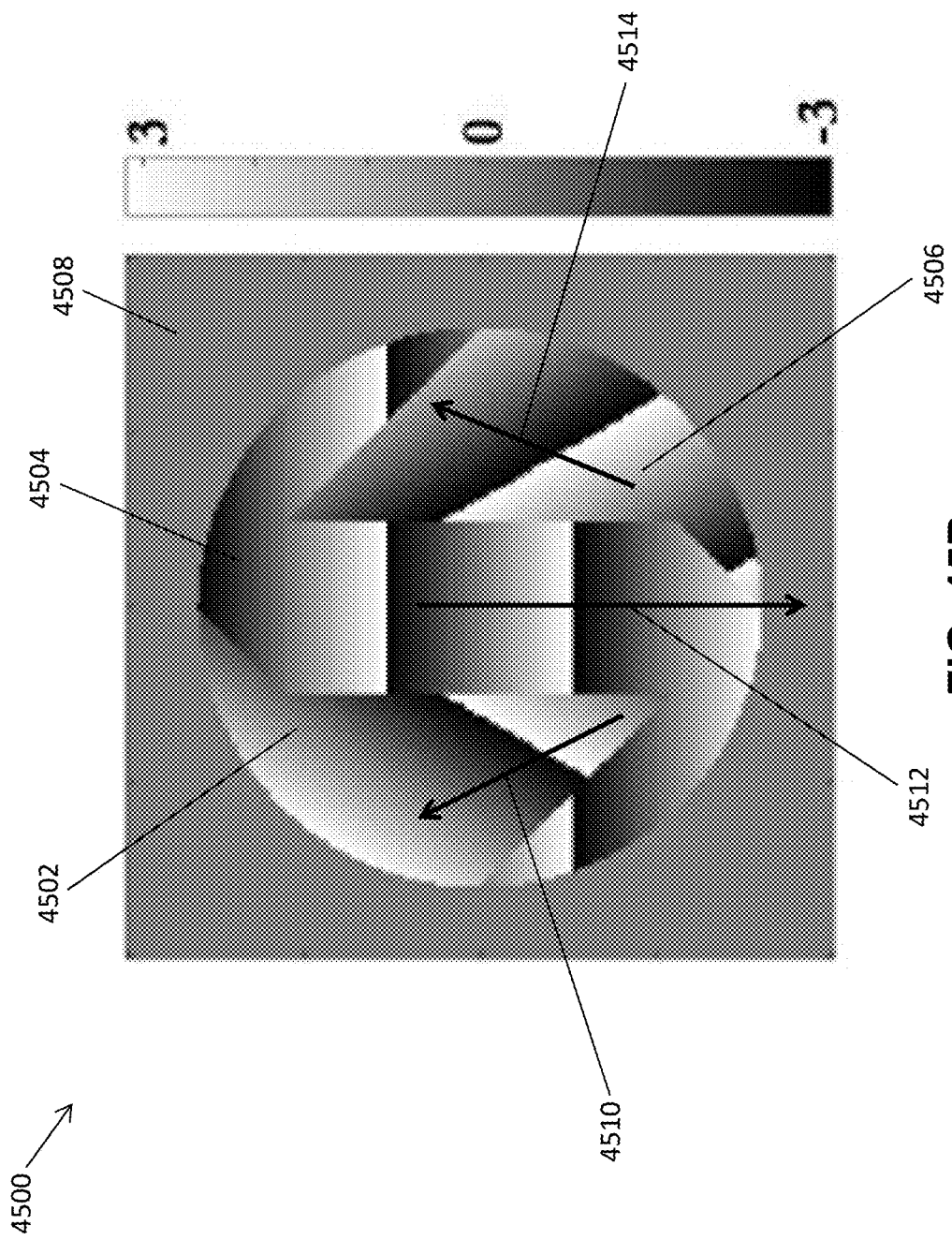

FIG. 39A is a graph summarizing the measured localization error (cross) along the x-axis in the x-polarized channel at different z positions for the single Atto 647N molecule of FIG. 38A using the standard PSF, in which the solid line represents the predicted lateral translation from the tri-spot's orientation measurements, and the dashed line marks the ranges of experimental localization precision (±1 std. dev.);

FIG. 39B is a graph summarizing the measured localization error (cross) along the y-axis in the y-polarized channel at different z positions for the single Atto 647N molecule of FIG. 38A using the standard PSF, in which the solid line represents the predicted lateral translation from the tri-spot's orientation measurements, and the dashed line marks the ranges of experimental localization precision (±1 std. dev.);

FIG. 40A is a captured tri-spot PSF image using x-polarized excitation (left image) and y-polarized excitation (right image) of a single 100-nm bead emitter;

FIG. 39B is a captured tri-spot PSF image using x-polarized excitation (left image) and y-polarized excitation (right image) of a single 20-nm bead emitter;

FIG. 41A is a graph showing a histogram of rotational constraint γ obtained from captured tri-spot PSF images from 118 fluorescent beads measured using x-polarized excitation;

FIG. 41B is a graph showing a histogram of Rotational constraint γ obtained from captured tri-spot PSF images from the 118 fluorescent beads of FIG. 40A measured using y-polarized excitation;

FIG. 42A is a captured tri-spot PSF image using x-polarized excitation (left image) and y-polarized excitation (right image) of a first Atto 647N molecule emitter with circles highlighting changes in spot brightness at the beginning of time-lapse imaging (left image) and at the end of time-lapse imaging (right image);

FIG. 42B is a captured tri-spot PSF image using x-polarized excitation (left image) and y-polarized excitation (right image) of a second Atto 647N molecule emitter with circles highlighting changes in spot brightness at the beginning of time-lapse imaging (left image) and at the end of time-lapse imaging (right image);

FIG. 43A is a graph showing a change in rotational constraint γ and lateral movement (Δr) obtained from tri-spot PSF images over an hour of time-lapse from the first Atto 647N molecule emitter of FIG. 42A;

FIG. 43B is a graph showing a change in rotational constraint γ and lateral movement (Δr) obtained from tri-spot PSF images over an hour of time-lapse from the second Atto 647N molecule emitter of FIG. 42B;

FIG. 44A is a graph showing an orientation trajectory obtained from tri-spot PSF images over an hour of time-lapse from the first Atto 647N molecule emitter of FIG. 42A;

FIG. 44B is a graph showing an orientation trajectory obtained from tri-spot PSF images over an hour of time-lapse from the second Atto 647N molecule emitter of FIG. 42B;

FIG. 45A is an image showing partitions of a phase mask in accordance with one aspect of the disclosure; and FIG. 45B is an image showing the phase mask of FIG. 45A with a phase delay ramp overlaid on each partition.

DETAILED DESCRIPTION

In various aspects, systems and methods for performing optical imaging using a tri-spot point spread function (PSF) are provided. In one aspect, custom-designed phase filters are used to produce tri-spot PSFs within the context of a single molecule emission imaging system. The information encoded in the by the tri-spot PSFs contain sufficient information to obtain a complete characterization of a single-molecule emitter including 3D position and orientation, as well as rotational mobility, of the emitter.

The present disclosure is based, at least in part, on the discovery that changing the response of the imaging system into a custom shape (e.g., three spots) can provide additional molecular orientation information. As described herein, a method for measuring all five degrees of freedom related to molecular orientation and rotational mobility that can be easily implemented on fluorescent microscopes has been developed.

In various aspects, a method for measuring the molecular orientation and rotational mobility of single-molecule emitters using an engineered tri-spot point spread function is provided. The tri-spot point spread function is designed so that it is capable of measuring all degrees of freedom related to molecular orientation and rotational mobility. The tri-spot point spread function is enabled by a phase mask provided with asymmetrical partitions configured to eliminate degeneracy in order to enhance sensitivity over the full range of possible orientations of the emitter molecules. The phase mask's design is optimized by maximizing the theoretical limit of measurement precision. Two methods, basis inversion and maximum likelihood, are used to estimate the molecular orientation and rotational mobility.

Conventionally, imaging systems measure where an object is in space. The new approach, as described herein, measures an object's orientation and rotational mobility in addition to position. This new imaging approach can be used to infer how a protein is folded or how a drug molecule interacts with a receptor or cell membrane. In photographic imaging, this new approach can allow for a blurry, out of focus image to be refocused and sharpened digitally.

As described herein, the tri-spot point spread function (PSF) produce three spots arranged in a triangle pattern. The relative brightness of each of the three spots provides information about the orientation of light sources that emit dipole-like radiation patterns, such as gold nanorods and fluorescent molecules. This tri-spot PSF enables an imaging system and image-processing software to measure the orientation of single molecules inside living cells.

While other PSFs and imaging devices can measure the orientation of nanoscale light sources, the tri-spot PSF has been specifically optimized for measuring the all five possible degrees of freedom that describe the orientational behavior of a nanoscale light emitter. This PSF, when combined with a polarization-sensitive imaging system, yields images with maximum signal-to-noise ratio while also measuring all five parameters of orientation simultaneously. The disclosed tri-spot PSF is convenient to implement on standard microscopes and imaging systems by incorporation of the disclosed tri-spot PSF phase mask or a phase-only spatial light modulator.

Figure 3A:
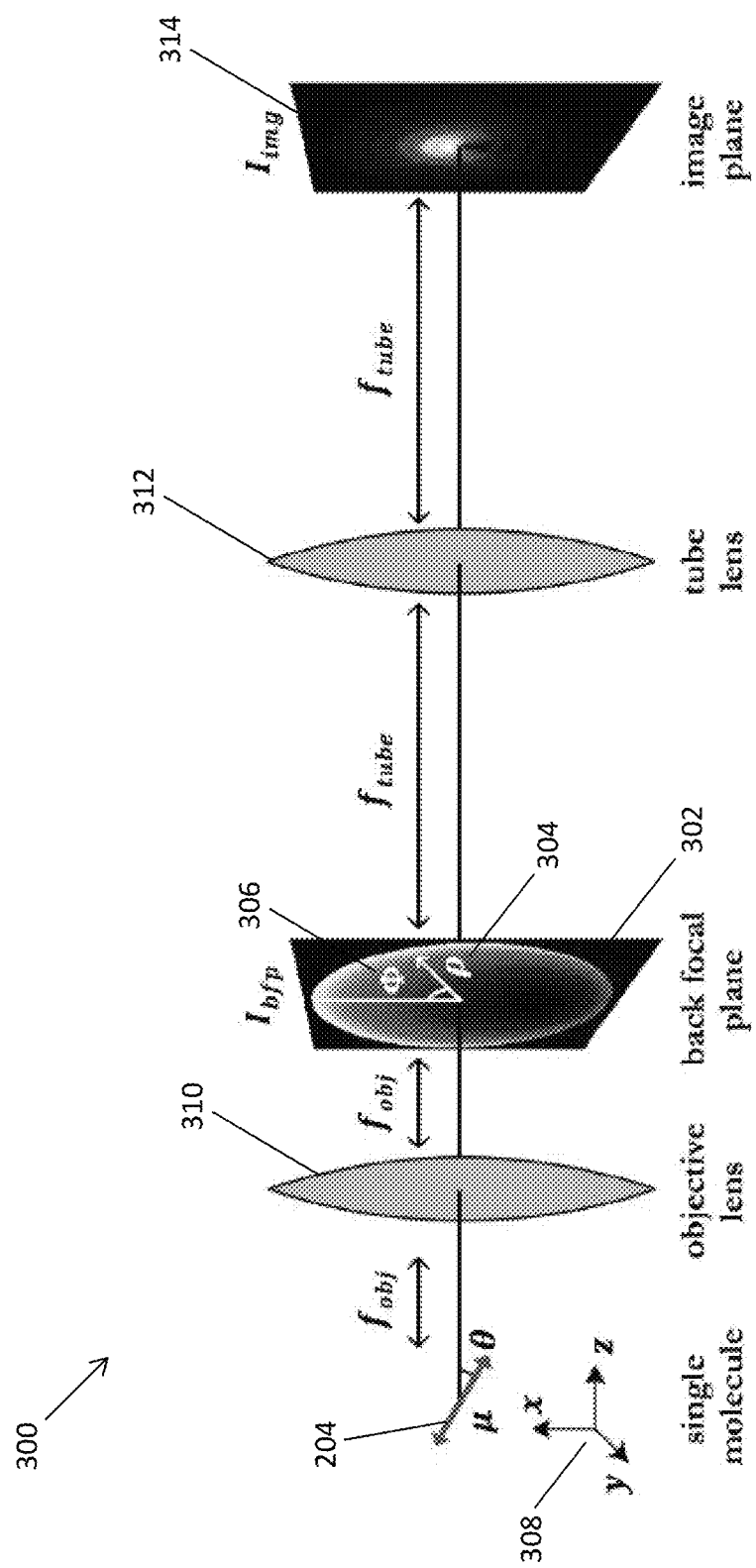
FIG. 3A is a schematic illustration showing an overview of a tri-spot PSF single-molecule imaging system according to one aspect of the disclosure.
Figure 3B:
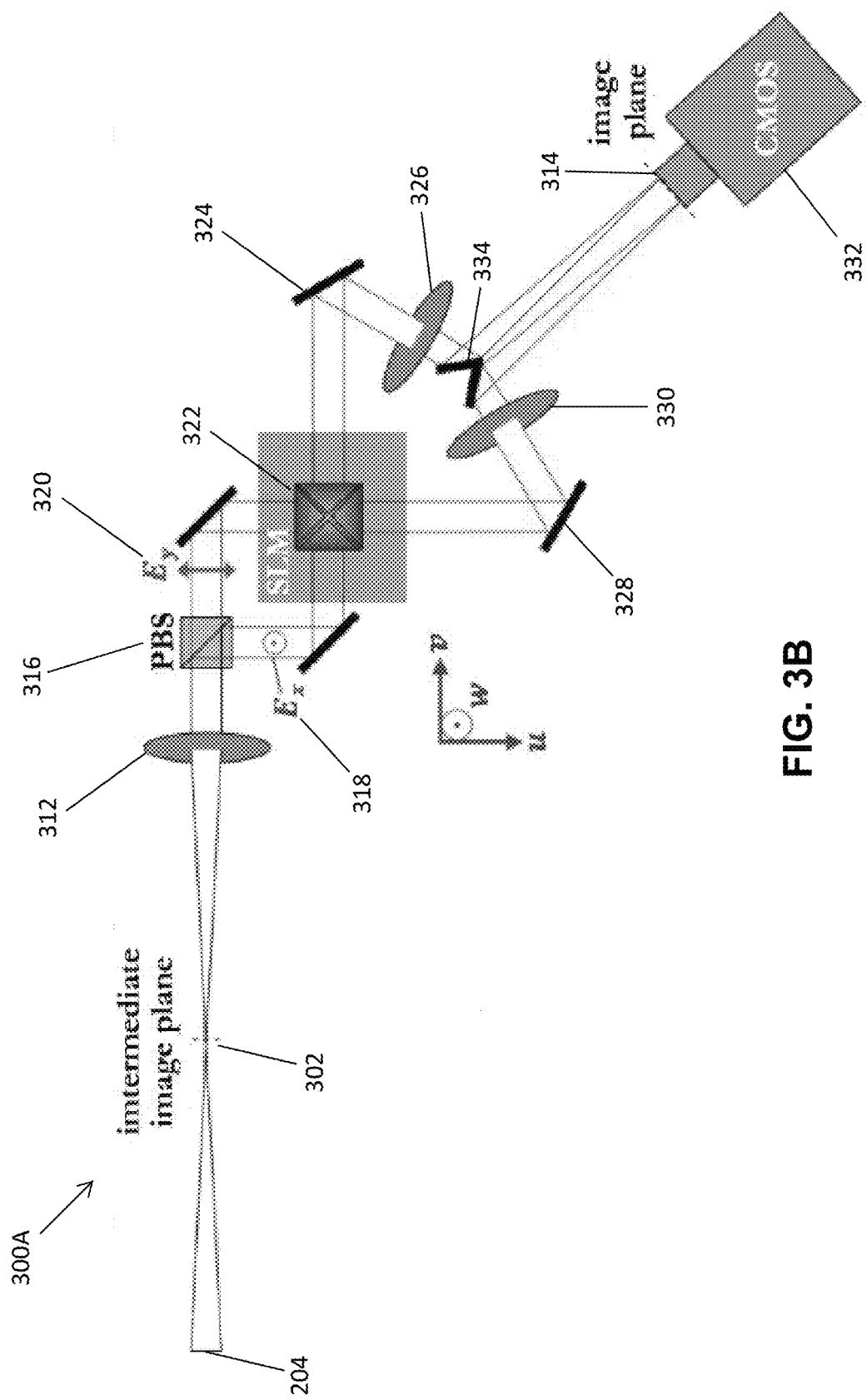
FIG. 3B is a schematic illustration showing a polarization sensitive 4f system used with the tri-spot PSF single-molecule imaging system shown in FIG. 3A.

FIG. 3B is an illustration of a tri-spot point spread function (PSF) imaging system 300A in one aspect. As illustrated in FIG. 3B, the tri-spot PSF imaging system 300A includes a polarization beam splitter (PBS) 316 to separate light into two imaging channels 318, 320 (shown in red and blue beam lines). The system 300A further includes a first lens 312 configured to creates an image of the pupil plane 302 within the objective lens on a spatial light modulator (SLM) 322. The SLM 322 adds a phase delay pattern to the electric field distribution. Tri-spot phase masks 326, 330 are placed in the back focal plane (BFP) in both channels 318, 320. The fluorescence in both channels 318, 320 received in the image plane 314 is captured by the same image sensor 332. As illustrated in FIG. 3B, the system 3B may further include mirrors 328, 324, 334 or other optical elements including, but not limited to, prisms, configured to directed light from the first and second channels 318, 320 from the SLM 322 to the image plane 314 of the imaging device 332. A close-up view of one mirror 334A is provided in FIG. 3C.

Figure 33:
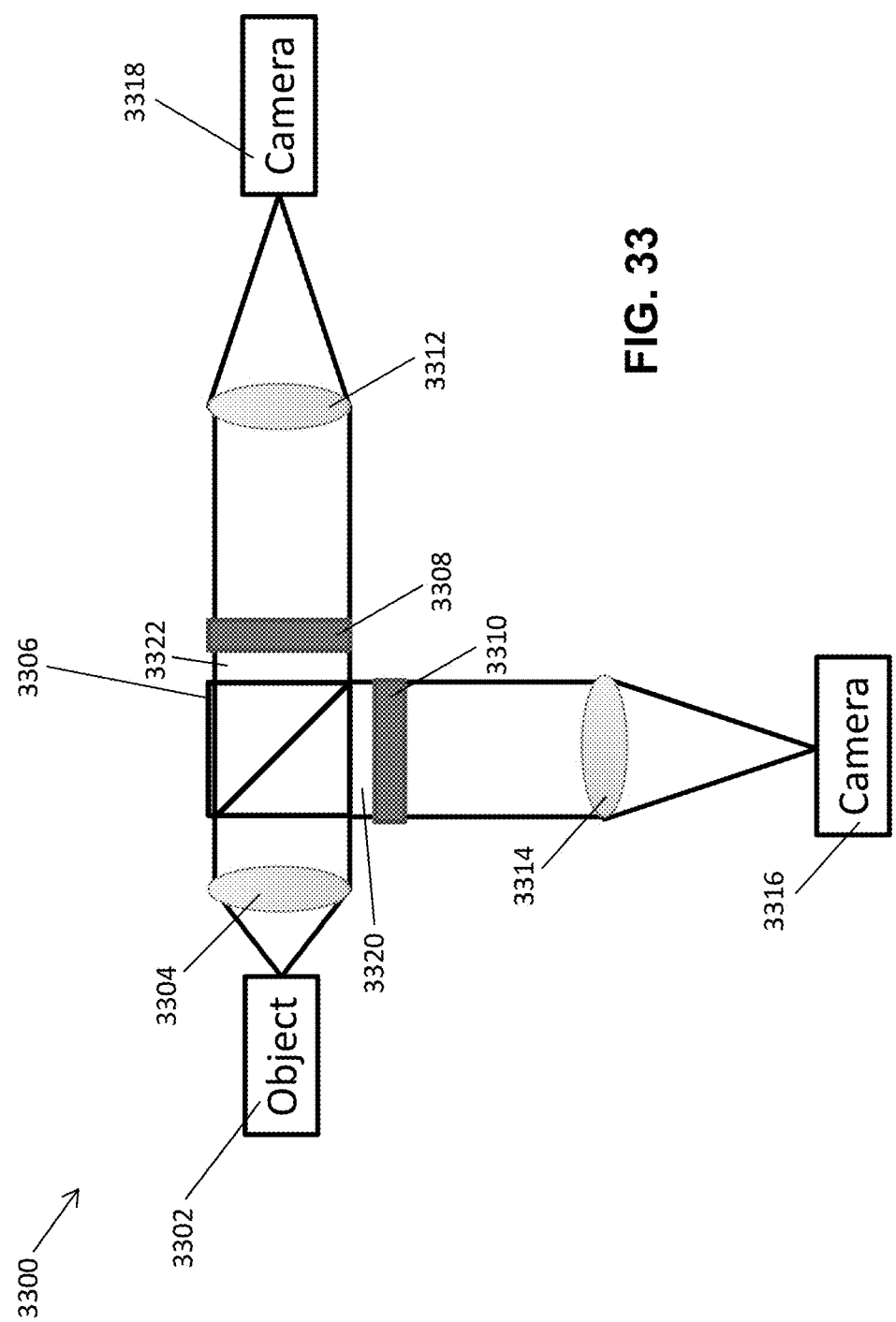

FIG. 33 is a schematic diagram of a tri-spot point spread function (PSF) imaging system 3300 in another aspect. As illustrated in FIG. 33, the tri-spot PSF imaging system 3300 includes a polarization beam splitter (PBS) 3306 to separate light from an object/emitter 3302 into two imaging channels 3320, 3322. The system 3300 further includes a first lens 3304 configured to creates an image of the pupil plane within the PBS 3306. Tri-spot phase masks 3308, 3310 are positioned between the PBS 3306 and first and second cameras 3316, 3318. First and second cameras 3316, 3318 are configured to detect the tri-spot PSF images from the first and second polarized channels 3320 and 3322, respectively.

Figure 34:
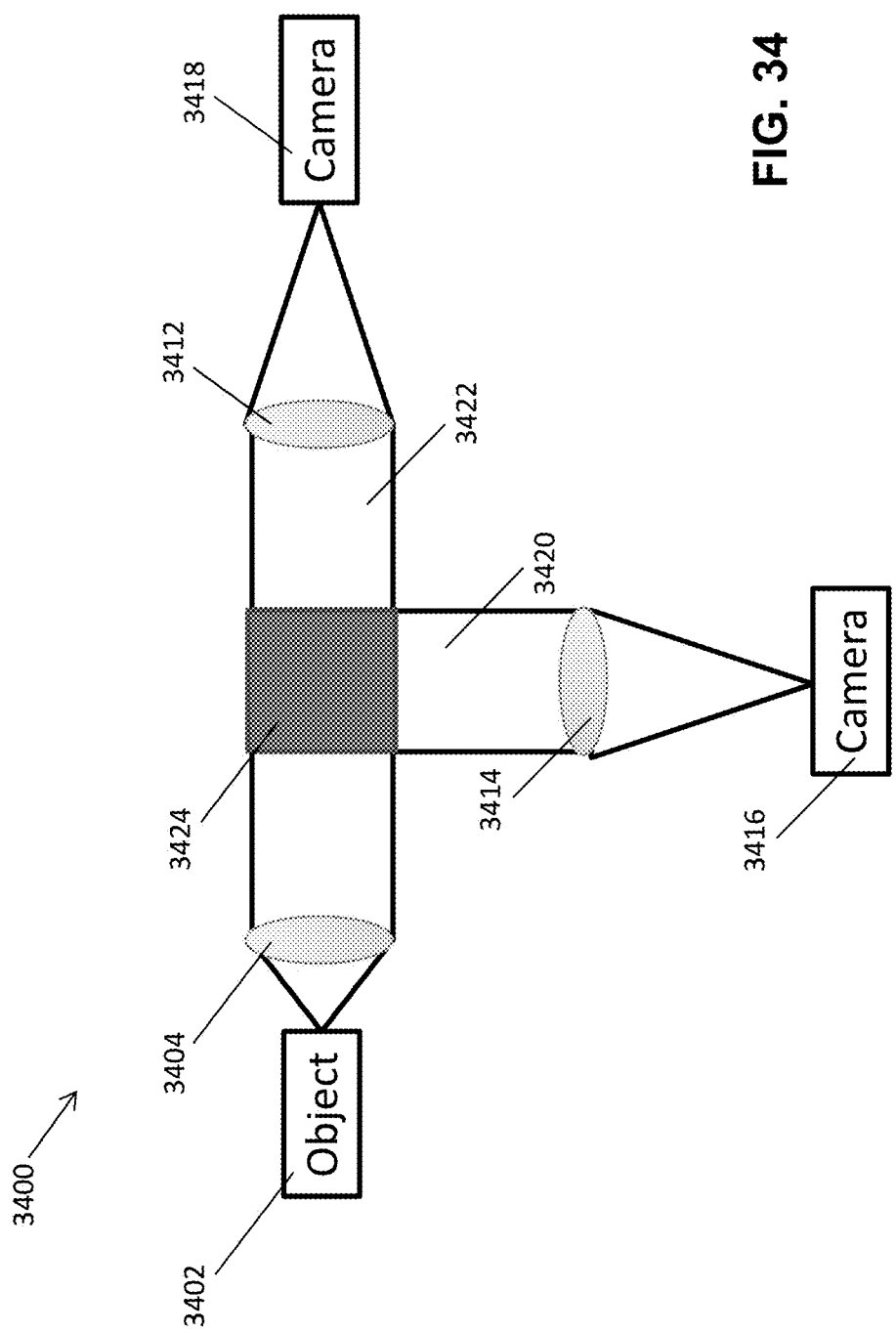
Figure 35:
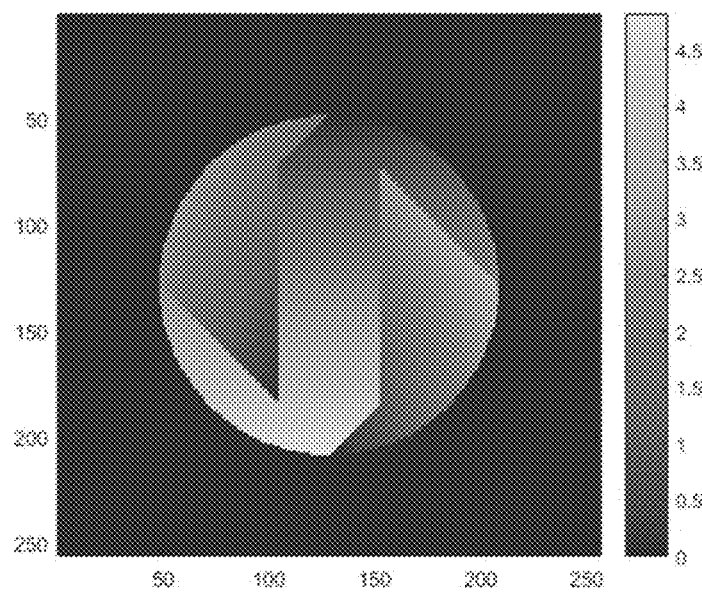
Figure 36:
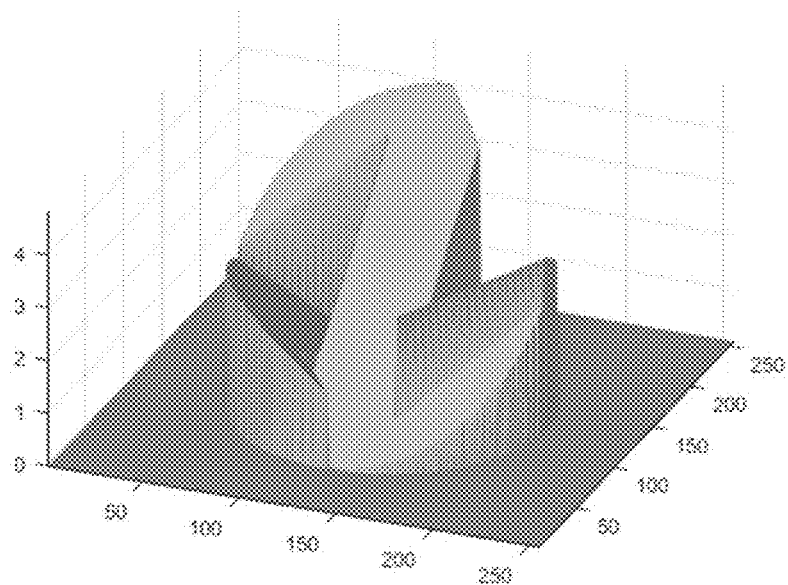

FIG. 34 is a schematic diagram of a tri-spot point spread function (PSF) imaging system 3400 in an additional aspect. As illustrated in FIG. 34, the tri-spot PSF imaging system 3300 includes a combined polarization beam splitter/tri-spot phase mask 3424 configured to separate light from an object/emitter 3402 into two imaging channels 3420, 3422 and to produce the tri-spot PSF phase patterns. The system 3400 further includes a first lens 3404 configured to creates an image of the pupil plane within the combined polarization beam splitter/tri-spot phase mask 3424. First and second cameras 3416, 3418 are configured to detect the tri-spot PSF images from the first and second polarized channels 3320 and 3322, respectively.

Figure 37:
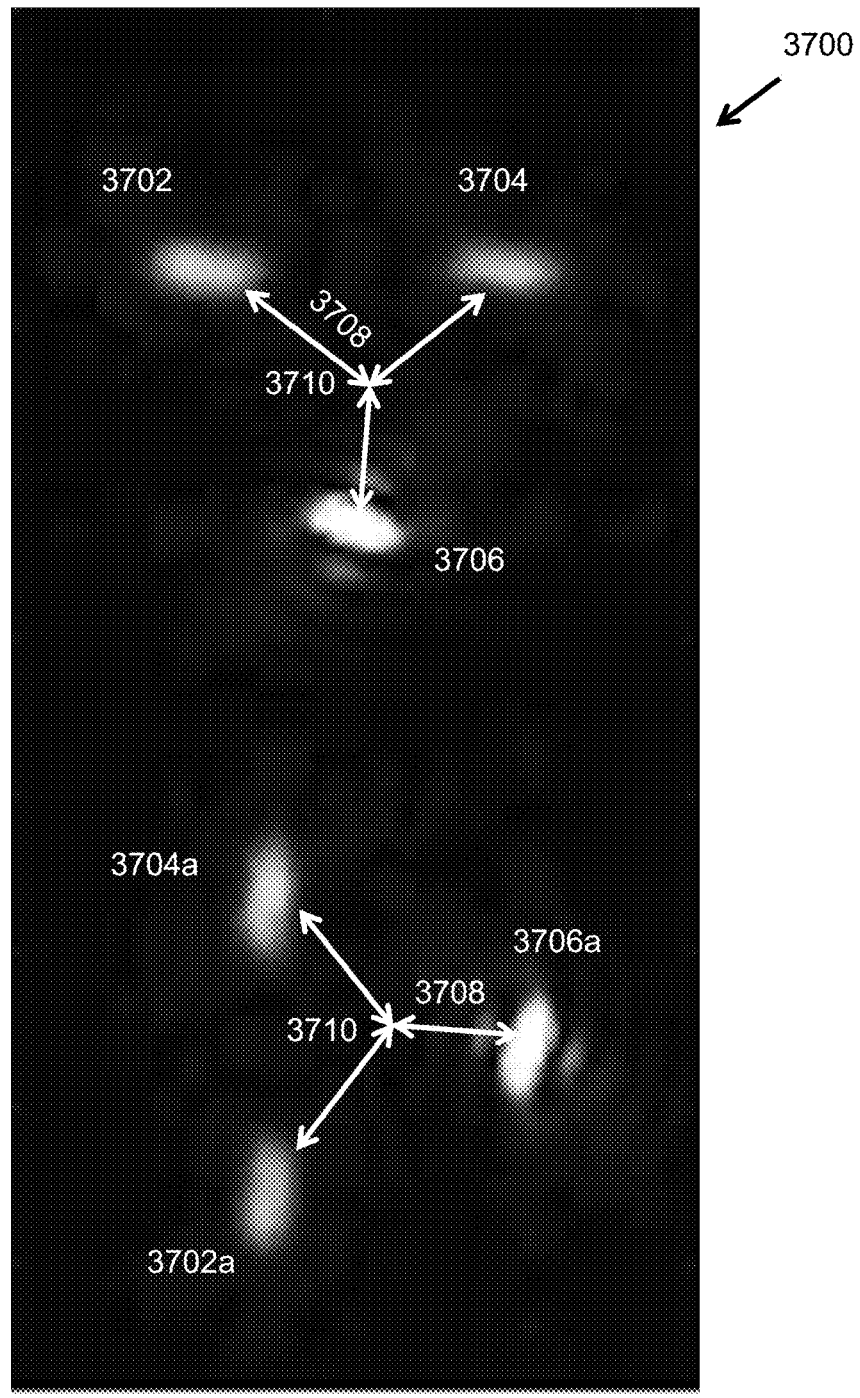

FIG. 37 is an image illustrated the features of a tri-spot PSF image 3700 in one aspect. The image 3700 include an upper portion associated with the x-polarized channel that includes three spots 3702, 3704, and 3706 arranged in a triangular pattern with a centroid 3710, in which each spot 3702, 3704, and 3706 is separated from the centroid 3710 by a distance 3708 that may be similar or different for each spot 3702, 3704, and 3706 in various aspects. Due to the geometry of the imaging system and reflective spatial light modulator described herein, the PSF captured from the y-polarized channel in the lower portion of the image 3700 is rotated counterclockwise by 90° relative to the tri-spot PSF image captured from the x-polarized channel in the upper portion of the image 3700. The lower portion image associated with the y-polarized channel similarly includes three spots 3702a, 3704a, and 3706a arranged in a triangular pattern with a centroid 3710, in which each spot 3702a, 3704a, and 3706a is separated from the centroid 3710 by a distance 3708 that may be similar or different for each spot 3702a, 3704a, and 3706a in various aspects. As described in additional detail below, at least a portion of the features of the tri-spot PSF image 3700 may be analyzed to determine information about the orientation of a dipole-like emitter in various aspects.

Definitions and methods described herein are provided below. Unless otherwise noted, terms are to be understood according to conventional usage by those of ordinary skill in the relevant art.

I. Single-Molecule Emitters

Figure 1:
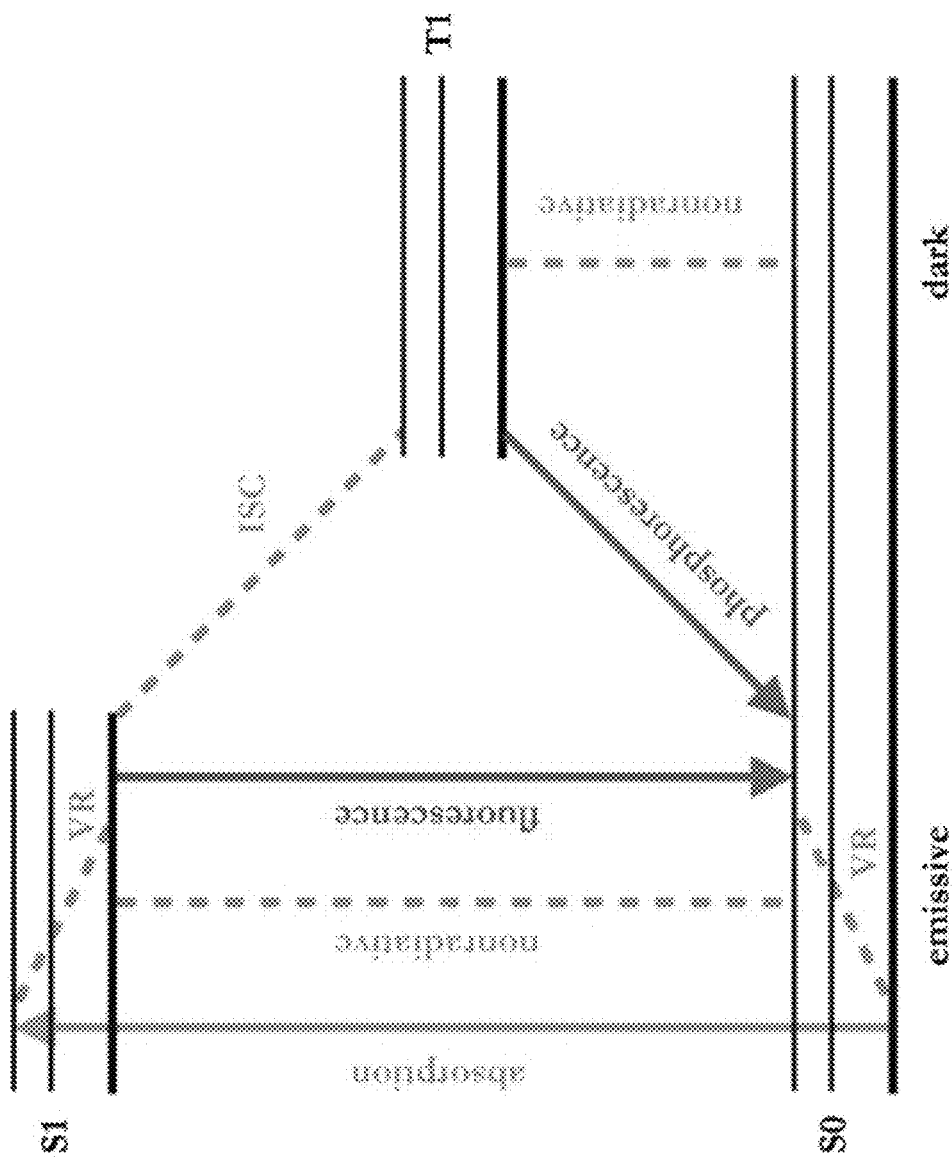
FIG. 1 is a simplified Jablonski diagram describing molecule-light interaction.

In various aspects, including, but not limited to, fluorescence microscopy that makes use of the tri-spot PSF as described herein, single-molecule emitters, including, but not limited to, fluorescent molecules and other dipole-like emitters may be used. Typically light is used to excite fluorescent molecules when they are in an emissive form as shown in FIG. 1. In the excitation process, a photon from incident light is absorbed by the molecule, and the energy within the photon causes the molecule to undergo a transition from a ground state ($S_0$) to an excited state ($S_1$). After vibrational relaxation within a few picoseconds, the molecule typically relaxes back to the ground state, with a photon emitted simultaneously. The typical excited state lifetime, defined herein as the time the molecule spends in the $S_1$ state before emitting a photon, is on the order of nanoseconds. The emitted photon's wavelength is typically red-shifted since energy is lost as the molecule relaxes vibrationally. The emission of light by a single fluorescent molecule typically occurs much faster compared to the exposure time of one camera frame, so a conventional camera used in fluorescent-based optical visualization systems captures multiple fluorescence photons within one frame. The transition from excited state to ground state can also occur via non-radiative pathways, in which the state energy is released through heat instead of light.

The molecule in the excited state might go through inter-system crossing (ISC) and enter a triplet state $T_1$, a state characterized by an electron with a flipped spin. The molecule can stay in the triplet state from milliseconds to minutes, which is comparable with the exposure time. While in this state, the molecule does not interact with the excitation light, and therefore, such a molecule will appear to be "dark" on the camera. From this triplet state, it can either return to the emissive form, or photobleach, which is an irreversible chemical reaction that prevents the molecule from absorbing or emitting any additional photons.

From triplet state, the molecule can return to emissive ground state through a radiative transition termed phosphorescence or through non-radiative decay. The molecule could also be chemically converted into a permanent dark form. Such an irreversible transition is called photobleaching. Also from the triplet state, the molecule can return to emissive ground state through a radiative transition termed phosphorescence or through non-radiative decay.

In addition the orientation of a dipole-like emitter affects how it interacts with light, including, but not limited to the absorption and emission of light by a single molecule emitter. Typically, the orientation of a molecule is denoted by a unit vector $\mu$, which characterizes a transition dipole moment of the molecule. The rate that the molecule transitions from ground state to the excited state is related, at least in part, to the orientation of the molecule and the excitation electric field E:

$$\Gamma_{excitation} \propto |\mu \cdot E|^2 \qquad \text{Eqn. (1)}$$

In Eqn. (1), the electric field 206 is assumed to be constant within the dimension of a single-molecule emitter, typically on the order of a few nm. The excitation rate is proportional to $\cos^2 \nu$, where $\nu$ is the angle 202 between the transition dipole moment 204 and the excitation electric field 206 as shown in FIG. 2A. The emission intensity of a dipole at far field 208 typically has a sine-squared dependence on the angle 202 between the emission direction and the dipole moment 204.

The emission pattern of a single-molecule emitter can be calculated by solving the electromagnetic wave equation. In the far field (the distance to the emitter r is much larger than wavelength), the emission intensity is given by:

$$U_{far\_field} \propto 1 - \left|\mu \cdot \frac{r}{|r|}\right|^2 \qquad \text{Eqn. (2)}$$

Based on further analysis of Eqn. (2), the emission intensity is proportional to $\sin^2(\eta)$, where $\eta$ is defined as the angle 202 between the transition dipole moment 204 and the emission direction 210. Various methods have been developed to measure the orientation by either measuring $\Gamma_{excitation}$ or $U_{farfield}$. However, without being limited to any particular theory or experiment, it is known that the orientation of the excitation transition dipole moment 204 may be different from that of the emission transition dipole moment. In one aspect, a method of characterizing the dipoles of single molecule emitters is based on measuring the distribution of $U_{farfield}$.

II. Theoretical Representation of Single-Molecule Emitters

Figure 28:
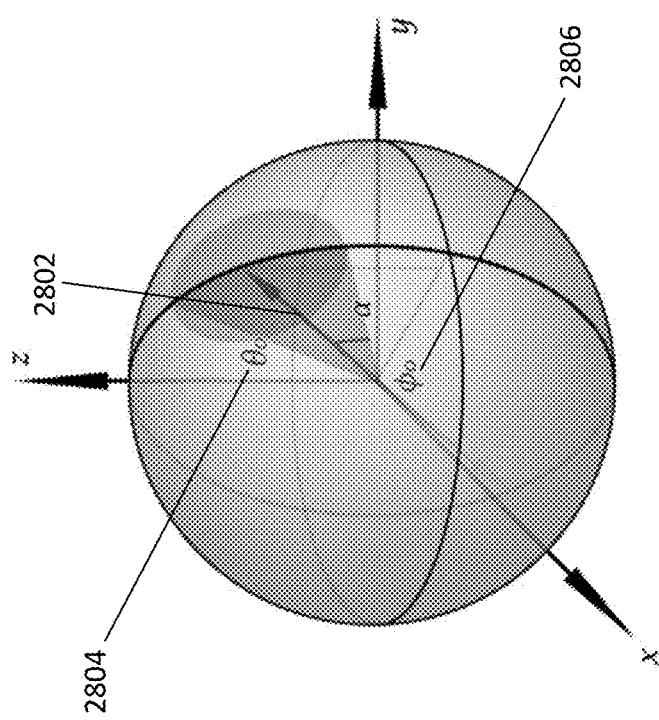
FIG. 28 is an image illustrating a molecular orientation convention for a dipole representation of orientation and movements of a single molecule emitter.

In various aspects, the systems and methods for obtaining a characterization of a dipole, such as a single molecule emitter, make use of a tri-spot PSF that was designed using a unique theoretical framework, as described herein. In this framework, the emitter is modeled as an oscillating electric dipole 204 with an orientation parameterized by a unit vector given by:

$$\mu = \begin{bmatrix} \mu_x \\ \mu_y \\ \mu_z \end{bmatrix} = \begin{bmatrix} \sin\theta\cos\phi \\ \sin\theta\sin\phi \\ \cos\theta \end{bmatrix} \qquad \text{Eqn. (3)}$$

where $\mu_x$, $\mu_y$, and $\mu_z$ denote the projection of onto each Cartesian axis 308 as shown in FIG. 3A. In an aspect, polar angle 2804 and azimuthal angle 2806 are used to represent the unit dipole vector, as illustrated in FIG. 28. The domain of definition of the unit dipole 2802 is typically a hemisphere. The ranges of the components of the unit dipole 2802 are typically specified as $\mu_x$, $\mu_y \in [-1,1]$, $\mu_z \in [0,1]$ or $\theta \in [0, \pi/2]$, $\phi \in [0, 2\pi]$.

Referring again to FIG. 3A, the electric field distribution can be calculated solving Maxwell's equations. After the ray rotation effect of the objective lens 310, the electric field distribution at the back focal plane 302 ($G_{bfp}(\Phi, \rho)$) can be written using the Green's tensor:

$$G_{bfp}(\Phi, \rho) = \frac{\exp(in_1 k f_{obj})}{4\pi f_{obj}} \sqrt{\frac{n_1}{n_0(1-\rho^2)^{1/2}}} \times \begin{bmatrix} \sin^2(\Phi) + & \sin(2\Phi) & \\ \cos^2(\Phi)\sqrt{1-\rho^2} & (\sqrt{1-\rho^2}-1)/2 & -\rho\cos(\Phi) \\ \sin(2\Phi) + & \cos^2(\Phi) + & \\ (\sqrt{1-\rho^2}-1)/2 & \sin^2(\Phi)\sqrt{1-\rho^2} & -\rho\sin(\Phi) \\ 0 & 0 & 0 \end{bmatrix} \qquad \text{Eqn. (4)}$$

In Eqn. (4), $\{\Phi, \rho\}$ 306, 304 are the polar coordinates of the back focal plane 302 as shown in FIG. 3A. $\rho_{max} = NA/n_1$ is determined by the numerical aperture of the objective lens 310. $n_0$ and $n_1$ denote the reflective indices of the back focal plane 302 (normally $n_0 \approx 1$) and of the medium in which the emitter is embedded. Notice that since the propagation direction is parallel to the optical (z) axis, there is no z component in $G_{bfp}$. The back focal plane 302 electric field is thus given by:

$$E_{bfp}(\Phi, \rho, d) = A \exp(in_1 k d\sqrt{1-\rho^2}) G_{bfp}(\Phi, \rho)\mu \qquad \text{Eqn. (5)}$$

where d is the defocus distance of the sample from the focal plane of the imaging system. In order to detect the polarization of the electric field, the disclosed imaging system separates the x- and y-polarized emission light into different channels. The back focal plane intensity distribution for x- and y-polarized light can be calculated as:

$$E_{bfp,x}(\Phi, \rho, d) = A \exp(in_1 k d\sqrt{1-\rho^2}) G_{bfp,x}(\Phi, \rho)\mu \qquad \text{Eqn. (6)}$$

$$E_{bfp,y}(\Phi, \rho, d) = A \exp(in_1 k d\sqrt{1-\rho^2}) G_{bfp,y}(\Phi, \rho)\mu \qquad \text{Eqn. (7)}$$

Figure 4A:
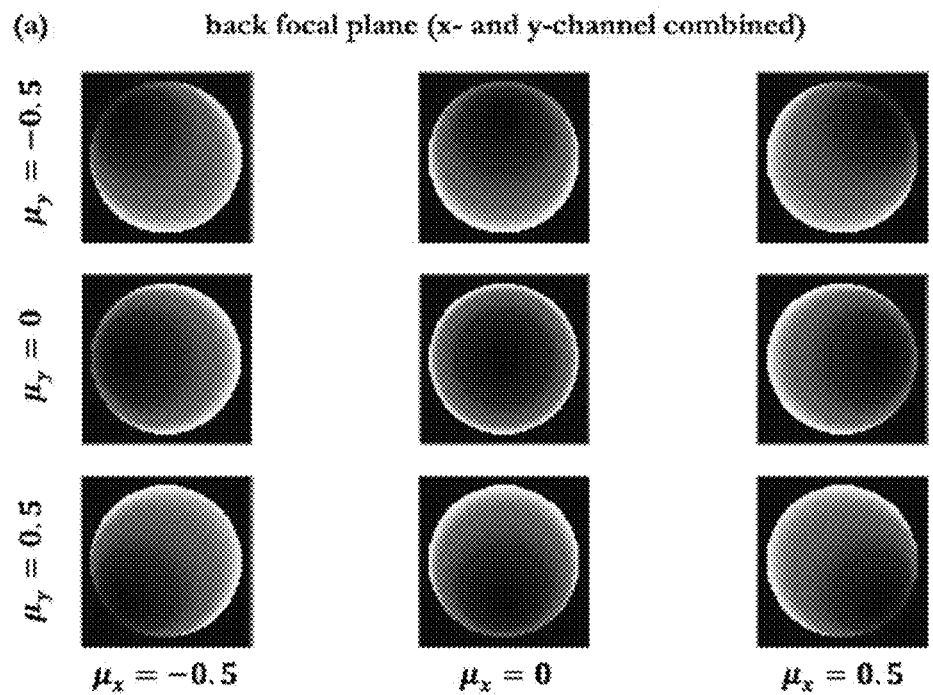
FIG. 4A includes a series of images showing back focal plane intensity distributions of combined x-polarized and y-polarized light for different orientations of a single-molecule emitter.
Figure 4B:
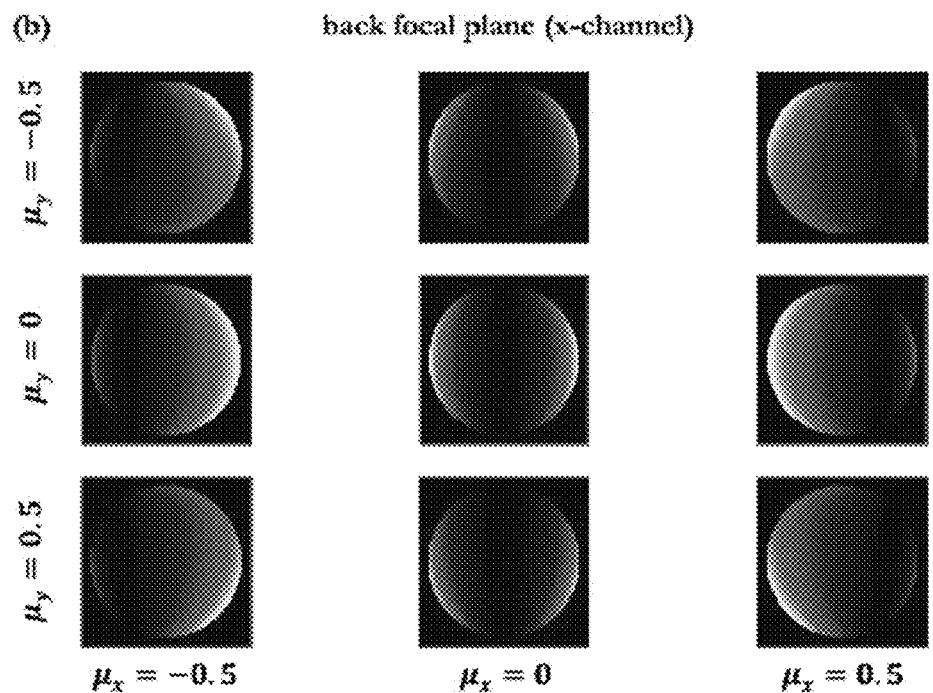
FIG. 4B includes a series of images showing back focal plane intensity distributions of x-polarized only for different orientations of a single-molecule emitter.

$G_{bfp,x}$ and $G_{bfp,y}$ refer to the first and second rows of $G_{bfp}$, so unlike $E_{bfp}$, $E_{bfp,x(y)}$ are scalars instead of vectors. The x- and y-polarized back focal plane intensity distributions are given by $I_{bfp,x(y)}=|E_{bfp,x(y)}|^2$, and the total intensity when both channels are combined is given by $I_{bfp}=|E_{bfp}|^2=I_{bfp,x}+I_{bfp,y}$. The intensity distributions $I_{bfp}$ and $I_{bfp,x}$ for certain is orientations are shown in FIG. 4A and FIG. 4B.

The electric field at the back focal plane after adding certain masks $\psi_x(\Phi, \rho)$ and $\psi_y(\Phi, \rho)$ to both polarization channels can be written as:

$$E'_{bfp,x(y)}=E_{bfp,x(y)}\exp(i\psi_{x(y)}(\Phi,\rho)) \qquad \text{Eqn. (8)}$$

Note that $\psi_x(\Phi, \rho)$ and $\psi_y(\Phi, \rho)$ can represent amplitude, phase, or complex modulation. The electric field at the imaging plane is the Fourier transform of the electric field at the back focal plane, as expressed in Eqn. (9):

$$E_{img,x(y)}(\Phi',\rho',d)=CF\{E'_{bfp,x(y)}\} \qquad \text{Eqn. (9)}$$

where F denotes the two-dimensional Fourier transform and C is a complex constant.

In an aspect, another expression for the electric field distribution at the image plane is defined as:

$$G_{img,x(y)}(\Phi', \rho', d) = \qquad \text{Eqn. (10)}$$
$$C \int_0^{2\pi} \int_0^{\rho_{max}} G_{bfp,x(y)}(\Phi, \rho) e^{i\psi_{x(y)}(\Phi,\rho)} e^{in_1 kd(1-\rho^2)^{1/2}}$$
$$e^{\frac{ikn_0 \rho\rho' \cos(\Phi'-\Phi)}{f_{tube}}} \rho d\rho d\Phi$$

Without being limited to any particular theory, Eqn. (10) is typically calculated using numerical methods. The results are expressed in the form expressed as Eqn. (11):

$$G_{img,x(y)}=[g_{x,x(y)}(\Phi',\rho',d)g_{y,x(y)}(\Phi',\rho',d)g_{z,x(y)}(\Phi',\rho',d)] \qquad \text{Eqn. (11)}$$

where $g_{i,x(y)}$ denotes the contribution of dipole component $\mu_i$ to the x(y)-polarized electric field. The electric field distribution within the imaging plane is simplified into the expression:

$$E_{img,x(y)}=AG_{img,x(y)}(\Phi',\rho',d)\mu \qquad \text{Eqn. (12)}$$

The intensity distribution of electric field within the imaging plane can therefore be calculated as:

$$I_{img,x(y)} = E_{img,x(y)} E^*_{img,x(y)} = \qquad \text{Eqn. (13)}$$
$$A^2 \begin{bmatrix} |g_{x,x(y)}|^2 \\ |g_{y,x(y)}|^2 \\ |g_{z,x(y)}|^2 \\ 2\Re(g^*_{x,x(y)}g_{y,x(y)}) \\ 2\Re(g^*_{x,x(y)}g_{z,x(y)}) \\ 2\Re(g^*_{y,x(y)}g_{z,x(y)}) \end{bmatrix}^T \begin{bmatrix} \mu_x^2 \\ \mu_y^2 \\ \mu_z^2 \\ \mu_x\mu_y \\ \mu_x\mu_z \\ \mu_y\mu_z \end{bmatrix} = I_0 \begin{bmatrix} XX_{x(y)} \\ YY_{x(y)} \\ ZZ_{x(y)} \\ XY_{x(y)} \\ XZ_{x(y)} \\ YZ_{x(y)} \end{bmatrix}^T \begin{bmatrix} \mu_x^2 \\ \mu_y^2 \\ \mu_z^2 \\ \mu_x\mu_y \\ \mu_x\mu_z \\ \mu_y\mu_z \end{bmatrix}$$

$B_{x(y)}=[XX_{x(y)}, \ldots, YZ_{x(y)}]$ are called the basis images of the system. These basis images are independent of the emitter and would only change if there were some changes in the imaging system. If the emitter is rotating, the image becomes a temporal average of multiple orientations, and the intensity at the imaging plane becomes:

$$I_{img,x(y)} = \frac{I_0}{t} B_{x(y)} \int_0^t \begin{bmatrix} \mu_{x,\tau}(\tau)^2 \\ \mu_{y,\tau}(\tau)^2 \\ \mu_{z,\tau}(\tau)^2 \\ \mu_{x,\tau}(\tau)\mu_{y,\tau}(\tau) \\ \mu_{x,\tau}(\tau)\mu_{z,\tau}(\tau) \\ \mu_{y,\tau}(\tau)\mu_{z,\tau}(\tau) \end{bmatrix} d\tau \qquad \text{Eqn. (14)}$$

where t is the exposure time of one camera frame. The subscript τ is used to indicate that this variable is a function of tune. ⟨⟩ is used to denote the temporal average of a function. With these conventions, Eqn. (14) is rewritten as:

$$\text{Eqn. (15)}$$
$$I_{img,x(y)} = I_0 B_{x(y)} [\langle\mu_{x,\tau}^2\rangle, \langle\mu_{y,\tau}^2\rangle, \langle\mu_{z,\tau}^2\rangle, \langle\mu_{x,\tau}\mu_{y,\tau}\rangle, \langle\mu_{x,\tau}\mu_{z,\tau}\rangle, \langle\mu_{y,\tau}\mu_{z,\tau}\rangle]^T$$
$$= I_0 B_{x(y)} M$$

M is a second-moment vector describing the dynamics of a molecule's orientation during a single camera frame. For a given imaging system, the image is the linear combination of all 12 basis images (2 polarizations and 6 basis images per polarization). The intensity of each basis is proportional to the second moment of the molecular orientation; that is, the images created by the imaging system in response to electric dipoles with second moment vector M. For example, an isotropic emitter has second moments $$M = \left[\frac{1}{3}, \frac{1}{3}, \frac{1}{3}, 0, 0, 0\right]^T,$$

and a fixed emitter has second moments $M=[\mu_x^2, \mu_y^2, \mu_z^2, \mu_x\mu_y, \mu_x\mu_x, \mu_z, \mu_y\mu_z]^T$.

III Tri-Spot Point Spread Function

Existing methods such as the bisected PSF and the quadrated PSF use information encoded within the relative intensity of each spot within the PSF to estimate the molecular orientation as shown in FIG. 5B, FIG. 5C FIG. 5D, and FIG. 5F, respectively. The top half of the PSF images of FIG. 5B, FIG. 5C, FIG. 5D, and FIG. 5F are obtained from the x channel (x-polarized light) and the bottom half of these PSF images are obtained from the y channel. The bisected PSF and the quadrated PSF are enabled by the introduction of phase filters, shown in FIG. 5A and FIG. 5E, respectively. The design and use of the phase filters are discussed in additional detail below.

Figures 29A, 29B:
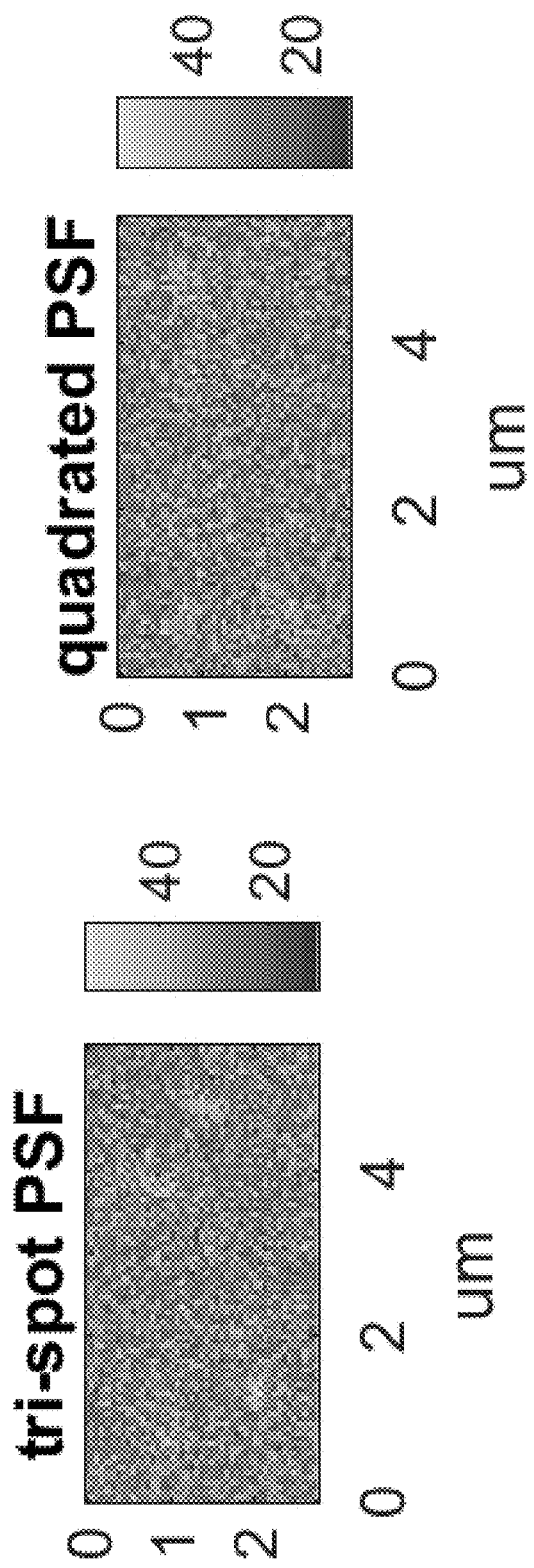
FIG. 29A is a simulation image obtained using a simulated tri-spot PSF with low SNR.
FIG. 29B a simulation image obtained using a simulated quadrated PSF with low SNR.

For single-molecule emitters, the total photon budget is typically limited. To operate effectively in this limited photon operational environment, PSF shapes are typically designed to be as concentrated as possible. One consequence of the limited photon operational environment is the PSF shapes that separating the received emission light into higher numbers of spots typically lower the signal-to-background ratio (SBR), which will affect the precision of the orientation measurement. By way of non-limiting example, FIG. 29A and FIG. 29B are simulated images constructed assuming a relatively low signal-to-noise ratio for a tri-spot PSF and a quadrated PSF, demonstrating the spots in the tri-spot PSF could be distinguished from background noise, whereas the spots in the quadrated PSF were significantly more difficult to distinguish from background noise.

However, higher numbers of spots in a PSF pattern potentially encode more information. As a result, separating emission light into fewer spots could introduce degeneracy into the measurement such that certain orientations become indistinguishable from one another. By way of non-limiting example, FIGS. 30A, 30B, and 30C are simulated images of bisected PSFs obtained from a single emitter for several different rotational values, and FIGS. 30D, 30E, and 30F are the corresponding simulated images of tri-spot PSFs. The bisected PSF exhibited degeneracy, manifested by the highly similar bisected PSF imaged for all emitter mobilities ranging from fixed to isotropic. By way of contrast, each of the three tri-spot PSF images at each respective value of γ, indicating essentially no degeneracy in the tri-spot PSF.

The image of a fluorescent emitter is a function of the second moments M of its dipole orientation distribution. Since $\langle \mu_{x,\tau}^2 \rangle + \langle \mu_{y,\tau}^2 \rangle + \langle \mu_{z,\tau}^2 \rangle = \langle \mu_{x,\tau}^2 + \mu_{y,\tau}^2 + \mu_{z,\tau}^2 \rangle = 1$ due to the definition of μ in Eqn. (3), there are a total five degrees of freedom to describe molecular orientation and rotational mobility of a single-molecule emitter. To estimate all 5 orientational degrees of freedom (plus one brightness degree of freedom) using the relative intensities of a multi-spot PSF, the PSF contains at least six spots total across both polarization channels of the imaging system.

In one aspect, x and y channels of the disclosed tri-spot PSF imaging system are generated by one spatial light modulator (SLM), as illustrated in FIG. 2B. In this aspect, the y-channel's image is the same shape as the corresponding x-channel's image, but the x-channel's image is rotated by 90° as demonstrated in FIG. 2B. Therefore, the three spots each channel enable sufficient numbers of spots in order to encode enough information about the orientation of the emitters, and further achieves good SBR quality at the same time.

In various aspects, illustrated in FIG. 45A and FIG. 45B, the phase mask 4500 selected for use in the disclosed imaging system divides the back focal plane 4508 into three partitions 4502, 4504, 4506. Each partition 4502, 4504, 4506 has a different linear phase ramp 4510, 4512, and 4514, respectively, which bends light within that partition like a prism. After the Fourier transform operation of the final lens 312 in the 4f system 300 as described in FIG. 3A and FIG. 3B above, the light from each partition is focused and translated onto separate regions of the image plane 314 of the camera. Therefore, the PSF within each channel of the imaging plane contains three spots, to enable the tri-spot PSF. Further optimization of the shape, size and phase ramp direction of each partition of the tri-spot PSF phase mask is discussed in additional detail herein below.

IV Phase Mask Design

In one aspect, the Fisher information (FI) content was used to evaluate the characteristics of candidate masks whose partitions varied in shape and size, in order to achieve highly precise estimates of molecular orientation, in another aspect, the Cramér-Rao lower bound (CRLB), which is the inverse of the Fisher information matrix, was used to evaluate the performance of each partition method, because the parameter defined a theoretical lower bound of the variance of any unbiased estimator.

In some aspects, only the CRLB of fixed dipole orientation distributions is evaluated and used to optimize the mask design, i.e., $\langle \mu_{x,\tau}^2 \rangle = \mu_x^2, \ldots, \langle \mu_{y,\tau}\mu_{z,\tau} \rangle = \mu_y\mu_z$. For the tri-spot PSF patterns, the integrated intensity of six spats from both x and y channels are used for estimation of emitter orientation, and the intensity is expressed as $I(\mu_x, \mu_y) = [I_1, \ldots I_6]$. The Fisher information matrix is calculated as expressed in Eqn. (16):

$$FI = \sum_{i=1}^{6} \left(\frac{1}{I_i + b_i}\right) \begin{bmatrix} \left(\frac{\partial I_i}{\partial \mu_x}\right)^2 & \left(\frac{\partial I_i}{\partial \mu_x}\right)\left(\frac{\partial I_i}{\partial \mu_y}\right) \\ \left(\frac{\partial I_i}{\partial \mu_x}\right)\left(\frac{\partial I_i}{\partial \mu_y}\right) & \left(\frac{\partial I_i}{\partial \mu_y}\right)^2 \end{bmatrix} \quad \text{Eqn. (16)}$$

where $b_1, \ldots, b_6$ in Eqn. (16) denote the total background photons within each spot. The CRLB is expressed as the inverse of the FI matrix:

$$CRLB = FI^{-1} = \begin{bmatrix} CRLB_{\mu_x} & \sim \\ \sim & CRLB_{\mu_y} \end{bmatrix} \quad \text{Eqn. (17)}$$

Since the distributions of $CRLB_{\mu_x}$ and $CRLB_{\mu_y}$ are symmetric due to the circular symmetry of the optical system, $CRLB_{\mu_x}$ is sufficient for evaluating the precision of the tri-spot PSF in one aspect. Several different phase mask designs, the corresponding PSFs when the molecular orientation is $\mu_x = \mu_y = \sqrt{2}$, and the corresponding $CRLB_{\mu_x}$ with 20,000 photons to 20 photon/pixel SBR are shown in FIGS. 6A-6L.

In one aspect, the mask design illustrated in FIG. 6A is based on the back focal plane intensity distribution before polarization separation shown in FIG. 4A. As illustrated in FIG. 4A, the back focal plane intensity distribution has a donut shape. The central hole of the donut shifts outward as θ increases and rotates as Φ changes (θ and Φ can be converted to x and y using Eqn. (3). Therefore, by separating light within the inner circle from light in the outer ring of the back focal plane, more precise measurements of θ are predicted. The $CRLB_{\mu_x}$ results in FIG. 6C show that this partition design can achieve high precision for $\mu_x$ estimation. The CRLB is lower than $4.6 \times 10^{-4}$, which implies that the standard deviation of the estimator could be as low as 0.02 for all molecular orientations under this SBR.

However, since the back focal plane intensity distribution after separating polarizations becomes vertical stripes in the x channel (and horizontal stripes in the y channel, see FIG. 4B), the ring-shape partition design is less effective for sensing changes in molecular orientation using a polarization-sensitive imaging system. Different vertical stripe patterns were tested as shown in FIG. 6D, FIG. 6G, and FIG. 6J. The vertical stripe pattern shown in FIG. 6G had the smallest CRLB, indicating that this mask design provided the best precision among the masks with vertical partitions.

Figures 7A, 7B, 7C, 7D:
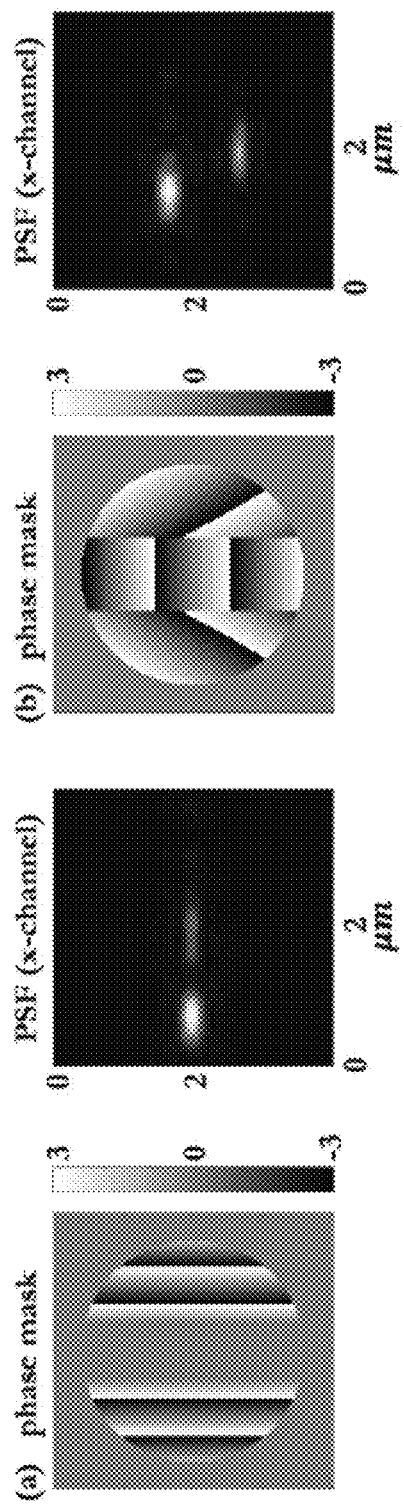
FIG. 7A is an image showing a phase distribution of a trisected phase mask with phase ramps aligned along a straight line.
FIG. 7B is an image showing a PSF from a fixed dipole emitter obtained using the phase mask illustrated in FIG. 7A.
FIG. 7C is an image showing a phase distribution of a trisected phase mask with phase ramps aligned non-linearly.
FIG. 7D is an image showing a PSF from a fixed dipole emitter obtained using the phase mask illustrated in FIG. 7C.

In one aspect, the design of each phase ramp within each partition is determined after selecting a partition pattern. In another aspect the direction of the phase ramp within each partition influences the location of each spot on the imaging plane, and the slope of each phase ramp influences how far each spot is pushed away from the center of the tri-spot PSF. As illustrated in FIGS. 7A-7D, for certain molecular orientations, aligning the three spots of the tri-spot PSF along a straight line can potentially cause localization contusion when only two adjacent spots are bright enough to be detected, because uncertainty exists as to which particular spot is missing from the tri-spot PSF, as illustrated in FIG. 7B. Arranging three spots in a triangular shape ameliorates this potential uncertainty.

However, the mask illustrated in FIG. 7C produces a PSF that has the same intensity distribution for certain molecular orientations, for example, when $\mu_z=0$. The PSF corresponding to molecular orientations $[\mu_x, \pm\mu_y]$ (or $[\pm\mu_x, \mu_y]$) are very similar to each other as shown in FIGS. 8A, 8B, and 8C.

In an aspect, analysis of the back focal plane intensity distribution sheds some light on this phenomenon. According to Eqns. (6) and (7), the intensity distribution at back focal plane for an in-focus single-molecule emitter is calculated as:

$$I_{bfp,x(y)} = A^2 \begin{bmatrix} BFP_{XX,x(y)} \\ BFP_{YY,x(y)} \\ BFP_{ZZ,x(y)} \\ BFP_{XY,x(y)} \\ BFP_{XZ,x(y)} \\ BFP_{YZ,x(y)} \end{bmatrix} M \qquad \text{Eqn. (18)}$$

Figures 9A, 9B:
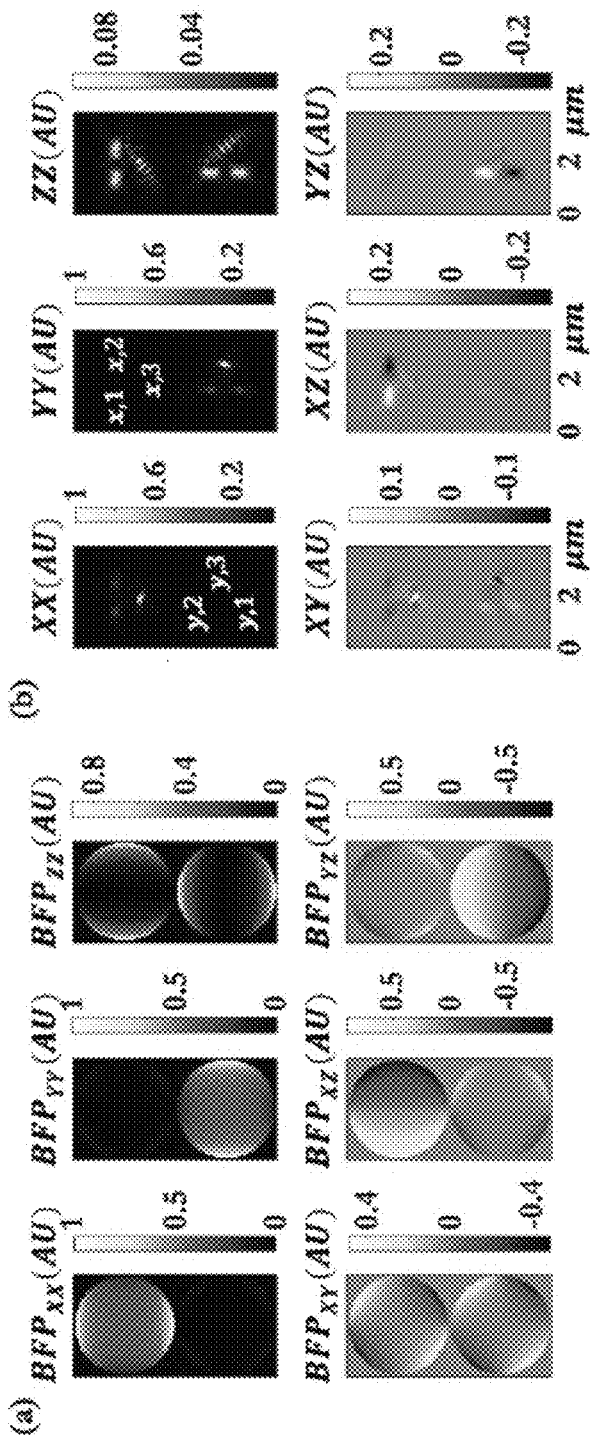
FIG. 9A is an image showing a series of backplane basis images of a single molecule emitter.
FIG. 9B is an image showing a series of image plane basis images of a single molecule emitter after adding the phase mask shown in FIG. 8D.

As expressed in Eqn. (6), the back focal plane intensity distribution is a linear combination of 6 basis back focal plane images. By way of non-limiting example, FIG. 9A illustrates six basis back focal plane images. FIG. 31 is another schematic illustration demonstrating the relationship between the molecular orientation and the image plane images. If the phase mask shown in FIG. 7C is used to produce the tri-spot PSF, the $BFP_{XY}$ basis would have zero total intensity within each partition due to the symmetric distribution of the phase ramps, and the resulting image basis XY would contribute zero total photons to each spot region in the PSF image. As a consequence, the mask shown in FIG. 7C has no sensitivity to measure the $\mu_x\mu_y$ term, so the orientation pair $[\mu_x, \pm\mu_y]$ (or $[\pm\mu_x, \mu_y]$) is not distinguishable using the relative intensity of each spot in the tri-spot PSF produced by this phase mask.

Figure 31A:
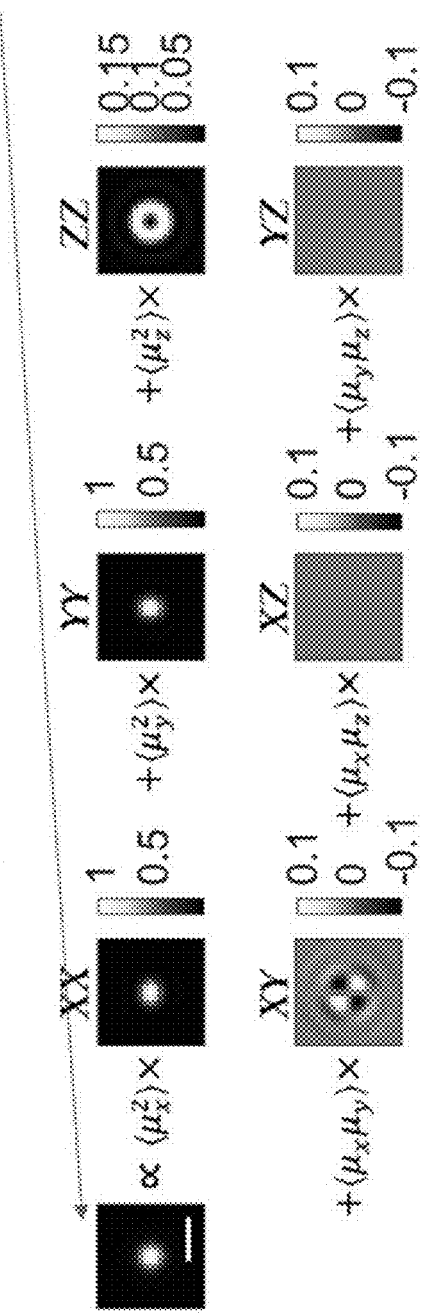
Figure 31B:
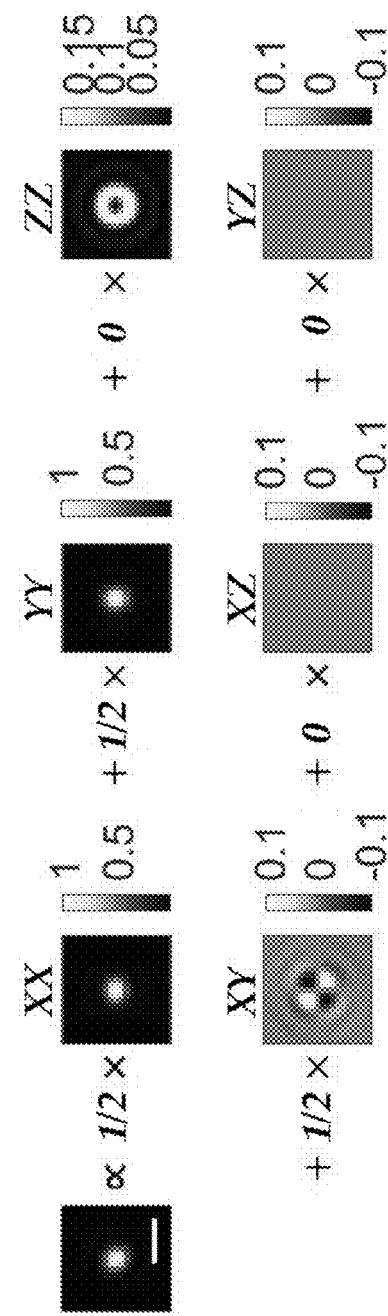
Figure 31C:
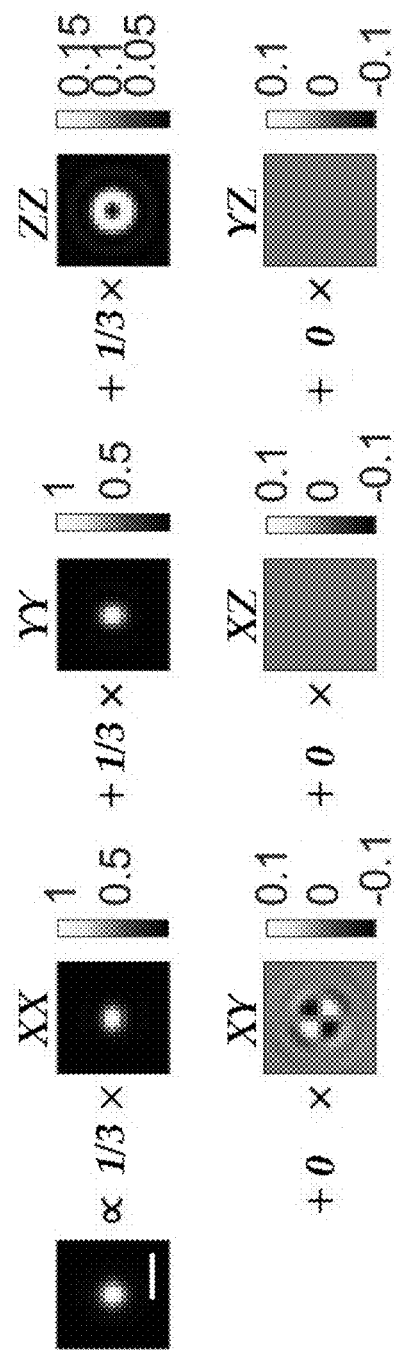

FIG. 31A-31C schematically illustrate the effects of the dipole emitter's rotational mobility and orientation on the focal plane basis images without the tri-spot PSF for a general case (FIG. 31A), for a fixed emitter in x-y plane oriented 45 deg. from the x-axis (FIG. 31B), and for an isotropic emitter (FIG. 31C). The strong similarity of these images emphasizes the need for the tri-spot PSF in order to create an imaging system that is more sensitive to molecular orientation.

Figure 10A:
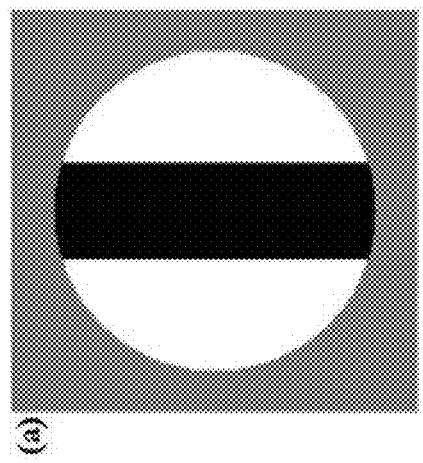
FIG. 10A is an image schematically illustrating a phase mask that includes a vertical stripe partition configured to push light within the black region downward, and to divert light within the white region to the sides.
Figure 10B:
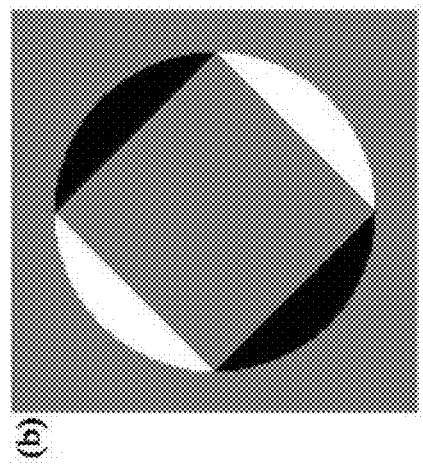
FIG. 10B is an image schematically illustrating a phase mask that includes a partition configured to push light within 4 corners of the back focal plane downward (black) or to the side (white)
Figure 10C:
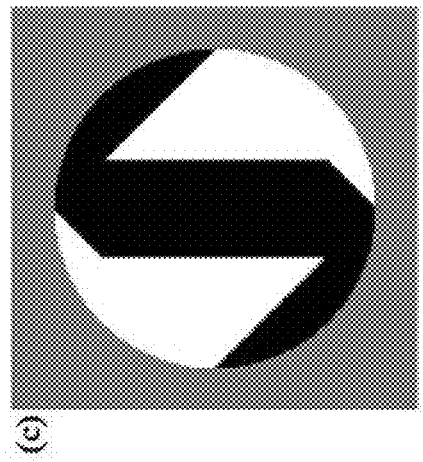
FIG. 10C is an image schematically illustrating a phase mask that includes a partition that combines the partitions illustrated in FIG. 10A and FIG. 10B.

In one aspect, the partition shapes of two or more phase mask designs are combined to produce a phase mask design with enhanced sensitivity that enables the capabilities of both designs. By way of non-limiting example, to enhance the sensitivity of the phase mask shown in FIG. 7C for detecting the energy concentrated at the corners of the $BFP_{XY}$ basis, the phase mask partition shapes illustrated in FIG. 10A (corresponding to the mask shown in FIG. 7C) and the partition shape shown in FIG. 10B, which is configured to direct energy at the corners of the $BFP_{XY}$ basis are combined to enhance the $\mu_x\mu_y$ sensitivity of the mask shown in FIG. 7C. The partition shapes are combined by adding the black region of FIG. 10B to the black region of FIG. 10A, and the white region of FIG. 10B to the white region of FIG. 10A to get a final partition configuration shown in FIG. 10C. The resulting phase mask, illustrated in FIG. 8D, produces a PSF that is sensitive to the $\mu_x\mu_y$ term, and the orientation pair $[\mu_x, \pm\mu_y]$ (or $[\pm\mu_x, \mu_y]$) is now distinguishable as shown in FIGS. 8E and 8F The basis images of the mask shown in FIG. 8D are shown in FIG. 9B.

V. Methods for Estimating Orientation of Single-Molecule Emitters

In various aspects, the orientation of the single-molecule emitters is determined by a method of analyzing the relative intensity and spatial separation of the three spots of tri-spot PSF. Non-limiting examples of suitable methods include a basis inversion method and a maximum likelihood estimator, described in detail below.

a) Basis Inversion Method

In the basis inversion method, the total photons within each spot of the tri-spot PSF are represented as a vector $I_{spot}=[I_{x1}, I_{x2}, I_{x3}, I_{y1}, I_{y2}, I_{y3}]^T$. The spots x1, ..., y3 are defined as shown in FIG. 9B. The total photons within each spot of the six basis images are also defined as vectors. For example, the XX basis has a spot vector $XX_{spot}=[XX_{x1}, \ldots, XX_{y3}]^T$. Eqn. (14) may be written as:

$$I_{spot} = I_0 \begin{bmatrix} XX_{x1} & YY_{x1} & ZZ_{x1} & XY_{x1} & XZ_{x1} & YZ_{x1} \\ XX_{x2} & YY_{x2} & ZZ_{x2} & XY_{x2} & XZ_{x2} & YZ_{x2} \\ XX_{x3} & YY_{x3} & ZZ_{x3} & XY_{x3} & XZ_{x3} & YZ_{x3} \\ XX_{y1} & YY_{y1} & ZZ_{y1} & XY_{y1} & XZ_{y1} & YZ_{y1} \\ XX_{y2} & YY_{y2} & ZZ_{y2} & XY_{y2} & XZ_{y2} & YZ_{y2} \\ XX_{y3} & YY_{y3} & ZZ_{y3} & XY_{y3} & XZ_{y3} & YZ_{y3} \end{bmatrix} M = I_0 B_{spot} M \qquad \text{Eqn. (19)}$$

$B_{spot}$ is a six-by-six matrix characterizing the response of the imaging system(i.e., its PSP). For the mask illustrated in FIG. 8D:

$$B_{spot} = \begin{bmatrix} 0.21 & 0.01 & 0.11 & -0.04 & 0.24 & -0.02 \\ 0.24 & 0.01 & 0.12 & -0.03 & -0.24 & 0.03 \\ 0.52 & 0.01 & 0.10 & 0.06 & 0.00 & 0.00 \\ 0.01 & 0.21 & 0.11 & 0.04 & -0.02 & -0.24 \\ 0.01 & 0.24 & 0.12 & 0.03 & 0.03 & 0.24 \\ 0.01 & 0.52 & 0.10 & -0.06 & 0.00 & 0.00 \end{bmatrix} (AU)$$

The columns of $B_{spot}$ are normalized by the total intensity of the brightest basis images, $XX_x$ and $YY_y$. Each column of $B_{spot}$ is linearly independent, which indicates a one-to-one correspondence of the image intensity distribution $I_{spot}$ with the second moments of molecular orientation M.

In one aspect, the procedure to count the total photons from an experimental image or the basis images includes upsampling the raw image by 10 times using the Matlab function "kron". An example of 2 times upsampling is illustrated as Eqn. (20):

$$\begin{bmatrix} 1 & 2 \\ 3 & 4 \end{bmatrix} \Rightarrow \begin{bmatrix} 1 & 1 & 2 & 2 \\ 1 & 1 & 2 & 2 \\ 3 & 3 & 4 & 4 \\ 3 & 3 & 4 & 4 \end{bmatrix} \qquad \text{Eqn. (20)}$$

Figure 11B:
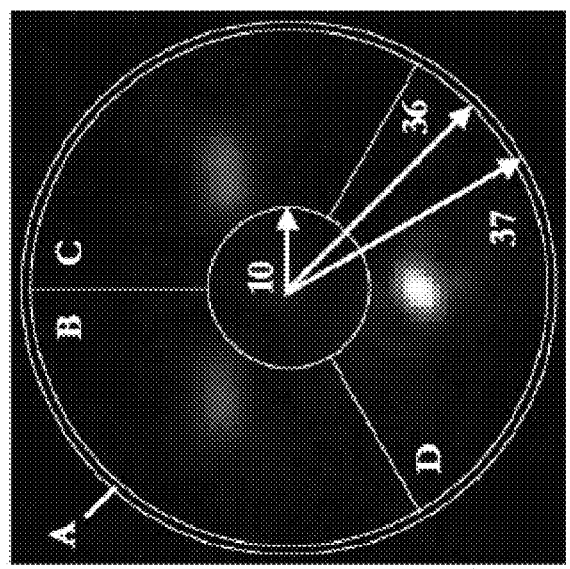
FIG. 11B is an image illustrating a scheme for image partitioning for signal and background photon counting used for experimental images.
Figure 11A:
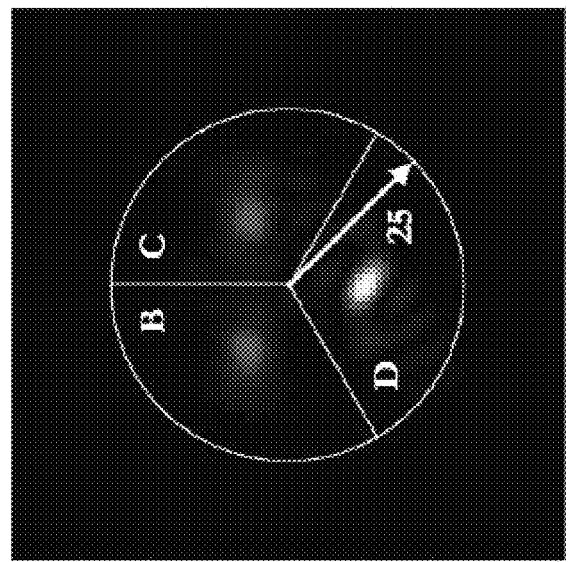
FIG. 11A is an image illustrating a scheme for image partitioning for signal and background photon counting (unit: pixel before upsampling) used for basis and simulation images.

The partitioning of the image used in this method is illustrated in FIG. 11A and FIG. 11B for basis and experimental images, respectively. As illustrated in FIG. 11B, a $0^{th}$ order bright spot in the center of the tri-spot PSF is exhibited in experimental data resulting from optical "leakage" likely due to non-idealities in phase modulation by the SLM of the disclosed imaging system. To compensate for this artifact, the phase ramps within the tri-spot PSF mask are configured to push the spots relatively far away from the center, as illustrated in FIGS. 8D-8F for experimental images. This spacing allows the image analysis algorithm to separate this 0th order spot artifact from the rest of the tri-spot PSF by excluding pixels within a 10-pixel radius circle. The average photon/pixel value within region A of FIG. 11B is used as the background for this channel, denoted as $b_{x(y),1}, \ldots, {}_3$, and subtracted from the image. In one aspect, this step is not required for basis and simulation images, which do not include this artifact. After subtracting background, the photon within regions B, C, and D are counted to determine the signal for this channel, denoted $s_{x(y),1}, \ldots, {}_3$.

Since Eqn. (19) already provides a relation between the image intensity distribution and the second moments of molecular orientation, the basis matrix is inverted to calculate the second moments of molecular orientation as $M = B_{spot}^{-1} s_{spot}/I_0$, where $s_{spot} = [s_{x1}, \ldots, s_{y3}]^T$ and $I_0$ is a scaling factor as defined in Eqn. (12).

b) Maximum Likelihood Estimator

In another aspect, a maximum likelihood estimator may be used to determine the orientation of the emitter from the tri-spot PSF image. This estimator is based on a simplified forward model with fewer parameters to describe the molecular orientation and rotational mobility.

This simplified forward model represents a mobile dipole as a vector $\mu_\tau = [\mu_{x,\tau}, \mu_{y,\tau}, \mu_{z,\tau}]^T = [\sin\theta_\tau(\tau)\cos\phi_\tau(\tau), \sin\theta_\tau(\tau)\sin\phi_\tau(\tau), \cos\theta_\tau(\tau)]^T$ that rotates around a certain mean orientation $\mu = [\mu_x, \mu_y, \mu_z]^T = [\sin\theta\cos\phi, \sin\theta\sin\phi, \cos\theta]^T$ over time $\tau$. This rotation is assumed to be much faster than the acquisition time t of one camera frame, which implies ergodicity. An orientation distribution probability density function $P_{\theta_\tau,\phi_\tau}(\theta_\tau, \phi_\tau)$ is defined such that the temporal average of $\mu_\tau$ is equal to the spatial orientation average with this distribution. The distribution is assumed to be symmetric around the mean orientation $\mu$. The second moment of the molecular orientation can be calculated as:

$$\langle \mu_{i,\tau}\mu_{j,\tau}\rangle = \int_0^{2\pi}\int_0^{\pi/2} \mu_{i,\tau}(\theta_\tau, \phi_\tau)\mu_{j,\tau}(\theta_\tau, \phi_\tau)P_{\theta_\tau,\phi_\tau}(\theta_\tau, \phi_\tau)\sin\theta_\tau d\theta_\tau d\phi_\tau \quad \text{Eqn. (21)}$$

where i, j=x, y, z.

To evaluate this integration, the mean orientation is rotated as shown in FIGS. 12A and 12B. As shown in FIG. 12A, a rotation about the z axis by an angle $-\phi$ followed by a rotation about the y axis by an angle $-\theta$ is performed. After these rotations, the mean orientation lies along the z axis. The relation between the dipole orientation before the rotation $\mu'_\tau$ and after the rotation $\mu_\tau$ is:

$$\mu_\tau = R\mu'_\tau = \begin{bmatrix} \cos\phi & -\sin\phi & 0 \\ \sin\phi & \cos\phi & 0 \\ 0 & 0 & 1 \end{bmatrix}\begin{bmatrix} \cos\theta & 0 & \sin\theta \\ 0 & 1 & 0 \\ -\sin\theta & 0 & \cos\theta \end{bmatrix}\mu'_\tau \quad \text{Eqn. (22)}$$

$$= \begin{bmatrix} \cos\theta\cos\phi & -\sin\phi & \sin\theta\cos\phi \\ \cos\theta\sin\phi & \cos\phi & \sin\theta\sin\phi \\ -\sin\theta & 0 & \cos\theta \end{bmatrix}\mu'_\tau$$

The matrix that includes all second moments is written as:

$$M_{reshape} = \langle \mu_\tau \mu_\tau^T\rangle = \begin{bmatrix} \langle\mu_{x,\tau}^2\rangle & \langle\mu_{x,\tau}\mu_{y,\tau}\rangle & \langle\mu_{x,\tau}\mu_{z,\tau}\rangle \\ \langle\mu_{x,\tau}\mu_{y,\tau}\rangle & \langle\mu_{y,\tau}^2\rangle & \langle\mu_{y,\tau}\mu_{z,\tau}\rangle \\ \langle\mu_{x,\tau}\mu_{z,\tau}\rangle & \langle\mu_{y,\tau}\mu_{z,\tau}\rangle & \langle\mu_{z,\tau}^2\rangle \end{bmatrix} = R\langle\mu'_\tau\mu'^T_\tau\rangle R^T \quad \text{Eqn. (23)}$$

Since the mean orientation is rotated to $\mu'$, which is along z axis, and it was already assumed that the distribution of $\mu'_\tau$ is symmetric around $\mu'$, the integration results are written as:

$$\langle\mu'_{x,\tau}\mu'_{y,\tau}\rangle = \langle\mu'_{x,\tau}\mu'_{z,\tau}\rangle = \langle\mu'_{y,\tau}\mu'_{z,\tau}\rangle = 0$$

$$\langle\mu'^2_{x,\tau}\rangle = \langle\mu'^2_{y,\tau}\rangle = \lambda \quad \text{Eqn. (24)}$$

The second moments of the molecular orientation for this symmetric distribution model are calculated as:

$$M_{reshape} = R\begin{bmatrix} \lambda & 0 & 0 \\ 0 & \lambda & 0 \\ 0 & 0 & 1-2\lambda \end{bmatrix}R^T \quad \text{Eqn. (25)}$$

The calculated matrix multiplication results in the expression:

$$\langle\mu_{x,\tau}^2\rangle = \gamma\mu_x^2 + (1-\gamma)/3 \quad \langle\mu_{x,\tau}\mu_{y,\tau}\rangle = \gamma\mu_x\mu_y$$

$$\langle\mu_{y,\tau}^2\rangle = \gamma\mu_y^2 + (1-\gamma)/3 \quad \langle\mu_{x,\tau}\mu_{z,\tau}\rangle = \gamma\mu_x\mu_z$$

$$\langle\mu_{z,\tau}^2\rangle = \gamma\mu_z^2 + (1-\gamma)/3 \quad \langle\mu_{y,\tau}\mu_{z,\tau}\rangle = \gamma\mu_y\mu_z \quad \text{Eqn. (26)}$$

where $\gamma = 1-3\lambda$ in Eqn. (26) denotes the rotational mobility of the molecule. The molecule's rotational mobility varies from 0 to 1. A completely fixed molecule will have $\gamma=1$, and an isotropic dipole emitter (freely rotating) will have $\gamma=0$. The maximum likelihood estimator is based on the above model, in which the molecular orientation and rotational mobility are described by three parameters, $\mu_x$, $\mu_y$, and $\gamma$.

Figures 13A, 13B, 13C:
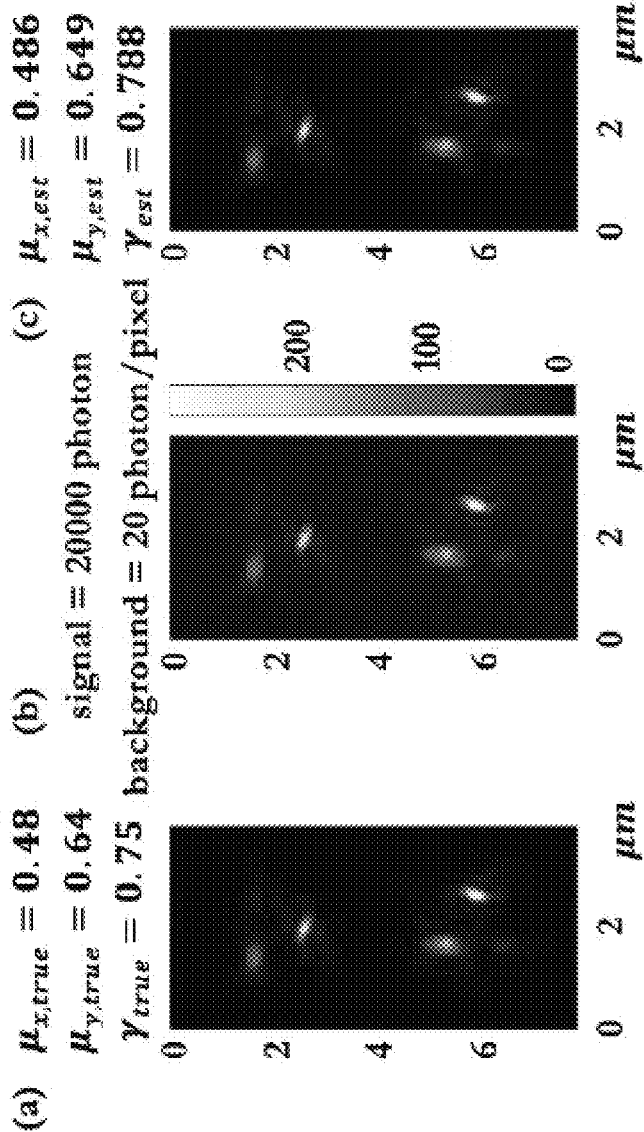
FIG. 13A is a ground truth image without noise of a tri-spot PSF obtained from a single-molecule emitter used to assess a maximum likelihood estimator for tri-spot PSF images.
FIG. 13B is an image of the tri-spot PSF obtained by applying Poisson noise to the ground truth image shown in FIG. 13A (signal=20,000 photons, background=20 photon/pixel)
FIG. 13C is a reconstructed image of the tri-spot ground truth image recovered from the noisy image shown in FIG. 13B using a maximum likelihood estimator.
Figures 14A, 14B, 14C:
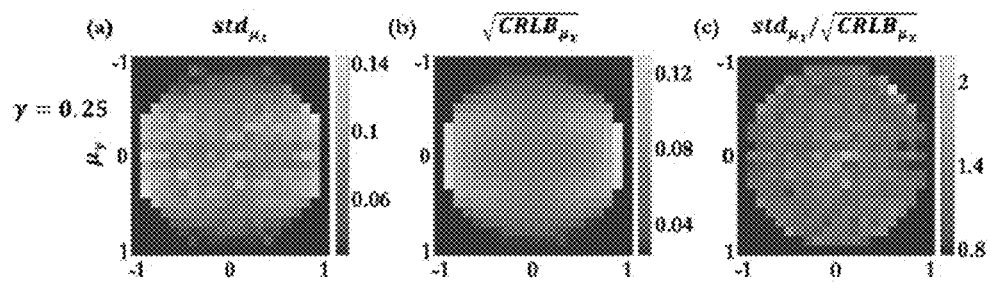
FIG. 14A is an image showing a 2D map of the standard deviation of 100 $\mu_x$ estimates for an emitter with a $\gamma=0.25$.
FIG. 14B is an image showing a 2D map of the square root of CRLB for estimating $\mu_x$, for an emitter with a $\gamma=0.25$, representing a theoretical lower bound of estimation precision.
FIG. 14C is an image showing a 2D map of simulated estimation precision for estimating $\mu_x$, for an emitter with a $\gamma=0.25$, compared to a theoretical precision limit.
Figures 14D, 14E, 14F:
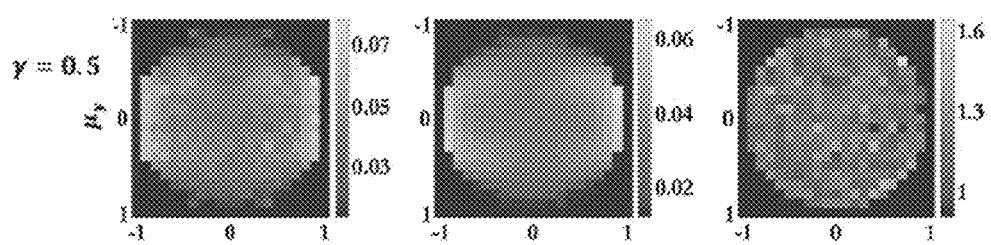
FIG. 14D is an image showing a 2D map of the standard deviation of 100 $\mu_x$ estimates for an emitter with a $\gamma=0.5$.
FIG. 14E is an image showing a 2D map of the square root of CRLB for estimating $\mu_x$, for an emitter with a $\gamma=0.5$.
FIG. 14F is an image showing a 2D map of simulated estimation precision for estimating $\mu_x$, for an emitter with a $\gamma=0.5$, compared to a theoretical precision limit.
Figures 14G, 14H, 14I:
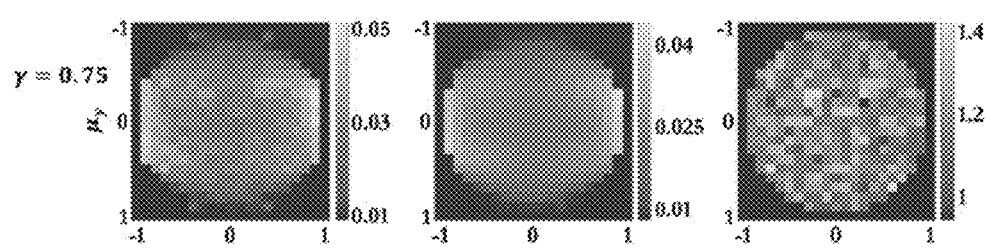
FIG. 14G is an image showing a 2D map of the standard deviation of 100 $\mu_x$ estimates for an emitter with a $\gamma=0.75$.
FIG. 14H is an image showing a 2D map of the square root of CRLB for estimating p for an emitter with a $\gamma=0.5$.
FIG. 14I is an image showing a 2D map of simulated estimation precision for estimating $\mu_x$, for an emitter with a $\gamma=0.75$, compared to a theoretical precision limit.
Figures 14J, 14K, 14L:
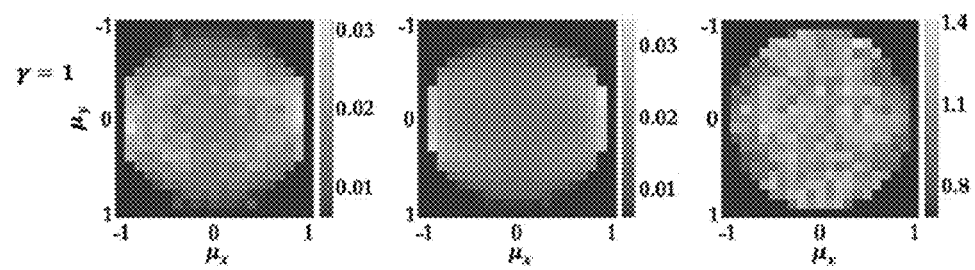
FIG. 14J is an image showing a 2D map of the standard deviation of 100 $\mu_x$ estimates for an emitter with a $\gamma=1$.
FIG. 14K is an image showing a 2D map of the square root of CRLB for estimating $\mu_x$, for an emitter with a $\gamma=1$.
FIG. 14L is an image showing a 2D map of simulated estimation precision for estimating $\mu_x$, for an emitter with a $\gamma=1$, compared to a theoretical precision limit.
Figures 15A, 15B, 15C:
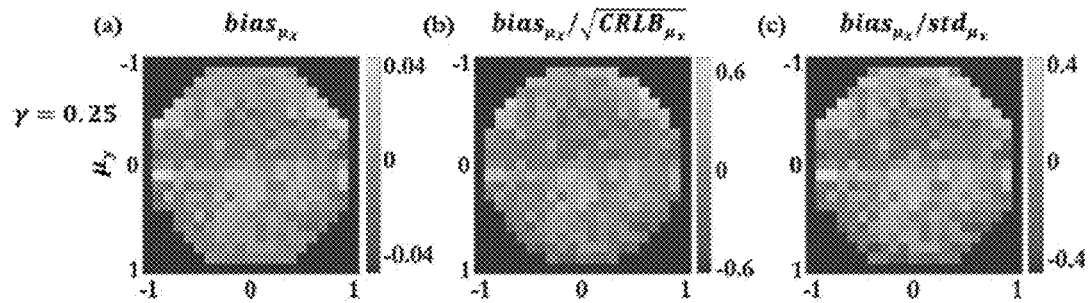
FIG. 15A is an image showing a 2D map of the average estimation bias over 100 $\mu_x$ estimates for an emitter with a $\gamma=0.25$.
FIG. 15B is an image showing a 2D map of the average estimation bias compared to the square root of CRLB for an emitter with a $\gamma=0.25$.
FIG. 15C is an image showing a 2D map of average estimation bias compared to standard deviation for 100 $\mu_x$ estimates for an emitter with a $\gamma=0.25$.
Figures 15D, 15E, 15F:
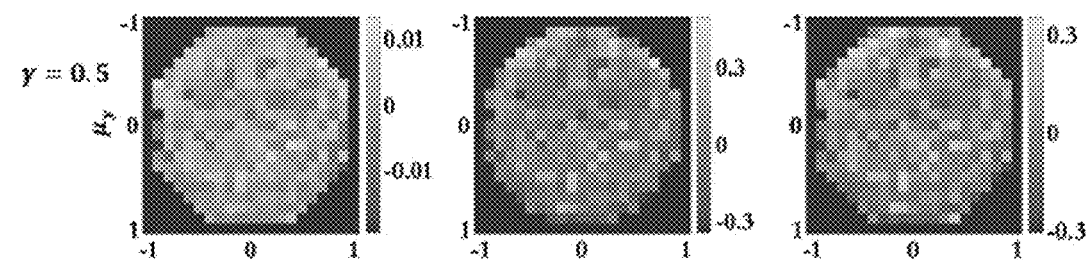
FIG. 15D is an image showing a 2D map of the average estimation bias of 100 $\mu_x$ estimates for an emitter with a $\gamma=0.5$.
FIG. 15E is an image showing the average estimation bias compared to the square root of CRLB for an emitter with a $\gamma=0.5$.
FIG. 15F is an image showing a 2D map of average estimation bias compared to standard deviation for an emitter with a $\gamma=0.5$.
Figures 15G, 15H, 15I:
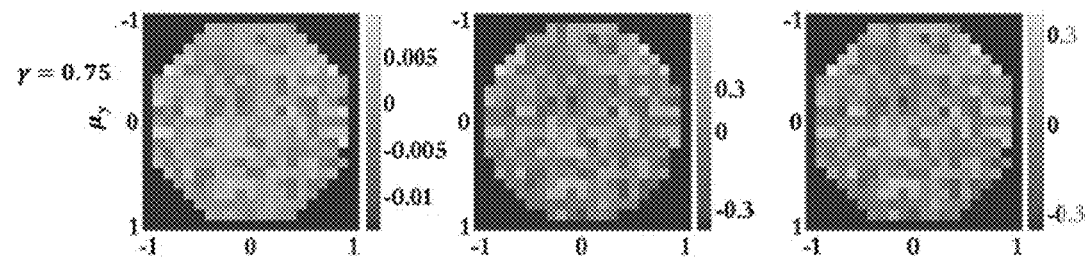
FIG. 15G is an image showing a 2D map of the average estimation bias of 100 $\mu_x$ estimates for an emitter with a $\gamma=0.75$.
FIG. 15H is an image showing a 2D map of the average estimation bias compared to the square root of CRLB for an emitter with a $\gamma=0.5$.
FIG. 15I is an image showing a 2D map of average estimation bias compared to standard deviation for an emitter with a $\gamma=0.75$.
Figures 15J, 15K, 15L:
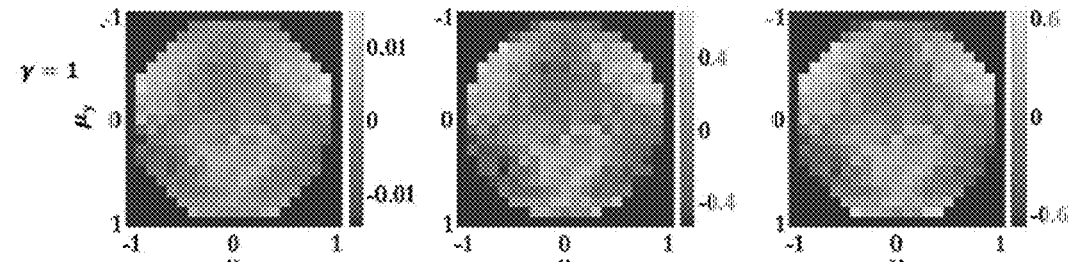
FIG. 15J is an image showing a 2D map of the average estimation bias of 100 $\mu_x$ estimates for an emitter with a $\gamma=1$.
FIG. 15K is an image showing the average estimation bias compared to the square root of CRLB for an emitter with a $\gamma=1$.
FIG. 15L is an image showing a 2D map of average estimation bias compared to standard deviation for an emitter with a $\gamma=1$.

Simulated images with added photon shot noise were generated in Matlab as shown in FIG. 13B. The total number of signal photons and total number of background photons within each spot region are denoted as $s_{spot} = [s_{x1}, \ldots, s_{y3}]^T$ and $b_{spot} = [b_{x1}, \ldots, b_{y3}]^T$. Since the second moments matrix of molecular orientation M can be parameterized by $\mu_x$, $\mu_y$ and $\gamma$, the image intensity distribution can be written as $I_{spot}(I_0, \mu_x, \mu_y, \gamma) = I_0 B_{spot} M(\mu_x, \mu_y, \gamma)$. Since photon detection is a Poisson process, the likelihood function may be written:

$$l(I_0, \mu_x, \mu_y, \gamma) = \prod_{j=x,y}\prod_{i=1}^{3} \frac{(I_{ji}+b_{ji})^{(s_{ji}+b_{ji})}e^{-(I_{ji}+b_{ji})}}{(s_{ji}+b_{ji})!} \quad \text{Eqn. (27)}$$

The log likelihood function is therefore given by:

$$\Lambda(I_0, \mu_x, \mu_y, \gamma) \propto \sum_{j=x,y}\sum_{i=1}^{3}(s_{ji}+b_{ji})\ln(I_{ji}+b_{ji}) - (I_{ji}+b_{ji}) \quad \text{Eqn. (28)}$$

After using MATLAB function fmincon to maximize $\Lambda(I_0, \mu_x, \mu_y, \gamma)$, the estimation result $\mu_x$, $\mu_y$ and $\gamma$ was obtained. One example is shown in FIG. 13A-13C. FIG. 13A shows the ground truth images of a molecule at a particular orientation, and FIG. 13C is generated using the estimated orientation parameters from the noise perturbed image in FIG. 13B. The simulated noisy image agreed well with the image generated from the estimated orientation parameters.

To evaluate the estimator performance, simulation images were generated with 20,000 signal photons and 20 background photons/pixel. The mean orientation domain was chosen to be $\mu_x \times \mu_y = [-1:0.1:1] \times [-1:0.1:1]$ and $\mu_x^2 + \mu_y^2 < 1$ (CRLB (described above) is not defined at $\mu_x = 1$ or $\mu_y = 1$) and $\gamma = \{0:0.25:1\}$. 100 images were generated for each $(\mu_x, \mu_y, \gamma)$ combination. Other simulation parameters were chosen to represent an experimental setup described below.

The precision of the estimator for all mean orientations was calculated as shown in FIGS. 14A-14F. The pattern of the standard deviation 2D map in FIGS. 14A, 14D, 14G, and 14J is very similar to the $\sqrt{CRLB_{\mu_x}}$ pattern in FIGS. 14B, 14E, 14H, and 14K. The value of the standard deviation for most orientations is within $1.5 \sqrt{CRLB_{\mu_x}}$, thereby demonstrating that the maximum likelihood estimator had nearly ideal performance relative to the theoretical limit. The standard deviation of 100 estimations was defined as estimation precision $std_{\mu_x} = std(\mu_{x,est})$, and the difference between the mean of 100 estimations and the ground truth was defined as estimation accuracy $bias_{\mu_x} = mean(\mu_{x,est}) - \mu_{x,true}$. The average $std_{\mu_x}/\sqrt{CRLB_{\mu_x}}$ among all orientations was 1.14 for $\gamma = \{0.25, 0.5, 0.75\}$ and 1.08 for $\gamma = 1$. The $std_{\mu_x}/\sqrt{CRLB_{\mu_x}}$ distribution pattern is more uniform for $\gamma = \{0.5, 0.75\}$ (standard deviation less than 0.1), while there were certain orientations with worse than average performance observed for $\gamma = \{0.25, 1\}$.

The accuracy evaluation results are shown in FIGS. 15A-15F. The absolute value of the bias (average of 100 estimations minus ground truth) is fairly small as shown in FIGS. 15A, 15D, 15G, and 15J. However, since 100 measurements were performed for each orientation, the standard error of the estimation result should be:

$$std(bias_{\mu_x}) = \frac{1}{\sqrt{100}} \sqrt{CRLB_{\mu_x}} \qquad \text{Eqn. (28)}$$

The measured quantity $bias_{\mu_x}/\sqrt{CRLB_{\mu_x}}$ should be largely confined to values within $\pm 3 std(bias_{\mu_x})/\sqrt{CRLB_{\mu_x}} = 0.3$. A subset of orientations that had biases larger than expected for $\gamma = \{0.25, 1\}$ was observed, as shown in FIGS. 15B, 15E, 15H, and 15K. Even if $bias_{\mu_x}/std_{\mu_x}$ were calculated as shown in FIGS. 15C, 15F, 15I, and 15L, a bias pattern persists in the 2D maps. Since this bias is invariant over multiple measurements at a fixed SBR, the bias of the estimator may be corrected by using the maps of FIGS. 15A-15L as tuning maps.

The above results demonstrated that the maximum likelihood estimator estimated the mean orientation more accurately and precisely at intermediate values of $\gamma$ prior to tuning. In one aspect, tuning and bias correction of the maximum likelihood estimator are performed to produce an unbiased estimator.

Figure 16:
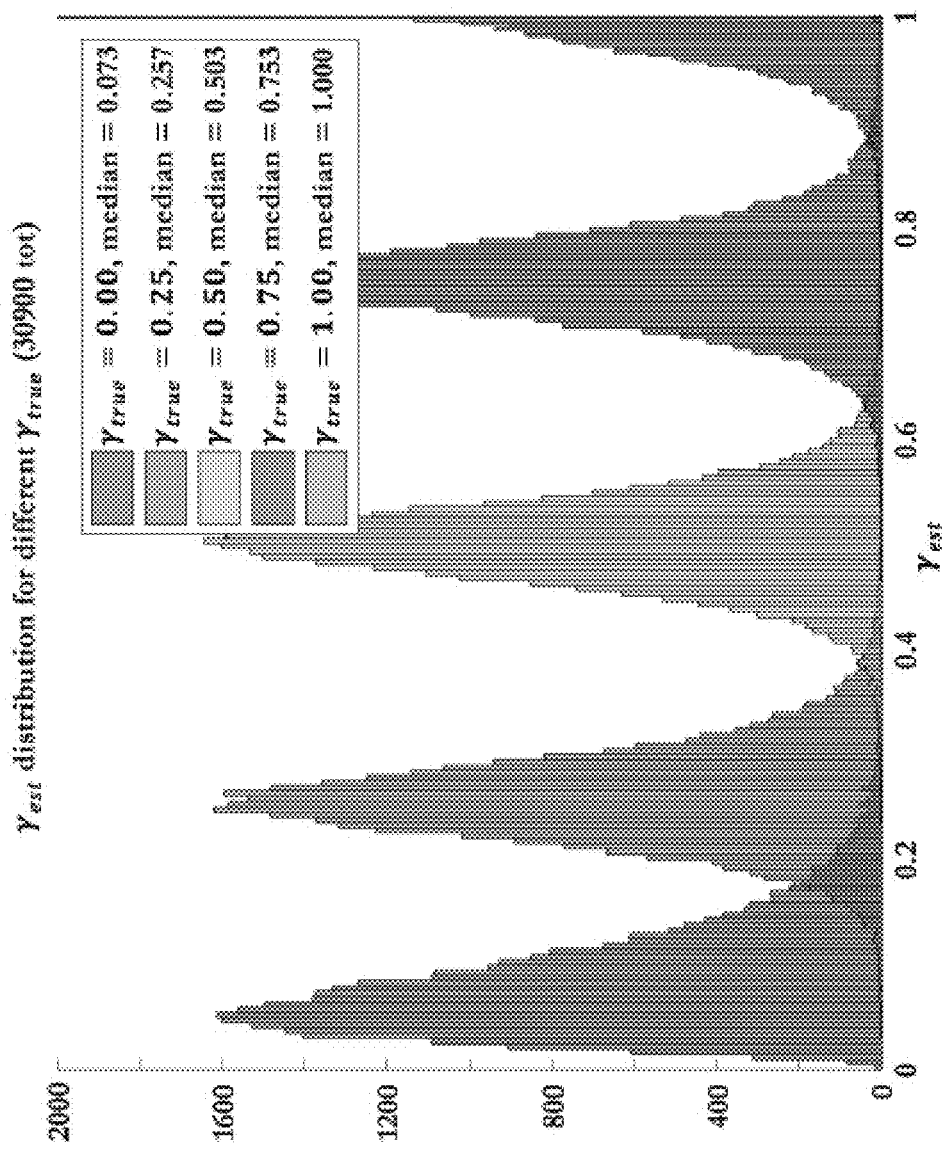
FIG. 16 is a graph showing the distribution of $\gamma$ values estimated using the maximum likelihood for a range of $\gamma_{true}$ values.

To evaluate and refine the estimation of rotational mobility using the maximum likelihood estimator, histograms of the estimated $\gamma_{est}$ for several ground truth values $\gamma_{true}$ were produced as shown in FIG. 16. The distribution of $\gamma_{est}$ was observed to be biased at $\gamma_{true} = 0$. Because $\gamma_{est}$ was constrained by the estimator to fall within the range $\gamma_{est} \in [0, 1]$, distribution of the estimates was Gaussian. As a result, the difference between the ground truth and the median $\gamma_{est}$ was used to define as the bias in $\gamma_{est}$ of the estimator instead of using the mean $\gamma_{est}$.

To characterize the relation between $bias_\gamma = mean(\gamma_{est}) - \gamma_{true}$ and the signal-to-background ratio, simulated images of emitters at various SBRs were evaluated as shown in FIGS. 17A-17I. The exponential curve $bias_\gamma = C_1 \exp(C_2 \gamma_{true})$ was determined to provide a good fit to the data for various SBRs.

Figures 18A, 18B:
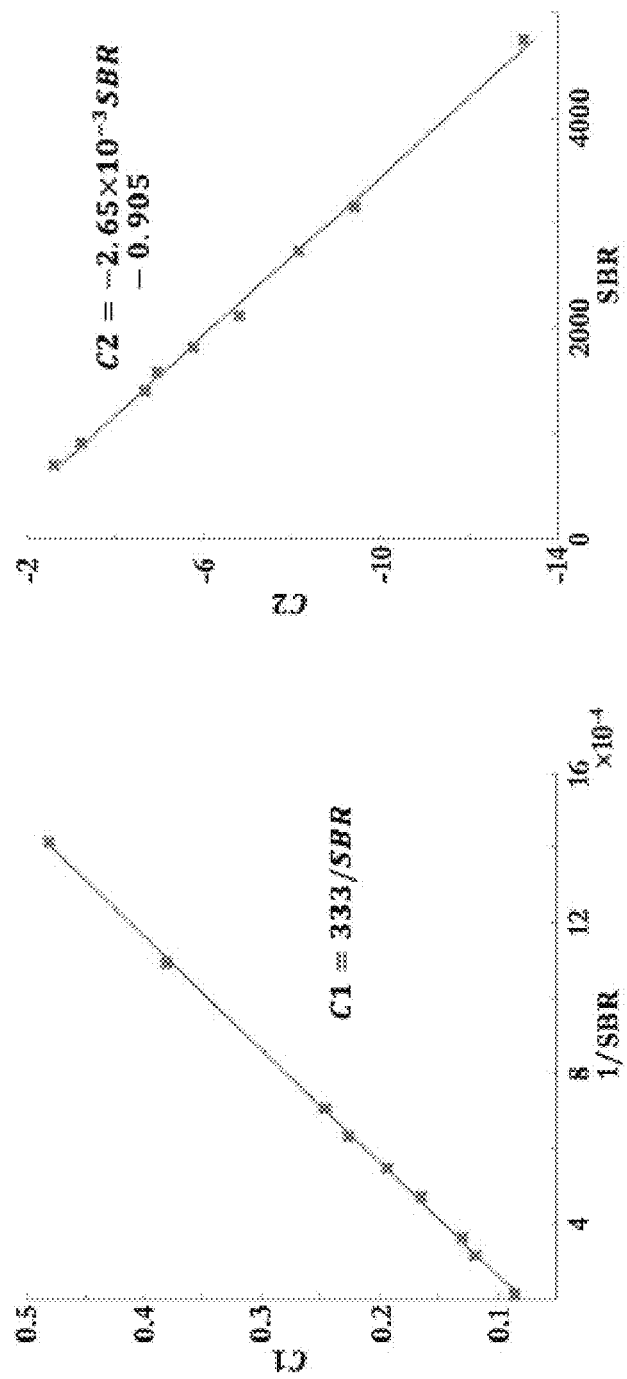
FIG. 18A is a graph showing an exponential fit of a parameter C1 of a $\gamma$ estimator as a function of 1/SBR.
FIG. 18B is a graph showing an exponential fit of a parameter C2 of a $\gamma$ estimator as a function of SBR.
Figure 19:
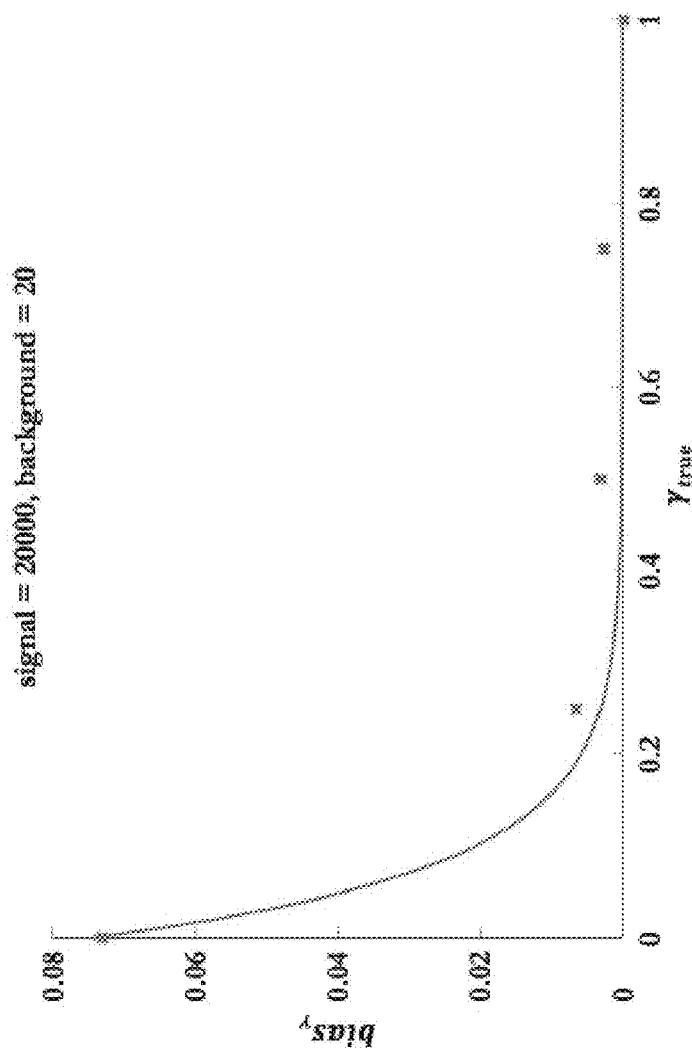
FIG. 19 is a graph showing a median of $\gamma$ estimates as a function of $\gamma_{true}$.

For this analysis, SBR was defined as SBR=signal/$\sqrt{background}$. As illustrated in FIGS. 18A and 18B, the estimator tuning parameters C1 and C2 varied linearly with SBR. Therefore, the two equations can be used as tuning parameters for estimating $\gamma$. These parameters were consistent with the simulation results, as illustrated in FIG. 19 (20,000 signal photon vs. 20 background photon/pixel).

Figure 32:
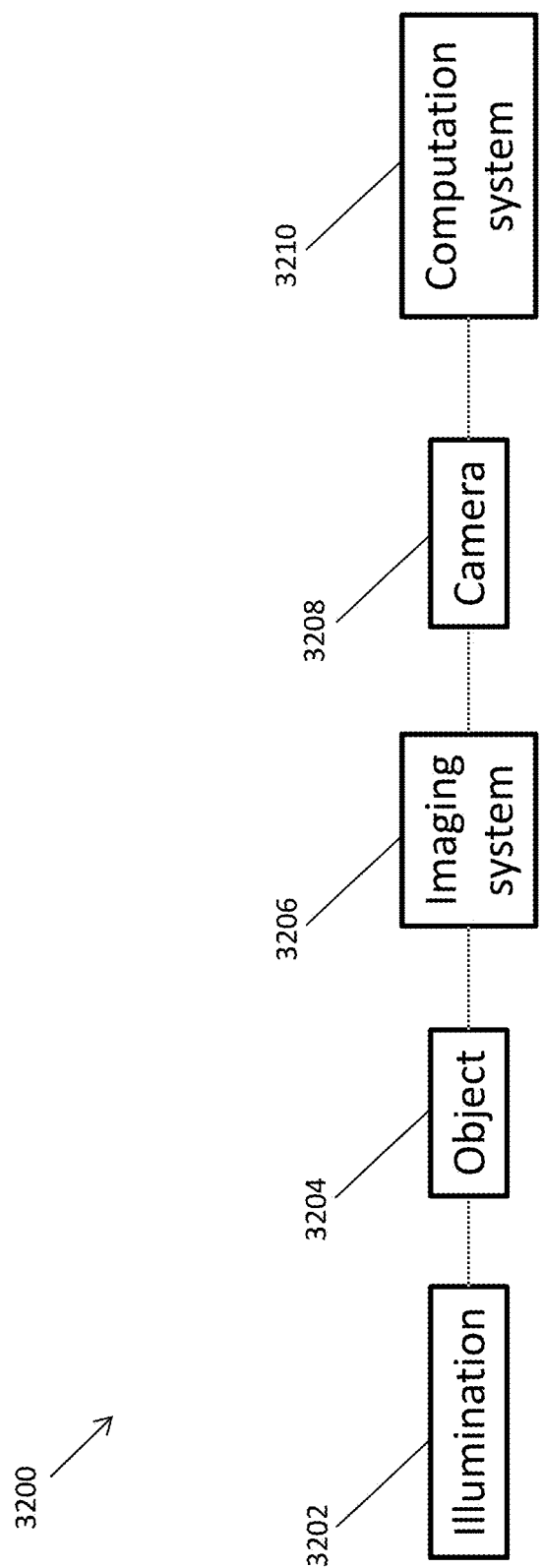

In various aspects, the tri-spot point spread function (PSF) imaging system 3200 may further include a computing system 3210, as illustrated in FIG. 32. As illustrated in FIG. 32, the computation system 3210 may include at least one computing device configured to receive image data encoding a tri-spot PSF image captured by a camera 3208 or other video recording device. The computing device may be configured to enable the processing and analysis of the tri-spot PSF image as described above. As described previously, the tri-spot point spread function (PSF) imaging system 3200 may further include an imaging system 3206 including, but not limited to, the systems illustrated in FIG. 3A, FIG. 3B, FIG. 33, and FIG. 34. As illustrated in FIG. 32, the system 3200 may further include an illumination element 3202 configured to produce light in two polarized channels to illuminate the object/emitter 3204.

Although described in connection with an exemplary computing system environment, embodiments of the invention are operational with numerous other general purpose or special purpose computing system environments or configurations. The computing system environment is not intended to suggest any limitation as to the scope of use or functionality of any aspect of the invention.

Embodiments of the invention may be described in the general context of computer-executable instructions, such as program modules, executed by one or more computers or other devices. The computer-executable instructions may be organized into one or more computer-executable components or modules. Generally, program modules include, but are not limited to, routines, programs, objects, components, and data structures that perform particular tasks or implement particular abstract data types. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein. Aspects of the invention may also be practiced in distributed computing environments where tasks are performed by remote processing devices that are linked through a communications network. In a distributed computing environment, program modules may be located in both local and remote computer storage media including memory storage devices.

In operation, a computer executes computer-executable instructions embodied in one or more computer-executable components stored on one or more computer-readable media to implement aspects of the invention described and/or illustrated herein.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

EXAMPLES

The following examples demonstrate various aspects of the disclosure.

Example 1: Imaging of Fluorescent Bead Emitters Using Tri-Spot PSF System

To evaluate the performance of the tri-spot PSF system on calibration structures that simulate isotropic emitters, fluorescent beads were imaged. The fluorescent beads (Thermo-Fisher Scientific FF8803, 505 nm excitation, 515 nm emission, 100-nm diameter) were embedded in 1% PVA (polyvinyl alcohol, Alfa Aesar 41240) with refractive index 1.50 [26] and spin-coated onto a glass coverslip (No. 1.5, high-tolerance).

The beads were imaged using a system similar to the system shown in FIGS. 3A to 3C with a phase mask similar to the mask shown in FIG. 8D. For imaging, the beads were excited by a 514-nm wavelength laser (0.86 kW/cm² peak excitation intensity at the sample plane). The numerical aperture of the objective lens was 1.4, the effective pixel size of the camera in object space was 58.5 nm, and the exposure time was 50 ms.

Because the beads used in this evaluation were essentially fixed in orientation, the impact of absorption dipole moments on the apparent rotational mobility of fluorescent emitters was assessed as follows. The image-formation model for distributions of dipole emitters presented above was developed without considering how the orientation of absorption dipoles can affect emission. Effects related to the orientation of an emitter molecule's absorption dipole moment are negligible when the molecule rotates much faster than the time between absorption and emission, defined herein as the excited state lifetime. Thus, there is little correlation between the absorption and emission dipole moments in typical use. However, the beads in this experiment consisted of many fixed fluorescent molecules. Therefore, it was assumed that the beads were an ensemble of fixed dipoles, each of which had absorption and emission moments that were are parallel to one another. To test the validity of this assumption, the orientations of both absorption and emission dipole moments were measured. The excitation laser used in this experiment was circularly-polarized in the x-y plane, resulting in anisotropic excitation light so that a non-uniform distribution of emitters will be excited by the laser.

A model is needed to quantify how much the absorption dipole moment distribution under anisotropic excitation affected the images produced by slowly rotating emitter molecules, as represented by the fluorescent beads in these experiments. For simplicity, the emission dipole moment was assumed to be uniformly distributed within a cone with half cone angle a when the absorption dipole moment was not considered. In this case, the probability density function was $$P(\mu) = 1 \Big/ \int_0^a \int_0^{2\pi} \sin\theta'_\tau d\theta'_\tau d\phi'_\tau.$$

According to Eqn 21 and Eqn. (23):

$$\lambda = \int_0^a \int_0^{2\pi} \mu'^2_{x,\tau} P \sin\theta'_\tau d\theta'_\tau d\phi'_\tau = \qquad \text{Eqn. (29)}$$

$$\frac{\int_0^a \int_0^{2\pi} (\sin\theta'_\tau \cos\phi'_\tau)^2 \sin\theta'_\tau d\theta'_\tau d\phi'_\tau}{\int_0^a \int_0^{2\pi} \sin\theta'_\tau d\theta'_\tau d\phi'_\tau} = \frac{(1-\cos a)(2+\cos a)}{6}$$

here $\mu'_{x,\tau} = \sin\theta'_\tau \cos\phi'_\tau$ denoted the projection of orientation vector $\mu$ on the rotated axis x', and $\lambda = \langle \mu'^2_{x,\tau} \rangle$ denoted the temporal average of the second moment in the rotated coordinates. The rotational mobility was given by:

$$\gamma = 1 - 3\gamma = \frac{\cos^2 a + \cos a}{2} \qquad \text{Eqn. (30)}$$

As described above, a completely fixed molecule had $\gamma=1$, and an isotropic emitter (freely rotating) had $\gamma=0$. To incorporate the effect of absorption dipole orientation as a correction, the excitation rate was expressed as a function of the dot product of the dipole orientation and excitation electric field according to Eqn. (1):

$$P(\mu, E) \propto |\mu \cdot E|^2 = |\mu_{x,\tau} E_{x,\tau} + \mu_{y,\tau} E_{y,\tau} + \mu_{z,\tau} E_{z,\tau}|^2 \qquad \text{Eqn. (31)}$$

It was assumed that excitation electric field is circular in x-y plane and that the acquisition time (~ms) was much longer than the temporal period of the electric field (~1 fs). Over a single camera frame, $\langle E_{x,\tau}^2 \rangle = \langle E_{y,\tau}^2 \rangle$, and $\langle E_{z,\tau}^2 \rangle = \langle E_{x,\tau} E_{y,\tau} \rangle = \langle E_{x,\tau} E_{z,\tau} \rangle = \langle E_{y,\tau} E_{z,\tau} \rangle = 0$, where $\langle \cdot \rangle$ was defined previously as denoting the temporal average of a function. As a result, the excitation rate was written:

$$P(\mu) = P_0(\mu_{x,\tau}^2 + \mu_{y,\tau}^2) = P_0(1 - \mu_{z,\tau}^2) \qquad \text{Eqn. (32)}$$

where $$P_0 = 1 \Big/ \int_0^a \int_0^{2\pi} (1-\mu_{z,\tau}^2) \sin\theta'_\tau d\theta'_\tau d\phi'_\tau$$

and according to Eqn. (21), $\mu_{z,\tau} = \cos\theta \mu'_{z,\tau} - \sin\theta \mu'_{x,\tau}$.

All corrected second moments in the rotated frame of reference (see Eqn. 23) were calculated as:

$$\langle \mu'_{i,\tau} \mu'_{j,\tau} \rangle = \int_0^a \int_0^{2\pi} \mu'_{i,\tau} \mu'_{j,\tau} P(\mu) \sin\theta'_\tau d\theta'_\tau d\phi'_\tau \qquad \text{Eqn. (33)}$$

where i, j=x, y, z.

The eigenvalues of the apparent second moment matrix $M_{apparent}$ were calculated as $\lambda^{1,2,3}$. The apparent rotational mobility was defined as $\gamma_{apparent} = 1 - 3(\lambda_1 + \lambda_2)/2$. This apparent rotational mobility $\gamma_{apparent}$, as observed by the imaging system, appeared to be non-zero due to pump anisotropy even though there was actually no anisotropy in the emitter itself. The difference between the apparent rotational mobility and true rotational mobility $\gamma_{apparent} - \gamma$ was plotted as a function of polar angle $\theta$ in FIG. 20.

Figure 20:
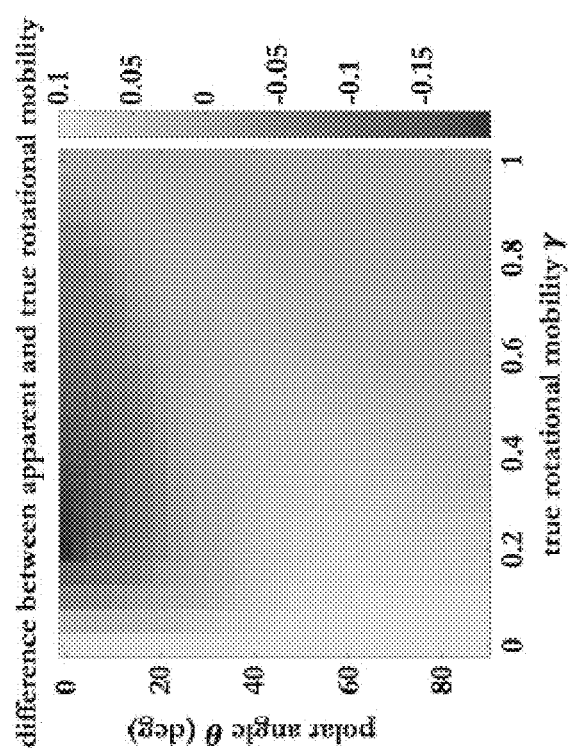
FIG. 20 is an image showing a map of a difference between apparent rotational ability and true rotational ability of single molecule emitters.

As shown in FIG. 20, the apparent rotational mobility was biased due to the anisotropy in the excitation electric field. Fluorescent beads, which were considered isotropic emitters, should have dipole moments M=[1/3,1/3,1/3,0,0,0]. When pump anisotropy is considered, the apparent emission dipole moments became M=[0.4, 0.4, 0.2, 0, 0, 0], as observed by the imaging system. Since the performance of a maximum likelihood estimator highly depends on the accuracy of the forward model, this model mismatch may bias the estimator significantly. To eliminate this possibility, the direct inversion of basis matrix $M=B_{spot}^{-1}I_{spot}/I_0$ was used to estimate the orientation parameters of fluorescent beads. The high SBR of fluorescent beads provides acceptable performance of this direct inversion method in terms of precision and accuracy.

Figure 21B:
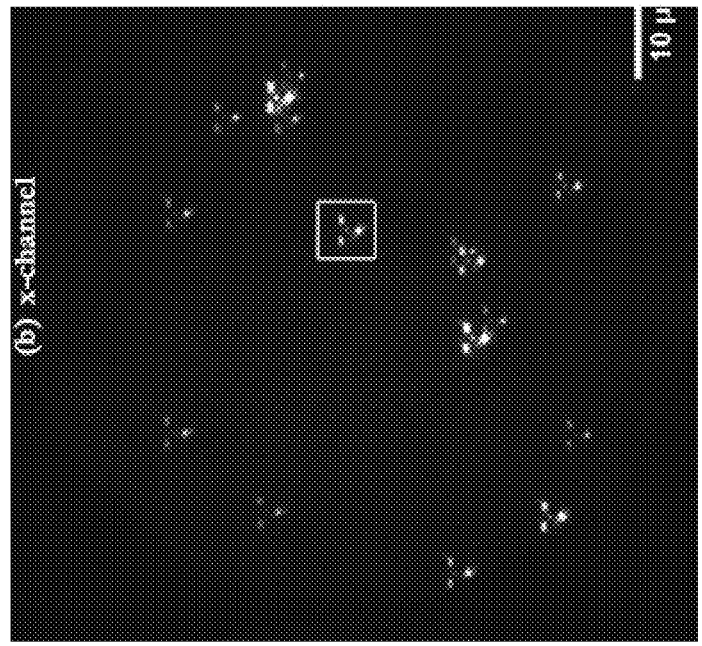
FIG. 21B is an image is a raw image of 505/515, 100-nm diameter beads for the x-polarization channel.
Figure 21A:
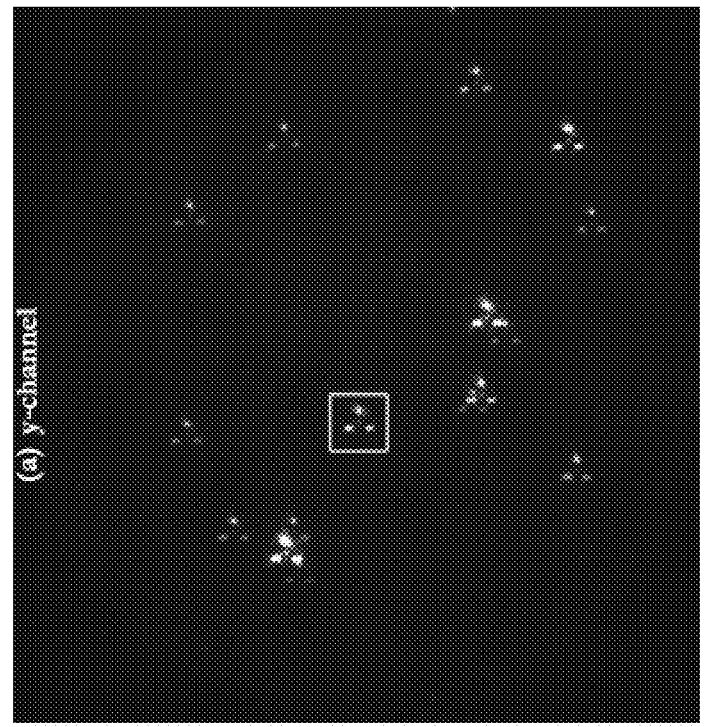
FIG. 21A is a raw image of 505/515, 100-nm diameter beads for the y-polarization channel.
Figures 22A, 22B:
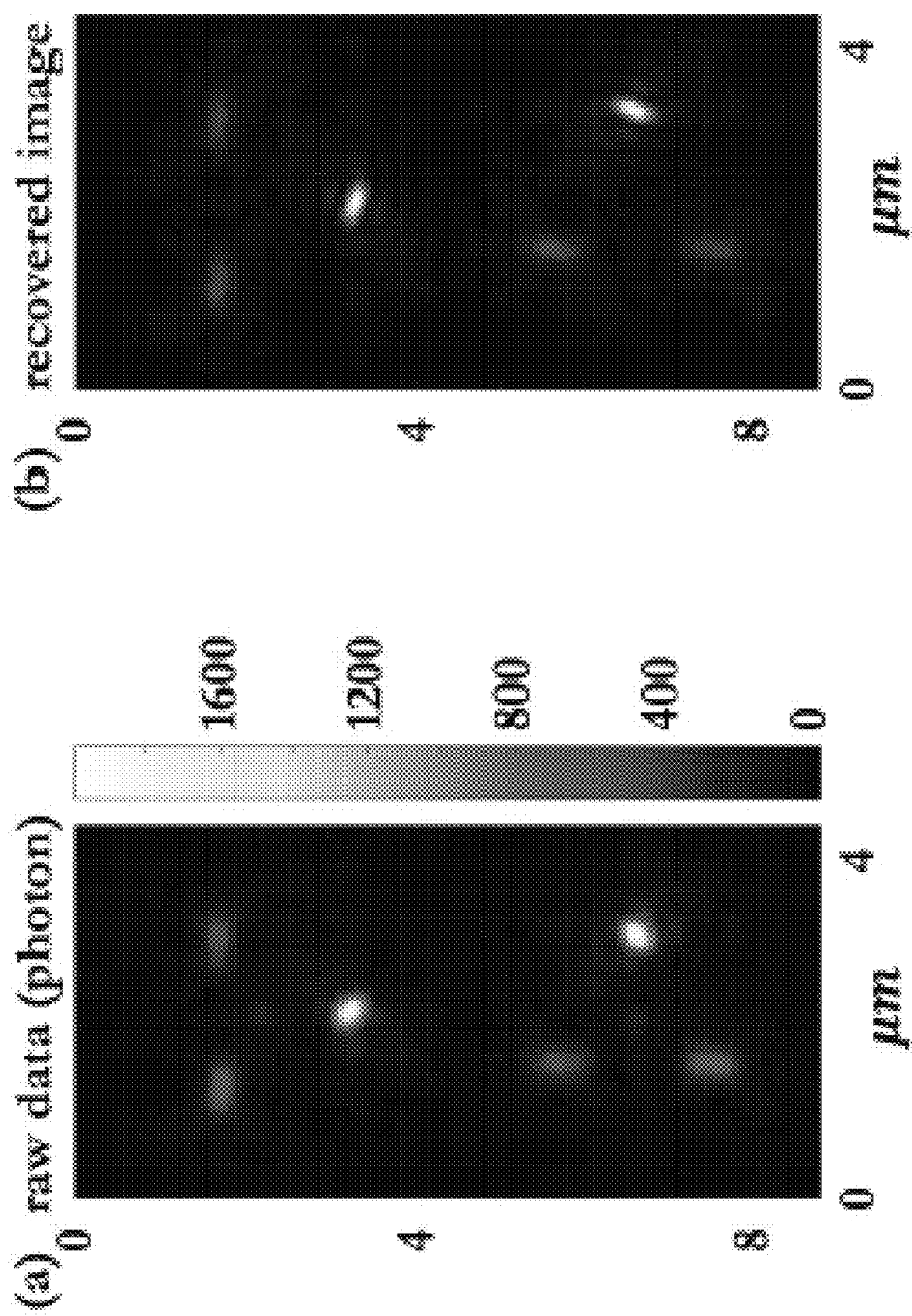
FIG. 22A is a raw camera image of the bead shown within the yellow box in FIG. 21A.
FIG. 22B is s a raw camera image of the bead shown within the yellow box in FIG. 21B.
Figure 24B:
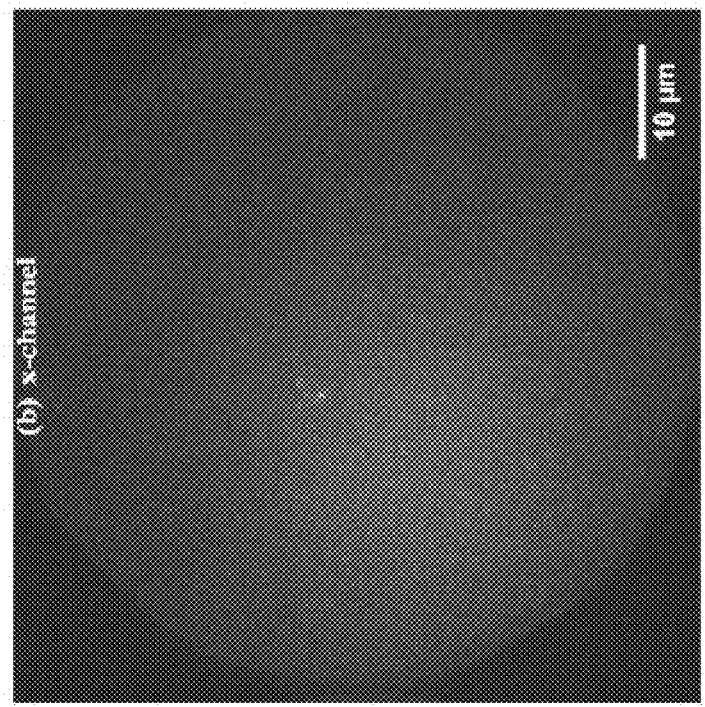
FIG. 24B is a raw image of one CF640R Amine fluorescent molecule from the x-polarized light channel.
Figure 24A:
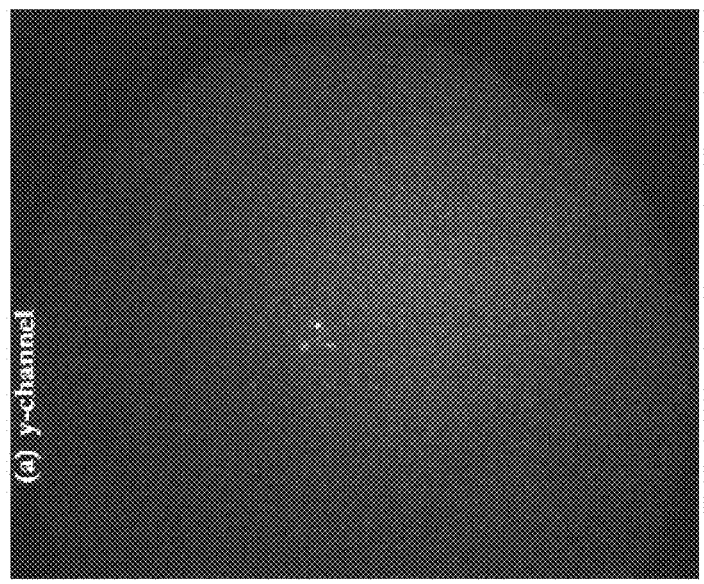
FIG. 24A is a raw image of one CF640R Amine fluorescent molecule from the y-polarized light channel.
Figures 25A, 25B:
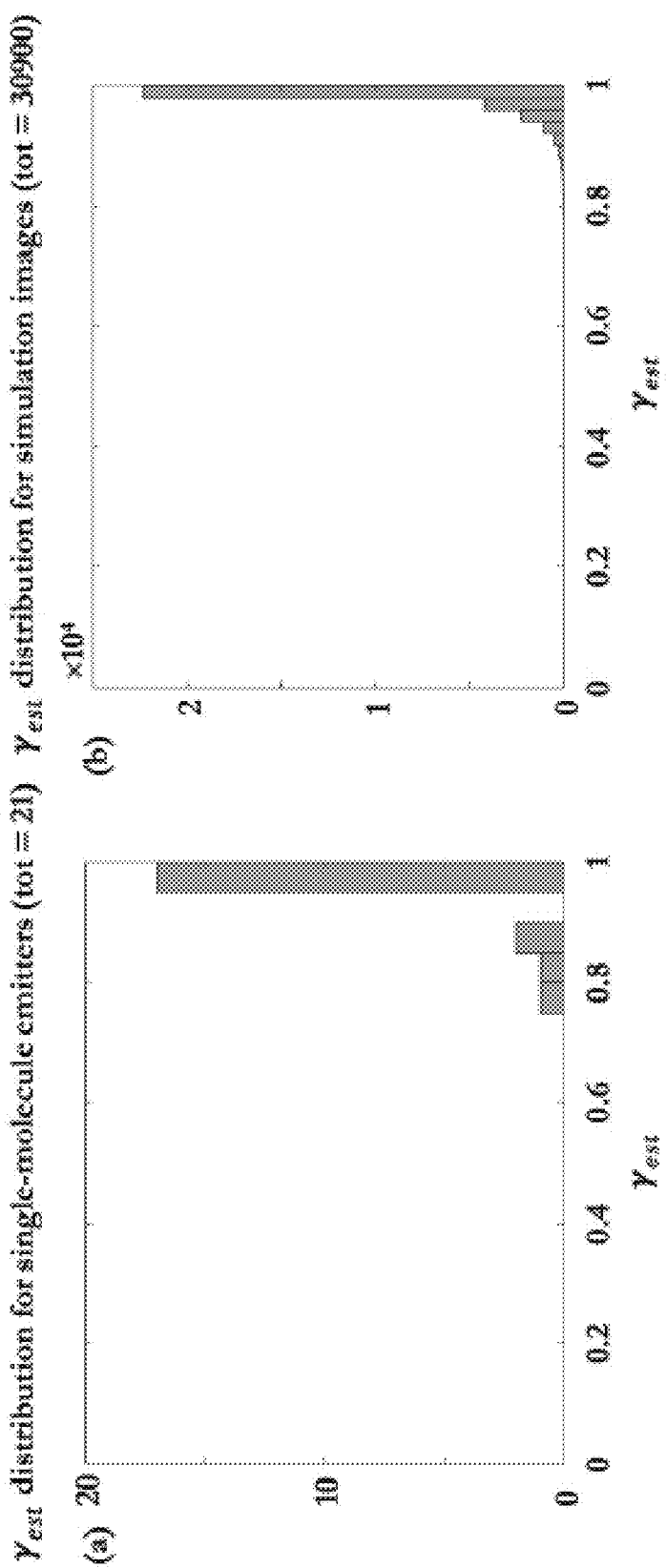
FIG. 25A is a graph summarizing the distribution of estimated $\gamma$ for 21 single-molecule emitters.
FIG. 25B is a graph summarizing the distribution of estimated $\gamma$ for 30900 simulation images with 20000 photons-20 photons/pixel SBR.
Figure 27A:
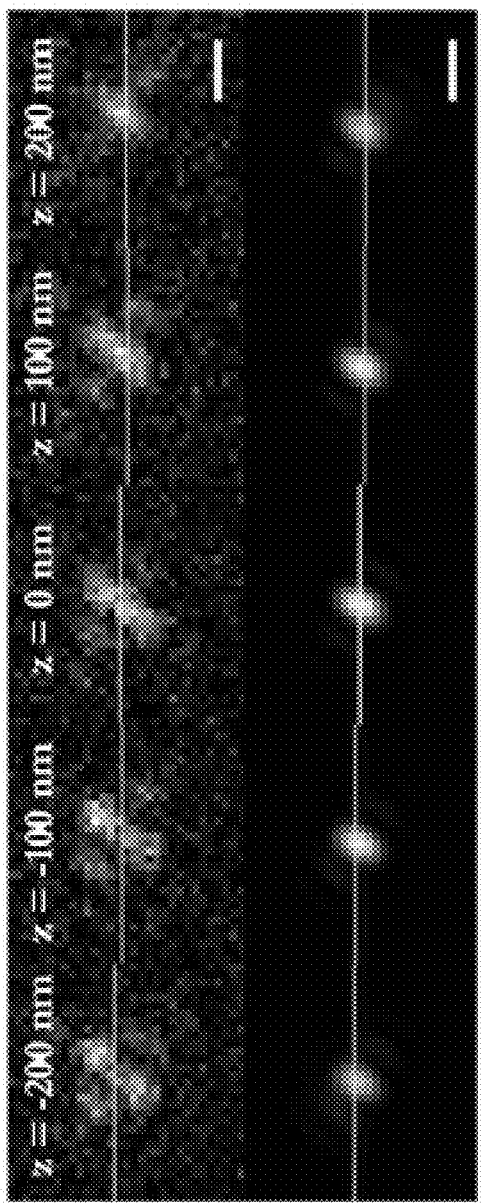
FIG. 27A is a imaging containing raw experimental images of a single-molecule emitter taken as a function of z (top row) and recovered z-scan images (bottom row) based upon the orientations measured by the tri-spot PSF in FIGS. 26A and 26C.
Figure 27C:
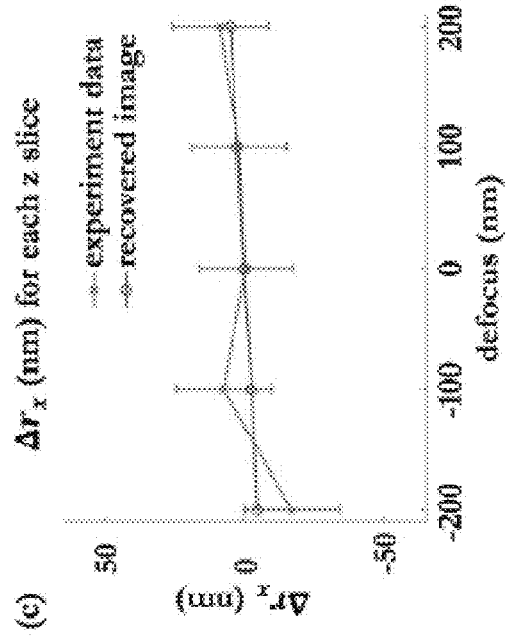
FIG. 27C is a graph of the localization bias difference along the x-axis between x- and y-channels for the emitter in FIG. 26C.
Figure 27E:
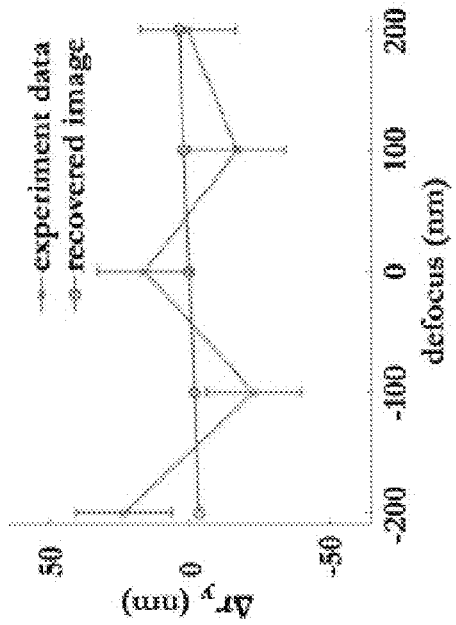
FIG. 27E is a graph of the localization bias difference along the y-axis between x- and y-channels for the emitter in FIG. 26C.
Figure 27B:
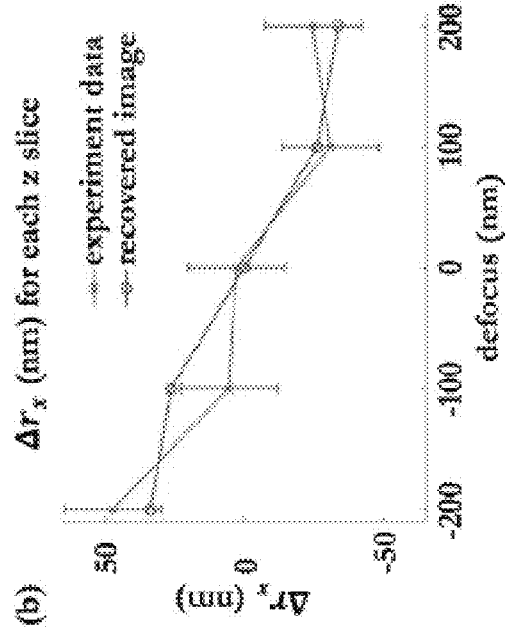
FIG. 27B is a graph of the localization bias difference along the x-axis between x- and y-channels for the emitter in FIG. 26A.
Figure 27D:
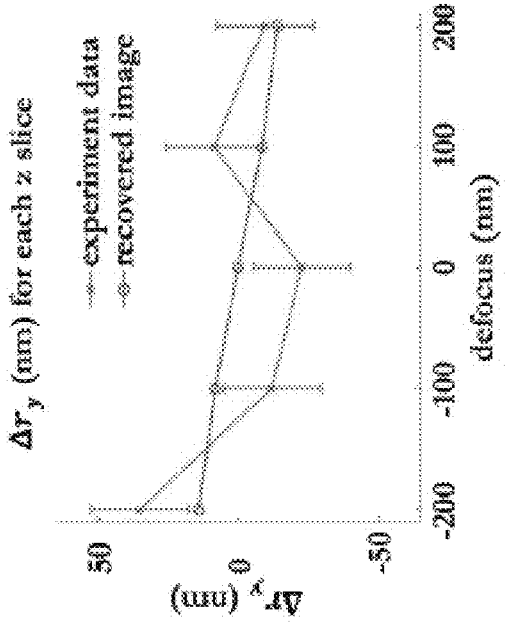
FIG. 27D is a graph of the localization bias difference along the y-axis between x- and y-channels for the emitter in FIG. 26A.

Basis inversion seas used to measure the dipole moments of the fluorescent beads as described above, FIGS. 21A and 21B show one field of view (FOV) from experimental imaging of fluorescent beads immobilized on a glass coverslip. FIG. 21B is the image is from the x-polarization channel, and FIG. 21A is the image from the y channel. The positions of fluorescent beads were horizontally from each other between the two channels, while the tri-spot PSF was rotated by 90 degrees between the two channels. The orientation estimate and recovered image of the bead in the yellow boxes in FIGS. 21A and 21B are shown in FIGS. 22A and 22B, respectively.

159 beads from 20 FOVs were measured, and the distribution of all measured second moments is shown in FIG. 23A and FIG. 23B. The dipole moments averaged over all beads were given by $\overline{M}=[0.40, 0.39, 0.21, -0.05, 0.02, 0.01]^T$, which was very close to the expected values predicted by the model described above. The distributions were also consistent with the simulation data shown in FIG. 23C and FIG. 23D. The width of the experimental distributions was different from those of the simulation because each bead had a different signal to background ratio. This result suggested that the tri-spot PSF was capable of measuring the average dipole moments of fluorescent beads accurately despite the presence of anisotropy due to the polarization of the excitation laser.

Example 2: Effect of Fluorescent Particle Size on Emission Heterogeneity

To assess the effect of molecule size on emission anisotropy, the following experiments were conducted to characterize the anisotropy of representative emitters used for measuring and calibrating optical aberrations. Without being limited to any particular theory, it is assumed that fluorescent beads behave as ideal point sources, especially those that are smaller than the diffraction limit (~λ/2 NA≈250 nm), yet little is known about their emission anisotropy or heterogeneity. Using the tri-spot PSF system, the second-moment vector M measured from each individual bead directly represents the orientation distribution of the ensemble of molecules contained within it. Measuring M as a function of excitation polarization provides additional insight into interactions between the fluorophores within each bead.

Figure 40B:
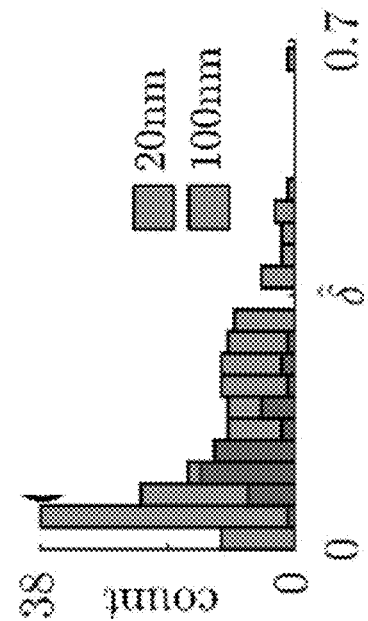

The tri-spot PSF system described above was used to image 20-nm and 100-nm diameter beads embedded in a thin layer (34±14 nm) of poly vinyl alcohol (PVA) sequentially pumped by x-polarized light and y-polarized light. Representative tri-spot PSF images for the 100-nm and 20-nm beads are shown in FIG. 40A and FIG. 40B, respectively.

The maximum likelihood estimator described above was used to determine rotational constraint and normalized rotation for 118 100-nm and 20-nm beads. FIG. 41A is a histogram of the rotational constraints for all 118 beads, illustrating the larger rotational constraint for the 20-nm beads (median γ=0.67) observed relative to rotational constraint for the 100 nm beads (median γ=0.47). This measurement was thought to be attributable to the fewer fluorophores within smaller beads results in a fluorescence emission anisotropy more similar to that of a fixed small molecule emitter and hence a larger rotational constraint. Referring again to FIG. 41A, neither the 100-nm nor the 20-nm beads exhibited emission patterns characteristic of isotropic emitters y close to zero). The measured rotational constraint of 20-nm beads suggested that they could exhibit a localization bias of 50 nm when defocused by 200 nm.

In general, the measured rotational constraint y of fluorescent beads is a convolution of the distribution of molecular orientations within the bead with the probability of pumping those molecules with polarized light. However, nanoscale emitters may not be accurately modeled by a symmetrically rotating dipole with a certain rotational constraint. Direct basis matrix inversion may be used to measure the full emission anisotropy, i.e., all six second moments, of the fluorescent beads given by $M=B^{-1}I/I_0$.

The tri-spot PSF images of a typical 100-nm bead did not change significantly under different pumping polarizations, as illustrated by the normalized change in spot brightnesses observed in FIG. 40A between x-polarized (left image) and y-polarized (right image) pumps $$\left| \frac{I_{x-pump}}{\|I_{x-pump}\|} - \frac{I_{y-pump}}{\|I_{y-pump}\|} \right|$$

was about 5%. However, the corresponding change observed in FIG. 40B for a typical 20-nm bead was 14%.

To further quantify this effect, δ, the angular rotation of the second-moment vector M in response to a rotation in pumping polarization given by $$\delta = \cos^{-1} \frac{M_{x-pump} \cdot M_{y-pump}}{\|M_{x-pump}\| \|M_{y-pump}\|}$$

was defined, where $M_{x-pump}$ and $M_{y-pump}$ are the second-moment vectors measured in response to x-polarized and y-polarized excitation light, respectively. δ was predicted to decrease as γ increases. For a fixed small molecule emitter (γ=1), there was no observed change in emission pattern when changing pump polarization (data not shown). It was expected that an isotropic emitter (i.e., an ensemble of independent fixed fluorescent molecules) should emit with varying orientational second moments depending on how the isotropic emitter was pumped. As illustrated in FIG. 41B, measurements of normalized $\hat{\delta}=\delta/\delta_{iso}$ indicated that 20-nm beads exhibited a larger second-moment rotation (median $\hat{\delta}=0.21$) than 100-nm beads (median $\hat{\delta}=0.07$). Without being limited to any particular theory, the measurements of FIG. 41B suggested that existed a depolarization mechanism between molecules within the 100-nm beads, such as homo-Förster Resonance Energy Transfer, that caused polarized excitation to result in emitted fluorescence that was more isotropic than expected. The tri-spot PSF imaging system was capable of detecting this depolarization because the observed orientation measurements were independent of excitation polarization, and unlike conventional fluorimeters, the tri-spot PSF system was sensitive enough to detect the emission anisotropy of single fluorescent nanoparticles.

Example 3: Imaging of Single Fluorescent Molecules Using Tri-Spot PSF System

To evaluate the performance of the tri-spot PSF system described previously on rotationally fixed single-molecule emitters single Atto 647N molecules (ATTO-TEC AD 647N-91, 646 nm excitation, 664 nm emission, MW=916 g/mol) were imaged using the disclosed tri-spot PST system. The single molecules were embedded in a thin layer (87±15 nm [mean±std.] thickness) of 1% PMMA (poly methyl methacrylate, Aldrich Chemistry 182265).

The maximum likelihood estimator described above was used to estimate mean orientation and rotational mobility of the single Atto 647N molecules. The measured orientations of the single Atto 647N molecules were used to correct dipole-induced localization biases in single molecule light microscopy. Without being limited to any particular theory, rotationally fixed single emitter molecules are thought to produce dipole radiation patterns that lead to systematic lateral (xy) localization errors that increase with defocus (z). The size and direction of this error is thought to be a function of molecular orientation.

The raw tri-spot PSF image and recovered tri-spot PST image of a single Atto 647N molecule single molecule obtained as described above in FIG. 38A and FIG. 38B, respectively. Comparing the corresponding images of FIG. 38A and FIG. 38B, the fitted tri-spot image (FIG. 38B) matched closely the camera image (FIG. 38A).

The orientation measurements obtained as described above were used to predict each molecule's localization error ($\Delta x$, $\Delta y$) as a function of z using a vectorial diffraction model. Since each detection channel was linearly polarized, localization errors in the x-polarized channel were expected to be largest along the x direction and errors along the y direction were expected to be largest in the y-polarized channel. ThunderSTORM was used to localize a standard PSF image of each molecule at each defocus position, thereby quantifying each molecule's experimental localization error.

FIG. 39A and FIG. 39B summarize the predicted localization biases (line) and the experimentally-measured error (crosses) for the single molecule emitters as a function of defocus (z) for the x-polarized and y-polarized channels, respectively. The predicted localization bias matched the experimentally-measured error to within one CRLB for 93% of all z positions and molecules measured. Localization errors as large as 30 nm for ±200 nm defocus were observed. Applying the tri-spot's localization correction reduced this error to 10±4 nm (mean±std.), which fell within the localization precision of 13 nm for 2500 photons detected at z=±200 nm, thereby restoring the localization accuracy of the imaging system.

To demonstrate the capability of the tri-spot PSF system at tracking changes in single molecule emitter orientations over time, time-lapsed tri-spot PSF images of single Atto 647N molecules embedded in a thin polyvinylpyrrolidone (PVP) film (54±15 nm) were obtained at 10-min intervals as the PVP film was exposed to humid air.

FIGS. 42A and 42B illustrates that when the PVP film was exposed to humid air, the spots of the captured tri-spot PSF changed dramatically in relative brightness over time, indicative of changes in molecular orientation over the exposure time. The decreasing rotational constraint of the embedded fluorescent probes over time, for example from 10 to 60 minutes for molecule 1 (see FIG. 42A), is evidence of the polymer network softening and swelling as the moisture slowly penetrates the film Interestingly, the heterogeneity across the small molecules in their measured rotational constraints (FIG. 43A and FIG. 43B) suggested that the swelling of the film was non-uniform, even at long timescales. The small molecules further exhibited increasing translational diffusion when exposed to increasing humidity (see FIGS. 43A and 43B). However, no correlation was observed between rotational constraint and lateral diffusion, measured e average displacement jump $\Delta r$ between frames (se FIGS. 43A and 43B). The rotational constraint $\gamma$ of molecule 1 (FIG. 43A) and molecule 2 decreased by 0.10 and 0.04 over 50 minutes (21° and 13° cone half-widths (FIGS. 43A and 43B), while no significant increase in translational diffusion ($\Delta r$) over the same time period.

The time-lapse imaging also tracked the average orientation of each molecule (FIGS. 44A and 44B), quantifying rotational diffusion over both slow timescales (~minutes between each interval) and faster timescales (~seconds across camera frames, depicted as ellipses drawn at the initial and end time points in FIGS. 44A and 44B. The observed slow-scale rotation is distinct from the measurements of rotational constraint $\gamma$ (FIGS. 43A and 43B), which quantified rotational diffusion within a single camera frame (50 ms). The rotational constraint of molecule 1 ($\gamma$=0.90±0.10 [median±std.], 21° cone half-angle, FIG. 43A, t=60 min) was smaller than molecule 2 ($\gamma$=0.96±0,05, 13° cone half-angle, FIG. 43B, t=50 min), but molecule 1 rotated less than molecule 2 did over 50 minutes (11° for molecule 1, FIG. 44A, vs. 17° for molecule 2, FIG. 44B). Observations of other molecules further indicated that that smaller rotational constraint $\gamma$ within a single frame did not necessarily lead to more rotation over long timescales (data not shown).

The results of the time-lapse experiments demonstrated the ability of the tri-spot PSF system to quantify both average orientation between camera frames and rotational movement within each camera frame, rather than requiring multiple camera acquisitions as in existing absorption-based measurements. This ability is enabled by the tri-spot PSF system's encoding of all 6 components of the second-moment vector M into its images with maximum sensitivity.

In some aspects, numbers expressing quantities of ingredients, properties such as molecular weight, reaction conditions, and so forth, used to describe and claim certain aspects of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that can vary depending upon the desired properties to be obtained by a particular embodiment. In some aspects, the numerical parameters should be construed in light of the number of reported significant digits and by applying ordinary rounding techniques.

In some aspects, the terms "a" and "an" and "the" and similar references used in the context of describing a particular embodiment (especially in the context of certain of the following claims) can be construed to cover both the singular and the plural, unless specifically noted otherwise. In some embodiments, the term "or" as used herein, including the claims, is used to mean "and/or" unless explicitly indicated to refer to alternatives only or the alternatives are mutually exclusive.

Although specific features of various embodiments of the invention may be shown in some drawings and not in others, this is for convenience only. In accordance with the principles of the invention, any feature of a drawing may be referenced and/or claimed in combination with any feature of any other drawing.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A phase mask for a tri-spot point spread function imaging system, the phase mask comprising a first, second, and third partition, each partition comprising a phase delay ramp aligned along a phase delay axis, each phase delay ramp comprising a gradient of phase delays, wherein:
   each partition comprises a subset of a total area of the phase mask; and
   each phase delay axis associated with each partition is oriented in a different direction with respect to each remaining phase delay axis of each remaining partition.

2. The phase mask of claim 1, wherein the phase mask is configured to produce a tri-spot point-spread function comprising three light spots arranged in a triangular pattern.

3. The phase mask of claim 2, wherein the each light spot of the three light spots corresponds to each partition.

4. The phase mask of claim 3, wherein each spot is displaced a distance from a centroid of the triangular pattern by a distance proportional to the gradient of the phase delay ramp and along a direction aligned with the direction of the phase delay axis of the corresponding partition.

5. The phase mask of claim 1, wherein the phase mask is configured to produce the tri-spot point-spread function in response to photons produced by a single point emitter.

6. The phase mask of claim 5, wherein a relative brightness of each spot of the tri-spot point spread function encodes an orientation and a rotational mobility of the single point emitter.

7. The phase mask of claim 6, wherein the orientation comprises a dipole vector $\mu$, the dipole vector $\mu$ comprising projections onto a Cartesian axis comprising $\mu_x$, $\mu_y$, and $\mu_z$.

8. The phase mask of claim 7, wherein each partition of the phase mask further comprises an asymmetrical shape with respect to each remaining partition, the asymmetrical shape of each partition is configured to eliminate degeneracy of the orientation and the rotational mobility of the single molecule emitter encoded by the spots of the tri-spot point-spread function throughout a range of potential orientations and rotational mobilities.

9. The phase mask of claim 1, further comprising a phase-only spatial light modulator.

10. A tri-spot point spread function imaging system, comprising: a source arranged and configured to output an excitation beam that is directed to a sample containing at least one light emitter that emits a dipole or dipole-like radiation pattern when illuminated by the excitation beam; at least one sensor arranged and configured to capture at least one image of at least a portion of a radiation pattern emitted by the at least one emitter in response to impingement by the excitation beam; and a phase mask positioned between the at least one emitter and the at least one sensor, the phase mask configured to produce a tri-spot point spread function in response to photons received from the at least one emitter, wherein the tri-spot point spread function is received by the at least one sensor; and wherein the phase mask comprises a first, second, and third partition, each partition comprises a phase delay ramp aligned along a phase delay axis, each phase delay ramp comprises a gradient of phase delays, and wherein: each partition comprises a subset of a total area of the phase mask and each phase delay axis associated with each partition is oriented in a different direction with respect to each remaining phase delay axis of each remaining partition.

11. The system of claim 10, wherein the tri-spot point spread function comprises three light spots arranged in a triangular pattern and wherein a relative brightness of each light spot of the tri-spot point spread function encodes an orientation and a rotational mobility of the single molecule emitter.

12. The system of claim 11, wherein each partition of the phase mask further comprises an asymmetrical shape with respect to each remaining partition, the asymmetrical shape of each partition of the phase mask is configured to eliminate degeneracy of the orientation and the rotational mobility of the single molecule emitter encoded by the spots of the tri-spot point-spread function throughout a range of potential orientations and rotational mobilities.

13. The system of claim 12, further comprising a dual polarization imaging module configured to enable dual polarization imaging by the tri-spot point spread function imaging system.

14. The system of claim 13, further comprising a computing device operatively connected to the sensor, the computing device configured to estimate the dependent orientation and the rotational mobility of the single molecule emitter encoded by the spots of the tri-spot point-spread function using a method selected from a basis inversion method, a maximum likelihood estimation method, and any combination thereof.

15. The system of claim 10, wherein the phase mask comprises a phase-only spatial light modulator.

* * * * *